(12) United States Patent
Matsumoto

(10) Patent No.: US 6,373,283 B2
(45) Date of Patent: Apr. 16, 2002

(54) LEVEL CONVERSION CIRCUIT AS WELL AS SEMICONDUCTOR DEVICE AND DISPLAY UNIT COMPRISING THE SAME

(75) Inventor: Shoichiro Matsumoto, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/794,039

(22) Filed: Feb. 28, 2001

(30) Foreign Application Priority Data

Mar. 1, 2000 (JP) ........................................ 2000-056526
Feb. 19, 2001 (JP) ........................................ 2001-042313

(51) Int. Cl.[7] ........................................ H03K 19/0175
(52) U.S. Cl. .............................. 326/68; 326/63; 326/83; 326/58; 326/95; 326/98; 327/333
(58) Field of Search .............................. 326/63, 68, 80, 326/81, 83, 35, 36, 56, 58, 93, 95, 98; 327/333

(56) References Cited

U.S. PATENT DOCUMENTS 6,166,561 A * 12/2000 Fifield et al. .................. 326/57
6,222,397 B1 * 4/2001 Yamazaki .................... 327/112
6,236,248 B1 * 5/2001 Koga ........................... 327/112
6,249,169 B1 * 6/2001 Okada .......................... 327/333

* cited by examiner

Primary Examiner—Michael Tokar
Assistant Examiner—Vibol Tan
(74) Attorney, Agent, or Firm—Armstrong, Westerman & Hattori, LLP.

(57) ABSTRACT

A control circuit of a control part sets the gate potential of a p-channel MOSFET of a driver part to a level lowering from a supply potential by at least the threshold voltage of the p-channel MOSFET while setting the gate potential of an n-channel MOSFET to a level rising from a low level of an input signal by at least the threshold voltage of the n-channel MOSFET in response to the input signal, thereby strongly turning on one of the p-channel MOSFET and the n-channel MOSFET and weakly turning on the other MOSFET.

20 Claims, 45 Drawing Sheets

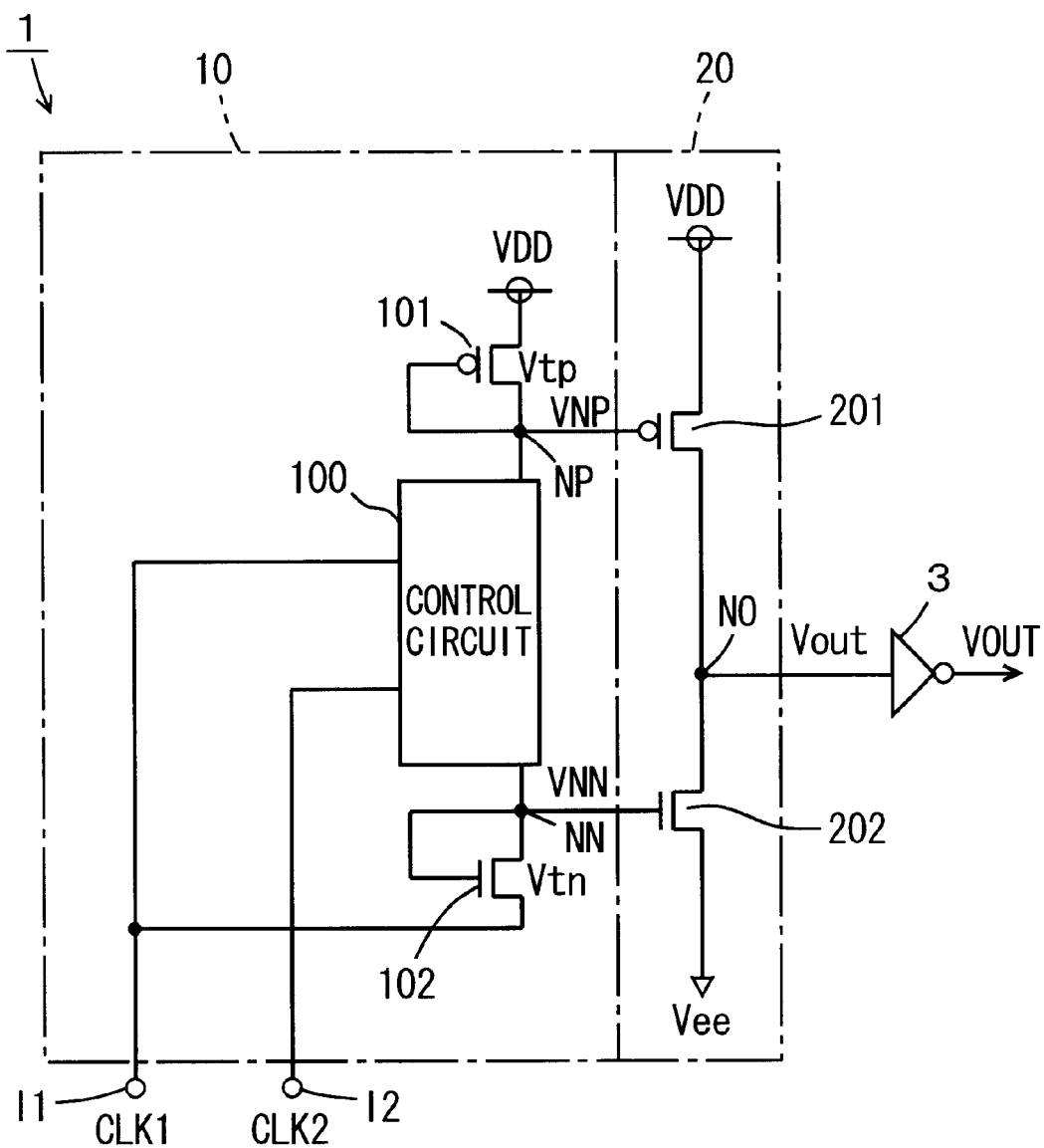
F I G. 1 3

F I G. 1 4
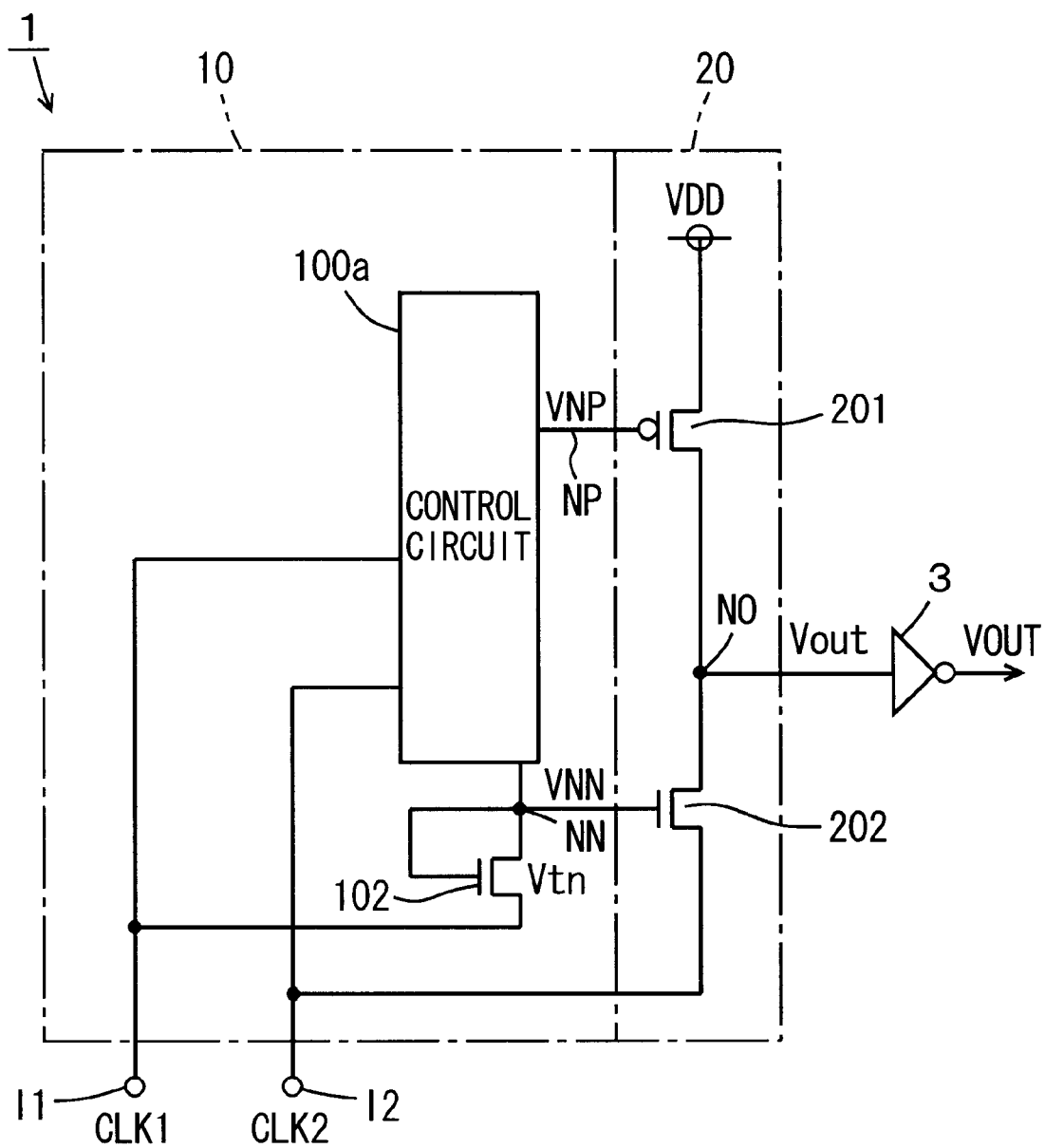

F I G. 2 1
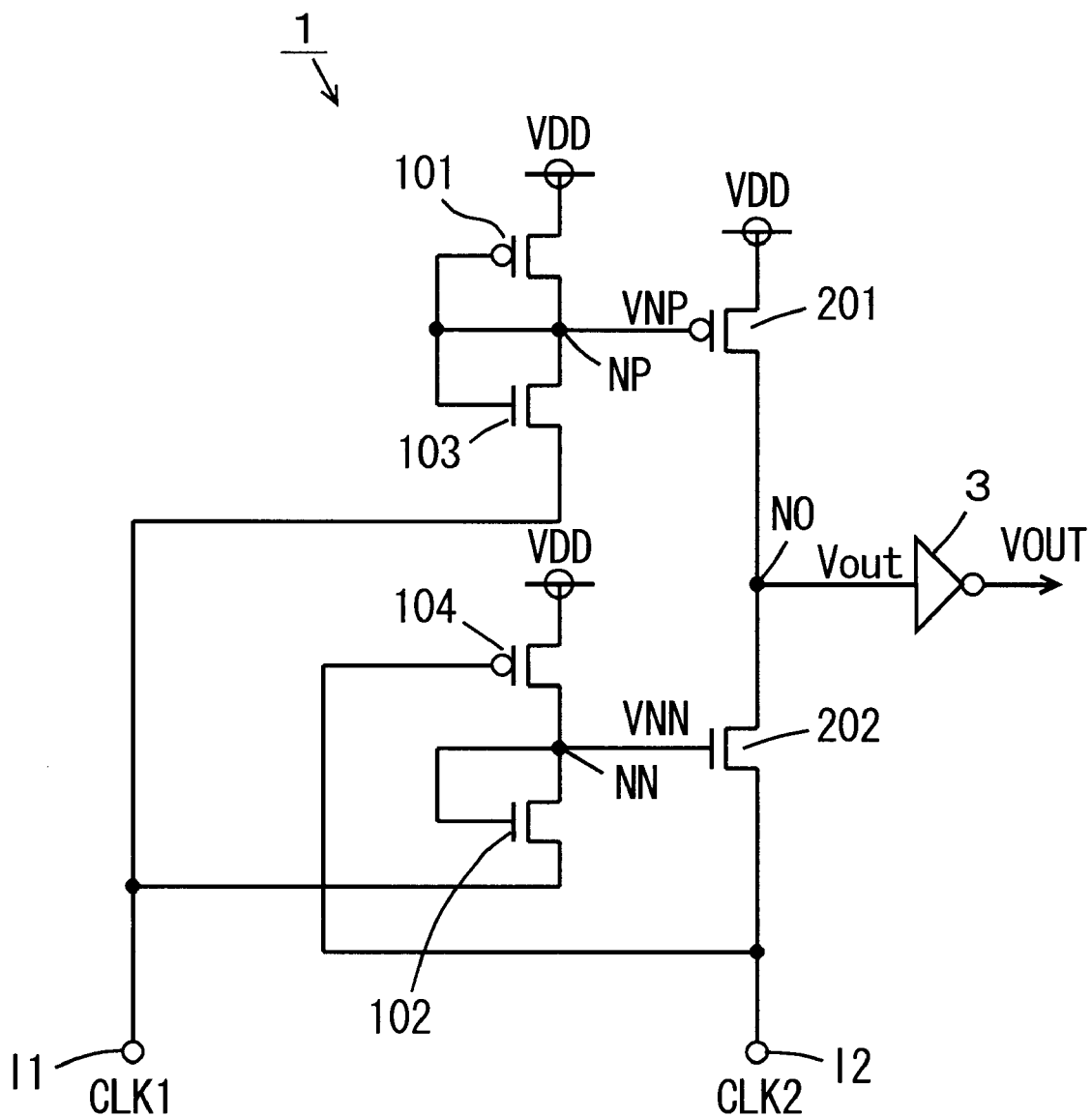

F I G. 3 0
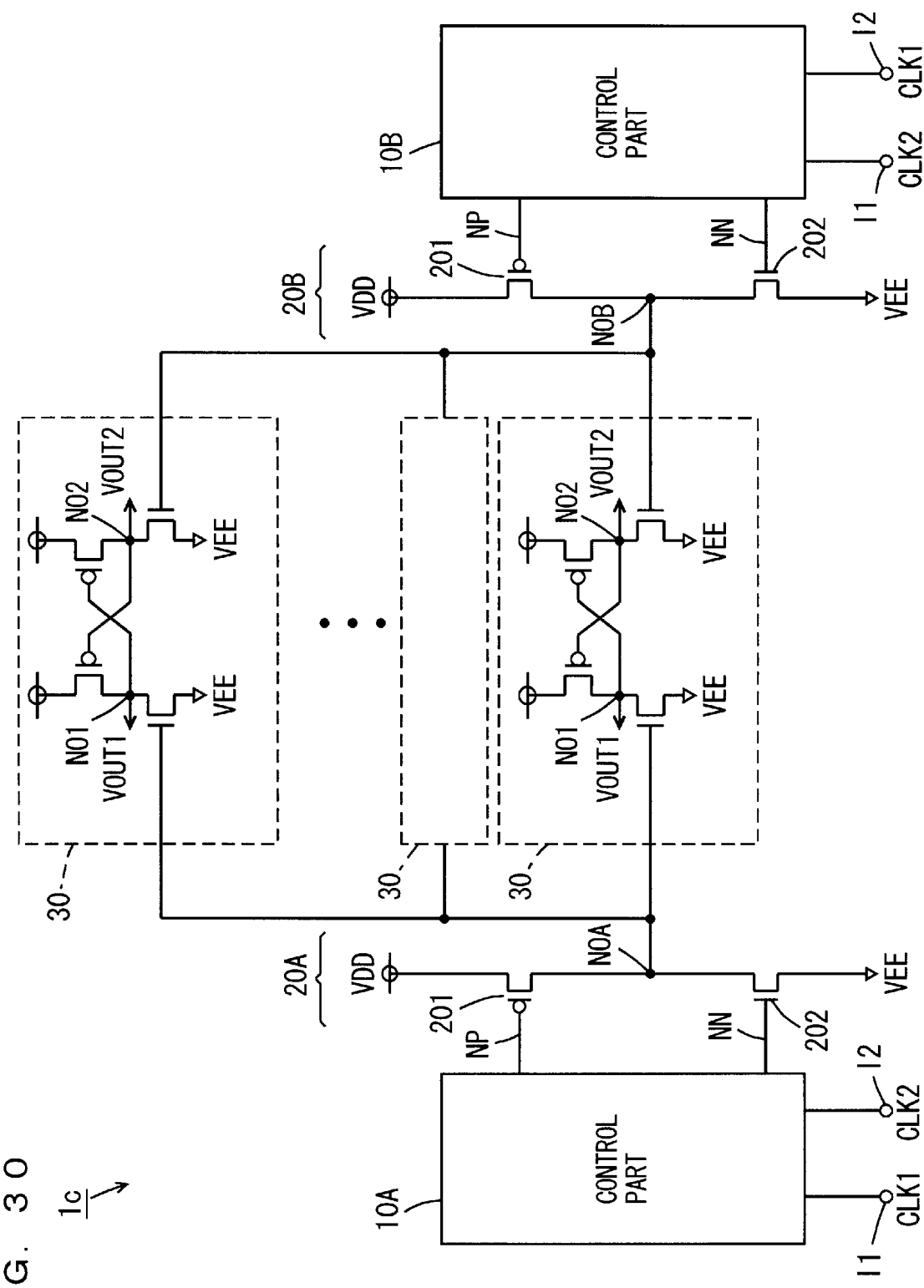

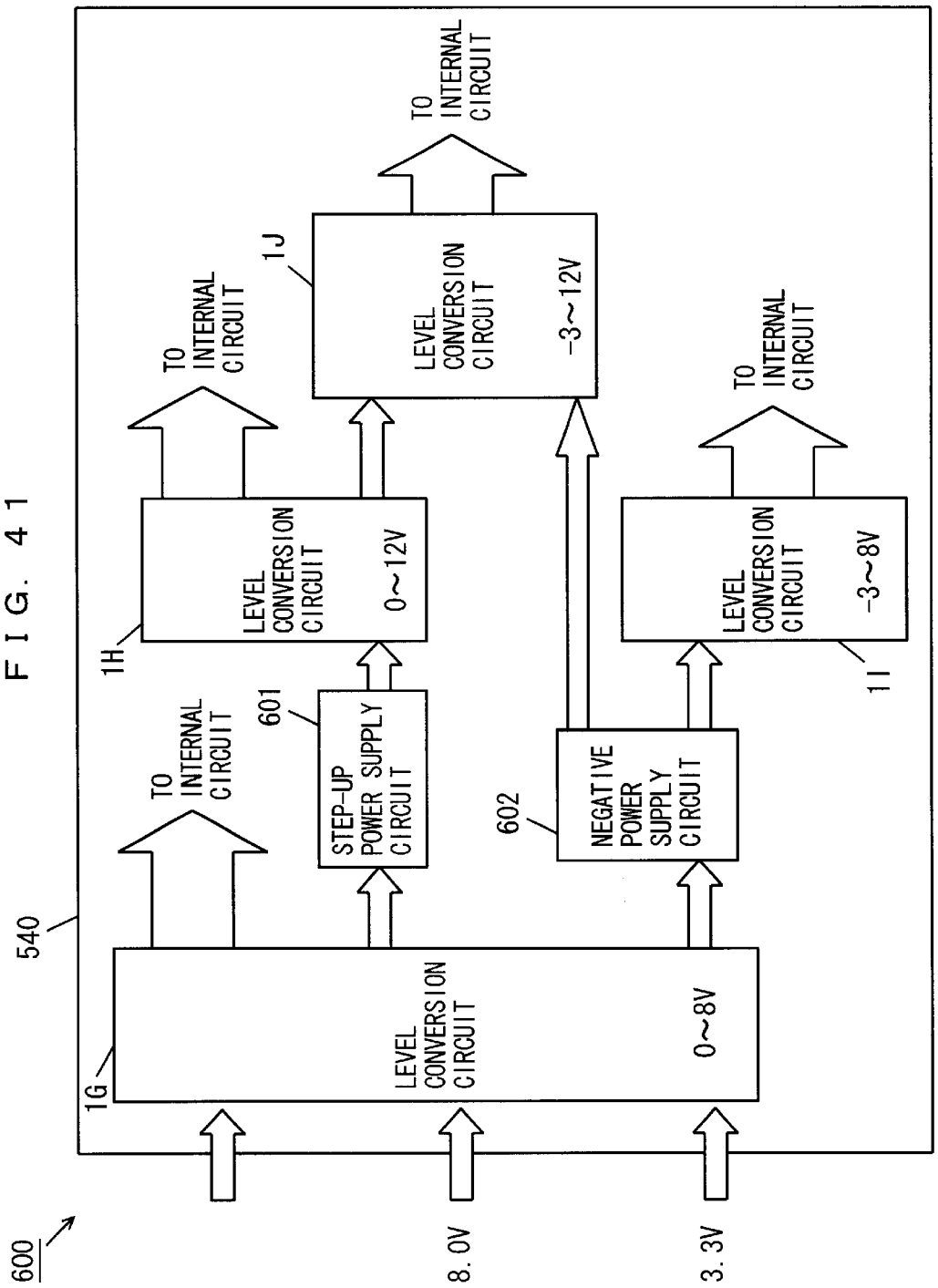
F I G. 4 1

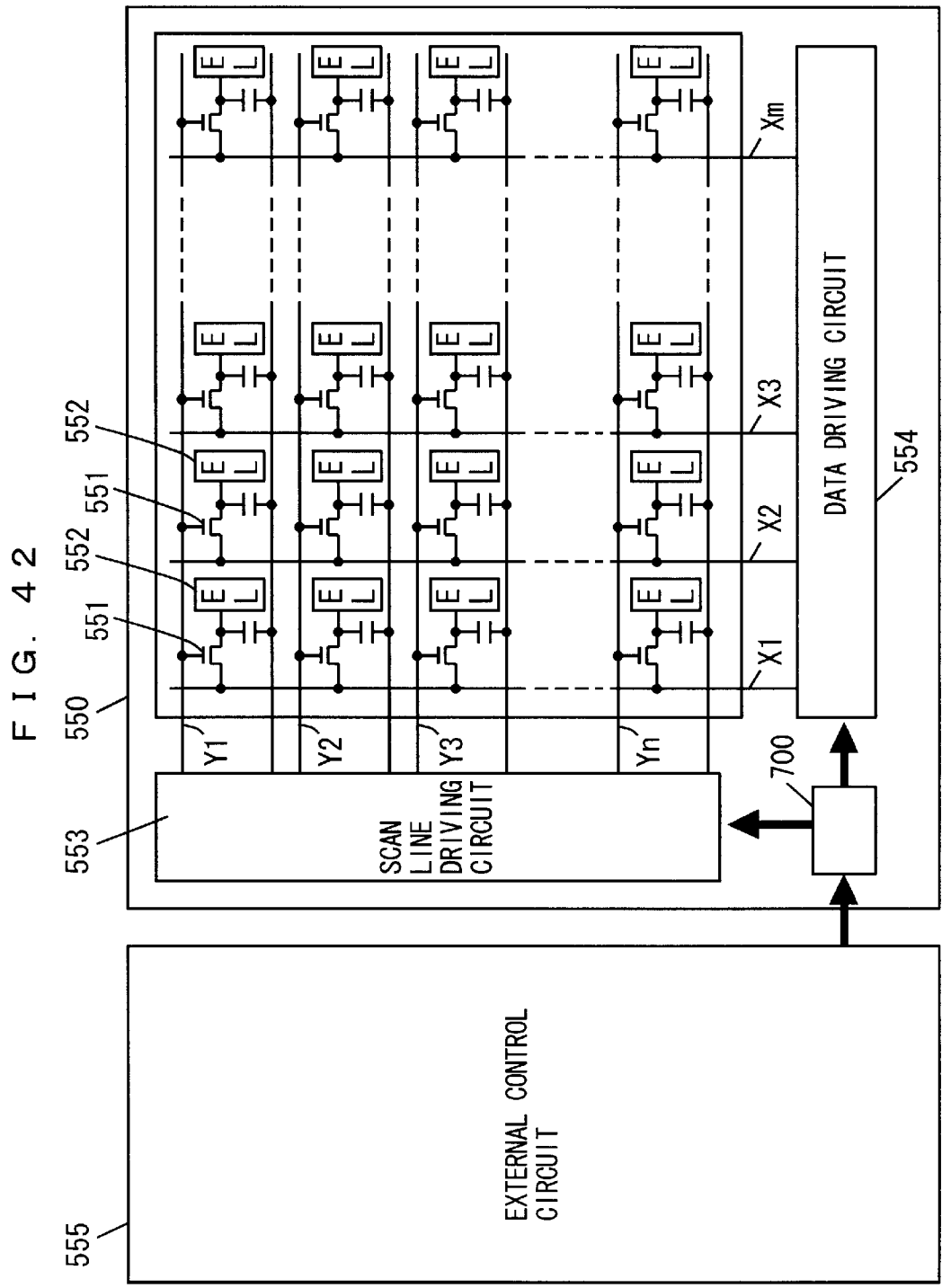

LEVEL CONVERSION CIRCUIT AS WELL AS SEMICONDUCTOR DEVICE AND DISPLAY UNIT COMPRISING THE SAME

BACKGROUND OF THE INVENTION

1. Field of the Invention

The present invention relates to a level conversion circuit converting the voltage amplitude of an input signal to a larger voltage amplitude, and a semiconductor device and a display unit employing the same.

2. Description of the Background Art

In recent years, a chip, referred to as a system-on-silicon chip, formed by loading a microprocessor or a memory on the same chip as a logic circuit is developed as an integrated circuit employing bulk silicon. Following such development, a technique of forming a number of types of circuits on a single chip with the finest possible design rules is now in the process of development.

However, the design rules vary with the types of the circuits, and hence circuits having different design rules must inevitably be integrated. Consequently, a plurality of circuits operating with different supply voltages are mixedly formed in a single chip. In this case, the voltages must be level-converted in an interface part between the different circuits.

Improvement of a high-speed property is attained by mixedly forming a plurality of circuits of different types on the same chip. Therefore, a level conversion circuit performing level conversion of voltages between the different circuits must also have high-speed operability.

Thin-film transistors of polycrystalline silicon are employed for a display device such as a liquid crystal display unit or an organic EL (electroluminescence) device. When provided on the same substrate as such a display device, the level conversion circuit is also formed by thin-film transistors of polycrystalline silicon.

In steps of fabricating transistors, device characteristics such as threshold voltages vary. Particularly in thin-film transistors of polycrystalline silicon, variations of device characteristics such as threshold voltages are extremely large. Thus, awaited is a level conversion circuit capable of reliably operating also when device characteristics such as threshold voltages of thin-film transistors vary.

Such a display device requires a level conversion circuit capable of operating at a high speed also when an input signal having a small amplitude is supplied in view of reduction of power consumption and improvement in definition.

FIG. 45 is a circuit diagram showing a first exemplary conventional level conversion circuit 800.

The level conversion circuit 800 shown in FIG. 45 includes two p-channel MOSFETs (metal-oxide semiconductor field-effect transistors) 801 and 802 and two n-channel MOSFETs 803 and 804.

The p-channel MOSFETs 801 and 802 are connected between a power supply terminal receiving a supply potential VDD and output nodes N11 and N12 respectively, while the n-channel MOSFETs 803 and 804 are connected between the output nodes N11 and N12 and a ground terminal respectively. The gates of the p-channel MOSFETs 801 and 802 are cross-coupled to the output nodes N12 and N11 respectively. The gates of the n-channel MOSFETs 803 and 804 are supplied with mutually complementarily changing input signals CLK1 and CLK2 respectively.

When the input signal CLK1 goes high and the input signal CLK2 goes low, the n-channel MOSFET 803 is turned on and the n-channel MOSFET 804 is turned off. Thus, the p-channel MOSFET 802 is turned on and the p-channel MOSFET 801 is turned off. Consequently, an output potential Vout of the output node N12 increases. When the input signal CLK1 goes low and the input signal CLK2 goes high, on the other hand, the output potential Vout of the output node N12 decreases.

In this case, the voltage amplitudes of the input signals CLK1 and CLK2 must be larger than the threshold voltages Vtn of the n-channel MOSFETs 803 and 804, in order to turn on the n-channel MOSFETs 803 and 804.

Therefore, the level conversion circuit 800 shown in FIG. 45 is employed when the voltage ratio between input and output signals is small.

For example, this level conversion circuit 800 is effective when converting a 3 V-system signal to a 5 V-system signal, converting a 2.5 V-system signal to a 3 V-system signal or converting a 1.8 V-system signal to a 2.5 V- or 3.3 V-system signal.

FIG. 46 is a circuit diagram showing a second exemplary conventional level conversion circuit 810.

The level conversion circuit 810 shown in FIG. 46 includes a bias circuit 811, a p-channel MOSFET 812 and an n-channel MOSFET 813.

The p-channel MOSFET 812 is connected between a power supply terminal receiving a supply potential VDD and an output node N13, while the n-channel MOSFET 813 is connected between the output node N13 and another power supply terminal receiving a prescribed potential VEE. An input signal CLK is supplied to the gate of the p-channel MOSFET 812 and the bias circuit 811. The bias circuit 811 supplies the input signal CLK to the gate of the n-channel MOSFET 813 while shifting the central level thereof.

When the input signal CLK goes high, the p-channel MOSFET 812 is turned off and the n-channel MOSFET 813 is turned on. Thus, an output potential Vout of the output node N13 decreases. When the input signal CLK goes low, on the other hand, the p-channel MOSFET 812 is turned on and the n-channel MOSFET 813 is turned off. Thus, the output potential Vout of the output node N13 increases.

In this case, the bias circuit 811 shifts the central level of the input signal CLK, and hence the level conversion circuit 810 operates also when the voltage amplitude of the input signal CLK is smaller than the threshold voltage Vtn of the n-channel MOSFET 813.

FIG. 47 is a circuit diagram showing a third exemplary conventional level conversion circuit 820.

The level conversion circuit 820 shown in FIG. 47 includes a clamping circuit 821 and a current mirror amplifier 822.

The current mirror amplifier 822 includes two p-channel MOSFETs 831 and 832 and two n-channel MOSFETs 833 and 834. The p-channel MOSFETs 831 and 832 are connected between power supply terminals receiving a supply potential VDD and output nodes N14 and N15 respectively. The n-channel MOSFETs 833 and 834 are connected between the output nodes N14 and N15 and ground terminals respectively. The gates of the p-channel MOSFETs 831 and 832 are connected to the output node N14. The clamping circuit 821 supplies mutually complementarily changing input signals CLK1 and CLK2 to the gates of the n-channel MOSFETs 833 and 834 while shifting the central levels thereof.

When the input signal CLK1 goes high and the input signal CLK2 goes low, the n-channel MOSFET 833 is turned on and the n-channel MOSFET 834 is turned off. Thus, the p-channel MOSFETs 831 and 832 are turned on. Consequently, an output potential Vout of the output node N15 increases. When the input signal CLK1 goes low and the input signal CLK2 goes high, on the other hand, the output potential Vout of the output node N15 decreases.

In this case, the clamping circuit 821 shifts the central levels of the input signals CLK1 and CLK2, and hence the level conversion circuit 820 can operate also when the voltage amplitudes of the input signals CLK1 and CLK2 are smaller than the threshold voltages Vtn of the n-channel MOSFETs 833 and 834.

FIG. 48 is a circuit diagram showing a fourth exemplary conventional level conversion circuit 840.

The level conversion circuit 840 shown in FIG. 48 includes a clamping circuit 841 and a PMOS cross-coupled amplifier 842.

The PMOS cross-coupled amplifier 842 includes two p-channel MOSFETs 851 and 852 and two n-channel MOSFETs 853 and 854. The p-channel MOSFETs 851 and 852 are connected between power supply terminals receiving a supply potential VDD and output nodes N16 and N17 respectively, while the n-channel MOSFETs 853 and 854 are connected between the output nodes N16 and N17 and ground terminals respectively. The gates of the p-channel MOSFETs 851 and 852 are cross-coupled to the output nodes N17 and N16 respectively. The clamping circuit 841 supplies mutually complementarily changing input signals CLK1 and CLK2 to the gates of the n-channel MOSFETs 853 and 854 respectively while shifting the central levels thereof.

When the input signal CLK1 goes high and the input signal CLK2 goes low, the n-channel MOSFET 853 is turned on and the n-channel MOSFET 854 is turned off. Thus, the p-channel MOSFET 851 is turned off and the p-channel MOSFET 852 is turned on. Consequently, an output potential Vout of the output node N17 increases. When the input signal CLK1 goes low and the input signal CLK2 goes high, on the other hand, the output potential Vout of the output node N17 decreases.

In this case, the clamping circuit 841 shifts the central levels of the input signals CLK1 and CLK2, and hence the level conversion circuit 840 can operate also when the voltage amplitudes of the input signals CLK1 and CLK2 are smaller than the threshold voltages Vtn of the n-channel MOSFETs 853 and 854.

As hereinabove described, the level conversion circuit 800 shown in FIG. 45 cannot operate when the voltage amplitudes of the input signals CLK1 and CLK2 are smaller than the threshold voltages Vtn of the n-channel MOSFETs 803 and 804.

Referring to FIG. 46, on the other hand, the bias circuit 811 shifts the central level of the input signal CLK, and hence the level conversion circuit 810 can operate also when the voltage amplitude of the input signal CLK is smaller than the threshold voltage Vtn of the n-channel MOSFET 813.

Referring to FIGS. 47 and 48, the clamping circuits 821 and 841 similarly shift the central levels of the input signals CLK1 and CLK2, and hence the level conversion circuits 820 and 840 can operate also when the voltage amplitudes of the input signals CLK1 and CLK2 are smaller than the threshold voltages Vtn of the n-channel MOSFETs 833, 834, 853 and 854.

However, the level conversion circuits 810, 820 and 840 shown in FIGS. 46 to 48 may not operate when the threshold voltages Vtn of the n-channel MOSFETs 833, 834, 853 and 854 remarkably deviate from design values due to variations in fabrication steps.

In any of the level conversion circuits 800, 810, 820 and 840 shown in FIGS. 45 to 48, further, the duty ratio of an output waveform deviates from a prescribed design value when the threshold voltages Vtp and Vtn of the p-channel and n-channel MOSFETs irregularly vary in fabrication steps, e.g., when the threshold voltage(s) Vtn of the n-channel MOSFET(s) increases and the threshold voltage (s) Vtp of the p-channel MOSFET(s) increases or vice versa.

Particularly when employing the level conversion circuit for forming a clock signal for a display device such as a liquid crystal display unit or an organic EL device, the duty ratio of the clock signal must be set to 50%. When the duty ratio of the clock signal deviates from 50% due to irregular change of the threshold voltages Vtn and Vtp of the n-channel and p-channel MOSFETs of the level conversion circuit, turn-on and turn-off times of pixels vary in the display device.

In the level conversion circuit 800 shown in FIG. 45, the p-channel MOSFETs 801 and 802 extract gate charges from each other when ON and OFF states of the n-channel MOSFETs 803 and 804 are inverted. Therefore, it takes time to invert the level of the output potential Vout, and the operating speed cannot be increased.

Particularly when the p-channel MOSFETs 801 and 802 are formed by transistors such as thin-film transistors of polycrystalline silicon having small drivability, the time required for inverting the level of the output potential Vout is further increased.

When the level of the output potential Vout is inverted, a through current flows from the power supply terminal to the ground terminal through a path of the p-channel MOSFET 801 and the n-channel MOSFET 803 or that of the p-channel MOSFET 802 and the n-channel MOSFET 804. Particularly when it takes time to invert the level of the output potential Vout, the flowing time of the through current is increased to increase power consumption.

The bias circuit 811 of the level conversion circuit 810 shown in FIG. 46 feeds a current to a resistive element thereby forming potential difference between the input signal CLK and an output signal. In this case, it takes time to set the potential difference between the input signal CLK and the output signal, to hinder high-speed operation. Further, a large layout area is required for forming the resistive element. In addition, the current regularly flows to the resistive element, to increase power consumption. Further, high-speed operation cannot be attained and hence the through current is increased in the p-channel MOSFET 810 and the n-channel MOSFET 813 of the output stage.

The clamping circuits 821 and 841 of the level conversion circuits 820 and 840 shown in FIGS. 47 and 48 are also inhibited from high-speed operation, require large layout areas and increase power consumption, similarly to the bias circuit 811 of the level conversion circuit 810 shown in FIG. 46.

SUMMARY OF THE INVENTION

An object of the present invention is to provide a level conversion circuit capable of reliably operating also when the threshold voltage of a transistor deviates from a design value due to variations in fabrication steps, while enabling high-speed operation, reduction of power consumption and area reduction.

Another object of the present invention is to provide a semiconductor device employing a level conversion circuit capable of reliably operating also when the threshold voltage of a transistor deviates from a design value due to variations in fabrication steps, while enabling high-speed operation, reduction of power consumption and area reduction.

Still another object of the present invention is to provide a display unit employing a level conversion circuit capable of reliably operating also when the threshold voltage of a transistor deviates from a design value due to dispersion in fabrication steps, while enabling high-speed operation, reduction of power consumption and area reduction.

A level conversion circuit according to an aspect of the present invention comprises a first transistor connected between a first node receiving a first potential and an output node, a second transistor connected between a second node receiving a second potential different from the first potential and the output node, and a control part receiving a first input signal and bringing both of the first and second transistors into ON states while controlling the degrees of the ON states of the first and second transistors respectively in response to the level of the first input signal.

In the level conversion circuit, the control part brings both of the first and second transistors into ON states while controlling the degrees of the ON states of the first and second transistors respectively in response to the level of the first input signal. Thus, the potential of the output node increases or decreases in response to the level of the first input signal.

In this case, the degrees of the ON states of the first and second transistors which are regularly on are controlled to change the potential of the output node, whereby the level conversion circuit can operate also when the voltage amplitude of the first input signal is smaller than the threshold voltages of the first and second transistors. Also when the threshold voltages of the first and second transistors remarkably deviate from design values, further, the duty ratio of potential change of the output node correctly corresponds to the duty ratio of the first input signal. Thus, the level conversion circuit can reliably operate also when the threshold voltages of the transistors deviate from the design values due to variations in fabrication steps.

The ON states of the first and second transistors which are regularly on are controlled to change the potential of the output node, whereby the level conversion circuit can operate at a high speed. Further, a transition period of the level of the potential of the output node is shortened due to the enabled high-speed operation, thereby reducing a flowing period of a through current. Thus, power consumption can be reduced.

No level-shifting circuit is required also when the first input signal has a small voltage amplitude, whereby the area can be reduced.

The first input signal may change with a voltage amplitude smaller than the difference between the first potential and the second potential.

In this case, the potential of the output node changes with a voltage amplitude larger than the voltage amplitude of the first input signal.

The first input signal may change to a first level and a second level, the first transistor may be a first conductive channel field-effect transistor and the second transistor may be a second conductive channel field-effect transistor, while the control part may set the gate potential of the first conductive channel field-effect transistor and the gate potential of the second conductive channel field-effect transistor in response to the first and second levels of the first input signal so that the absolute value of the difference between the first potential and the gate potential of the first conductive channel field-effect transistor exceeds the absolute value of the threshold voltage of the first conductive channel field-effect transistor and the absolute value of the difference between the second potential and the gate potential of the second conductive channel field-effect transistor exceeds the absolute value of the threshold voltage of the second conductive channel field-effect transistor.

In this case, the absolute value of the difference between the first potential and the gate potential of the first conductive channel field-effect transistor exceeds the absolute value of the threshold voltage of the first conductive channel field-effect transistor, whereby the first conductive channel field-effect transistor is regularly on. Further, the absolute value of the difference between the second potential and the gate potential of the second conductive channel field-effect transistor exceeds the absolute value of the threshold voltage of the second conductive channel field-effect transistor, whereby the second conductive channel field-effect transistor is regularly on.

Thus, the level conversion circuit can reliably operate also when the threshold voltages of the transistors deviate from design values, while enabling high-speed operation, reduction of power consumption and area reduction.

The first potential may be a positive potential, and the second potential may be a positive potential lower than the first potential, a ground potential or a negative potential.

In this case, the first and second transistors are regularly on and hence a current flows from the first node to the second node through the first and second transistors.

The second potential may be a second input signal changing to a first level and a second level complementarily with the first input signal.

In this case, the first and second levels of the first and second input signals are lower than the first potential, the second input signal reaches the second level when the first input signal is at the first level, and the second input signal reaches the first level when the first input signal is at the second level.

The first conductive channel field-effect transistor may be a first p-channel field-effect transistor having a first threshold voltage, the second conductive channel field-effect transistor may be a first n-channel field-effect transistor having a second threshold voltage, and the control part may set the gate potential of the first p-channel field-effect transistor within a range lowering from the first potential by at least the absolute value of the first threshold voltage while setting the gate potential of the first n-channel field-effect transistor within a range rising from the second potential by at least the absolute value of the second threshold voltage.

In this case, the gate potential of the first p-channel field-effect transistor is set within the range lowering from the first potential by at least the absolute value of the first threshold voltage, whereby the first p-channel field-effect transistor is regularly on. The first p-channel field-effect transistor is weakly turned on when the gate potential thereof is at a high level within the aforementioned range, while the first p-channel field-effect transistor is strongly turned on when the gate potential thereof is at a low level within the aforementioned range.

The gate potential of the first n-channel field-effect transistor is set within the range rising from the second potential by at least the absolute value of the second threshold voltage, whereby the first n-channel field-effect transistor is regularly on. The first n-channel field-effect transistor is weakly turned on when the gate potential thereof at a low level within the aforementioned range, while the first n-channel field-effect transistor is strongly turned on when the gate potential thereof is at a high level within the aforementioned range.

The control part may include a second p-channel field-effect transistor, a second n-channel field-effect transistor and a control circuit, the source of the second p-channel field-effect transistor may receive the first potential, the gate and the drain of the second p-channel field-effect transistor may be connected to the gate of the first p-channel field-effect transistor, the source of the second n-channel field-effect transistor may receive the first input signal or the second potential, the gate and the drain of the second n-channel field-effect transistor may be connected to the gate of the first n-channel field-effect transistor, and the control circuit may control the potential of the drain of the second p-channel field-effect transistor and the potential of the drain of the second n-channel field-effect transistor in response to the level of the first input signal.

In this case, the second p-channel field-effect transistor sets the gate potential of the first p-channel field-effect transistor within the range lowering from the first potential by at least the absolute value of the first threshold voltage. Further, the second n-channel field-effect transistor sets the gate potential of the first n-channel field-effect transistor within the range rising from the second potential by at least the absolute value of the second threshold voltage. In addition, the control circuit controls the gate potential of the first p-channel field-effect transistor within the aforementioned range while controlling the gate potential of the first n-channel field-effect transistor within the aforementioned range.

The control circuit may include first and second load elements, an end of the first load element may receive the first input signal, the other end of the first load element may be connected to the gate of the first p-channel field-effect transistor, an end of the second load element may receive the first potential, and the other end of the second load element may be connected to the gate of the first n-channel field-effect transistor.

In this case, the first load element controls the gate potential of the first p-channel field-effect transistor while the second load element controls the gate potential of the first n-channel field-effect transistor in response to the level of the first input signal.

According to this structure, the level conversion circuit is formed by six elements, whereby the area is reduced.

Each of the first and second load elements may be a field-effect transistor or a resistive element.

In this case, the gate potentials of the first p-channel field-effect transistor and the first n-channel field-effect transistor are controlled by field-effect transistors or resistive elements.

The control part may further include a third p-channel field-effect transistor and a third n-channel field-effect transistor, the source, the gate and the drain of the third p-channel field-effect transistor may be connected to the source of the second p-channel field-effect transistor, the output node and the drain of the second p-channel field-effect transistor respectively, and the source, the gate and the drain of the third n-channel field-effect transistor may be connected to the source of the second n-channel field-effect transistor, the output node and the drain of the second n-channel field-effect transistor respectively.

In this case, the first p-channel field-effect transistor and the first n-channel field-effect transistor can be reliably turned on also when the difference between the first and second potentials is small. Thus, low-voltage driving is enabled.

The control part may include a second n-channel field-effect transistor and a control circuit, the source of the second n-channel field-effect transistor may receive the first input signal or the second potential, the gate and the drain of the second n-channel field-effect transistor may be connected to the gate of the first n-channel field-effect transistor, and the control circuit may control the potential of the gate of the first n-channel field-effect transistor and the potential of the drain of the second n-channel field-effect transistor in response to the level of the first input signal.

In this case, the control circuit sets the gate potential of the first p-channel field-effect transistor within the range lowering from the first potential by at least the absolute vale of the first threshold voltage. Further, the second n-channel field-effect transistor sets the gate potential of the first n-channel field-effect transistor within the range rising from the second potential by at least the absolute value of the second threshold voltage. In addition, the control circuit controls the gate potential of the first p-channel field-effect transistor within the aforementioned range, and controls the gate potential of the first n-channel field-effect transistor within the aforementioned range.

The control circuit may include first, second and third load elements, an end of the first load element may receive the first potential, the other end of the first load element may be connected to the gate of the first p-channel field-effect transistor, an end of the second load element may receive the first input signal or the second potential, the other end of the second load element may be connected to the gate of the first p-channel field-effect transistor, an end of the third load element may receive the first potential, and the other end of the third load element may be connected to the gate of the first n-channel field-effect transistor.

In this case, the first and second load elements control the gate potential of the first p-channel field-effect transistor and the third load element controls the gate potential of the first n-channel field-effect transistor in response to the level of the first input signal.

According to this structure, the level conversion circuit is formed by six elements, whereby the area is reduced.

Each of the first, second and third load elements may be a field-effect transistor or a resistive element.

In this case, the gate potentials of the first p-channel field-effect transistor and the first n-channel field-effect transistor are controlled by field-effect transistors or resistive elements.

The level conversion circuit may further comprise cutoff circuit cutting off a current path reaching the second node from the first node through the first and second transistors in a transition period between a first level and a second level of the first input signal.

In this case, no current flows to the first and second transistors in the transition period between the first and second levels of the first input signal, whereby increase of power consumption caused by a through current is prevented. Therefore, power consumption is further reduced.

The first transistor, the second transistor and the control part may be made of a single-crystalline, polycrystalline or amorphous semiconductor on an insulating substrate.

In this case, the level conversion circuit is formed by an SOI (silicon on insulator) device.

A semiconductor device according to another aspect of the present invention comprises a prescribed circuit and a level conversion circuit connected to the prescribed circuit, and the level conversion circuit comprises a first transistor connected between a first node receiving a first potential and an output node, a second transistor connected between a second node receiving a second potential different from the first potential and the output node, and a control part receiving a first input signal and bringing both of the first and second transistors into ON states while controlling the degrees of the ON states of the first and second transistors respectively in response to the level of the first input signal.

The prescribed circuit may include a plurality of logic circuits operating with different supply voltages, and the level conversion circuit may be connected between the plurality of logic circuits.

In this case, reliable operation as well as high-speed operation, reduction of power consumption and area reduction are enabled in the semiconductor device comprising the plurality of logic circuits operating with different supply voltages, also when the variations of the threshold voltages of the transistors are large in fabrication steps.

The prescribed circuit may include an internal circuit provided on a chip and an external circuit provided outside the chip, and the level conversion circuit may be connected between the internal circuit and the external circuit.

In this case, reliable operation as well as high-speed operation, reduction of power consumption and area reduction are enabled in the semiconductor device comprising the internal circuit provided on the chip and the external circuit provided outside the chip, also when the variations of the threshold voltages of the transistors are large in fabrication steps.

The prescribed circuit may include a semiconductor memory provided on a chip and a logic circuit provided on the chip, and the level conversion circuit may be connected between the semiconductor memory and the logic circuit on the chip.

In this case, reliable operation as well as high-speed operation, reduction of power consumption and area reduction are enabled in the semiconductor device comprising the semiconductor memory and the logic circuit mixedly provided on the chip, also when the variations of the threshold voltages of the transistors are large in fabrication steps.

The prescribed circuit may include a plurality of sensors, a plurality of selection transistors for selecting any of the plurality of sensors and a peripheral circuit driving the plurality of sensors through the plurality of selection transistors, and the level conversion circuit may level-convert a prescribed signal and supply the level-converted prescribed signal to the peripheral circuit.

In this case, reliable operation as well as high-speed operation, reduction of power consumption and area reduction are enabled in the semiconductor device having the plurality of selection transistors and the level conversion circuit, also when the variations of the threshold voltages of the transistors are large in fabrication steps.

A display unit according to still another aspect of the present invention comprises a plurality of display elements, a plurality of selection transistors for selecting any of the plurality of display elements, a peripheral circuit driving the plurality of display elements through the plurality of selection transistors, and a level conversion circuit level-converting a prescribed signal and supplying the level-converted signal to the peripheral circuit, and the level conversion circuit comprises a first transistor connected between a first node receiving a first potential and an output node, a second transistor connected between a second node receiving a second potential different from the first potential and the output node, and a control part receiving a first input signal and bringing both of the first and second transistors into ON states while controlling the degrees of the ON states of the first and second transistors respectively in response to the level of the first input signal.

In this case, reliable operation as well as high-speed operation, reduction of power consumption, area reduction and improvement in definition are enabled in the display unit having the plurality of selection transistors and the level conversion circuit, also when the variations of the threshold voltages of the transistors are large in fabrication steps.

The plurality of display elements may be liquid crystal elements, and the plurality of liquid crystal elements, the plurality of selection transistors, the peripheral circuit and the level conversion circuit may be formed on an insulating substrate.

In this case, a liquid crystal display unit capable of reliable operation as well as high-speed operation, reduction of power consumption, area reduction and improvement in definition is implemented also when the variations of the threshold voltages of the transistors are large in fabrication steps.

The plurality of display elements may be organic electroluminescence elements, and the plurality of organic electroluminescence elements, the plurality of selection transistors, the peripheral circuit and the level conversion circuit may be formed on an insulating substrate.

In this case, an organic electroluminescence device capable of reliable operation as well as high-speed operation, reduction of power consumption, area reduction and improvement in definition is implemented also when the variations of the threshold voltages of the transistors are large in fabrication steps.

The plurality of selection transistors and the first and second transistors of the level conversion circuit may be formed by thin-film transistors.

In this case, a display unit capable of reliable operation as well as high-speed operation, reduction of power consumption, area reduction and improvement in definition is implemented also when the variations of the threshold voltages of the thin-film transistors are large in fabrication steps.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a circuit diagram showing the structure of a level conversion circuit according to a third embodiment of the present invention;

FIG. 14 is a circuit diagram showing the structure of a level conversion circuit according to a fourth embodiment of the present invention;

FIG. 21 is a circuit diagram showing the circuit structure of a level conversion circuit employed for a simulation;

FIG. 30 is a circuit diagram showing the structure of a level conversion circuit according to a ninth embodiment of the present invention;

FIG. 41 is a block diagram showing the structure of a voltage conversion circuit employed for the liquid crystal display unit shown in FIG. 40;

FIG. 42 is a block diagram showing an exemplary organic EL device employing the level conversion circuit according to the present invention;

DESCRIPTION OF THE PREFERRED EMBODIMENTS

Figure 1:
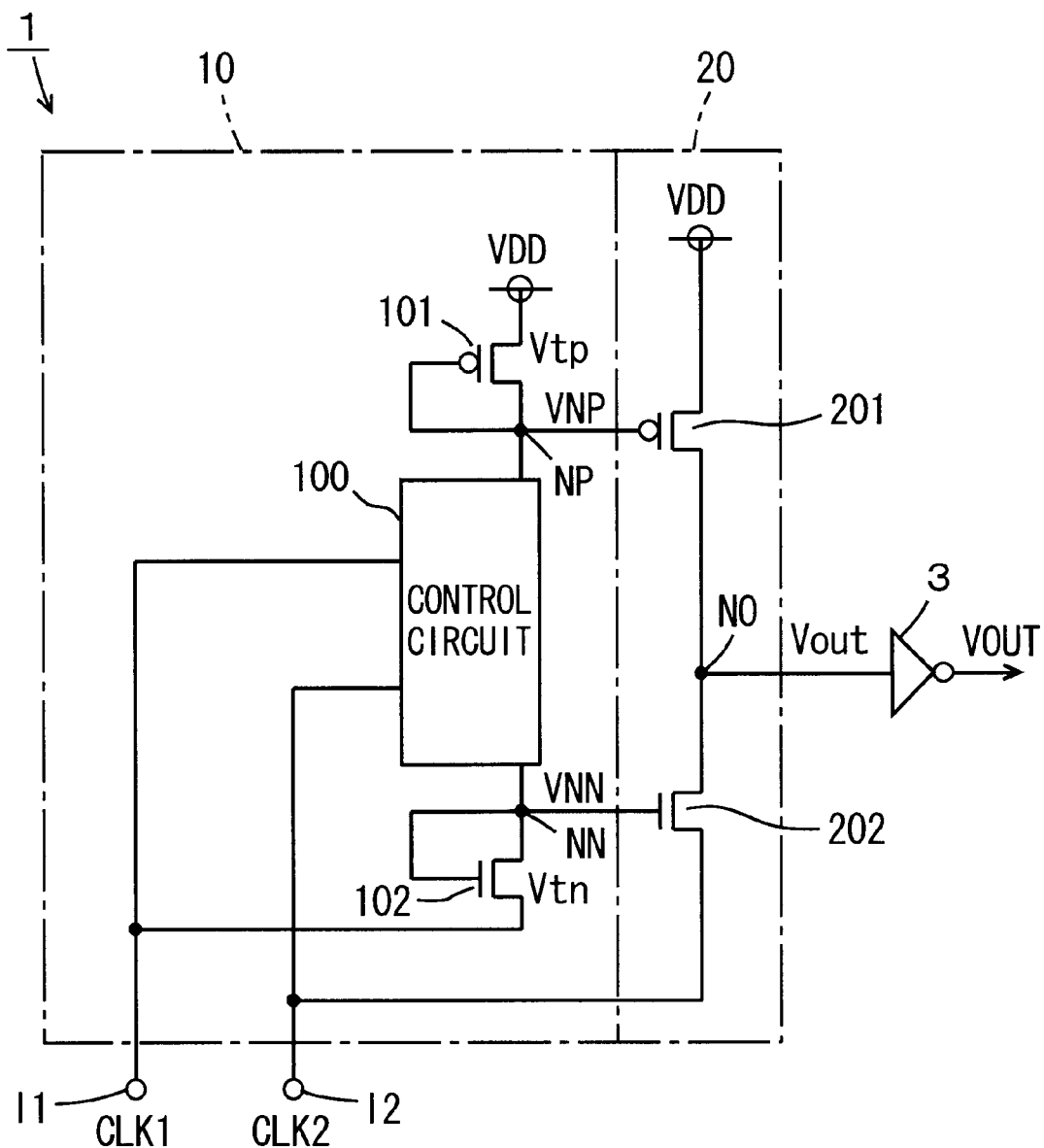
FIG. 1 is a circuit diagram showing the structure of a level conversion circuit according to a first embodiment of the present invention.

FIG. 1 is a circuit diagram showing the structure of a level conversion circuit 1 according to a first embodiment of the present invention.

Referring to FIG. 1, the level conversion circuit 1 comprises a control part 10, a driver part 20 and an inverter 3.

The control part 10 includes a control circuit 100, a p-channel MOSFET (metal-oxide semiconductor field-effect transistor) 101 and an n-channel MOSFET 102. The driver part 20 includes a p-channel MOSFET 201 and an n-channel MOSFET 202. The inverter 3 is formed by a CMOS circuit having a p-channel MOSFET and an n-channel MOSFET.

The control circuit 100 of the control part 10 is connected to input nodes I1 and I2, a first node NP and a second node NN. The input nodes I1 and I2 are supplied with input signals CLK1 and CLK2 mutually complementarily changing to high and low levels respectively. The p-channel MOSFET 101 has a source connected to a power supply terminal receiving a supply potential VDD, and a gate and a drain connected to the first node NP. The n-channel MOSFET 102 has a source connected to the input node I1, and a gate and a drain connected to the second node NN.

In the driver part 20, the p-channel MOSFET 201 has a source connected to a power supply terminal receiving the supply potential VDD, a drain connected to an output node NO an a gate connected to the first node NP. The n-channel MOSFET 202 has a source connected to the input node I2, a drain connected to the output node NO and a gate connected to the second node NN.

The potential difference between the high and low levels of the input signals CLK1 and CLK2 is smaller than the potential difference between the supply potential VDD and a ground potential. In this embodiment, the low level of the input signals CLK1 and CLK2 is the ground potential, and the high level is a potential between the supply potential VDD and the ground potential.

The control circuit 100 controls the potential VNP of the first node NP and the potential VNN of the second node NN in response to the input signals CLK1 and CLK2. The potential VNP of the first node NP is set to a level lowering from the supply potential VDD by at least the absolute value of the threshold voltage Vtp of the p-channel MOSFET 101. The potential VNN of the second node NN is set to a level rising from the low level of the input signal CLK1 by at least the absolute value of the threshold voltage Vtn of the n-channel MOSFET 102. Further, the potential of the source of the n-channel MOSFET 102 is at the level of the input signal CLK1.

Therefore, one of the p-channel MOSFET 201 and the n-channel MOSFET 202 is strongly turned on while the other one is weakly turned on. Thus, neither of the p-channel MOSFET 201 and the n-channel MOSFET 202 of the driver part 20 is completely turned off.

When the p-channel MOSFET 201 is strongly on, for example, the n-channel MOSFET 202 is weakly on. Thus, the value of the ON-state resistance of the p-channel MOSFET 201 is smaller than the value of the ON-state resistance of the n-channel MOSFET 202. Consequently, the output potential Vout of the output node NO is increased.

When the n-channel MOSFET 202 is strongly on, on the other hand, the p-channel MOSFET 201 is weakly on. Thus, the value of the ON-state resistance of the n-channel MOSFET 202 is smaller than the value of the ON-state resistance of the p-channel MOSFET 201. Consequently, the output potential Vout of the output node NO is reduced.

The inverter 3 converts the output potential Vout to an output potential VOUT changing to the supply potential VDD and the ground potential.

Figure 2:
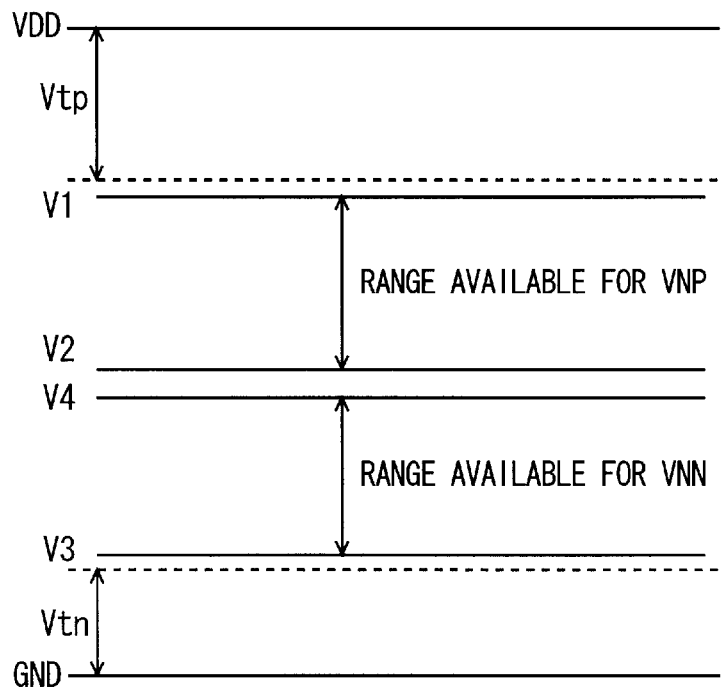
FIG. 2 is a model diagram showing exemplary ranges available for the potentials of first and second nodes in the level conversion circuit shown in FIG. 1.
Figure 3:
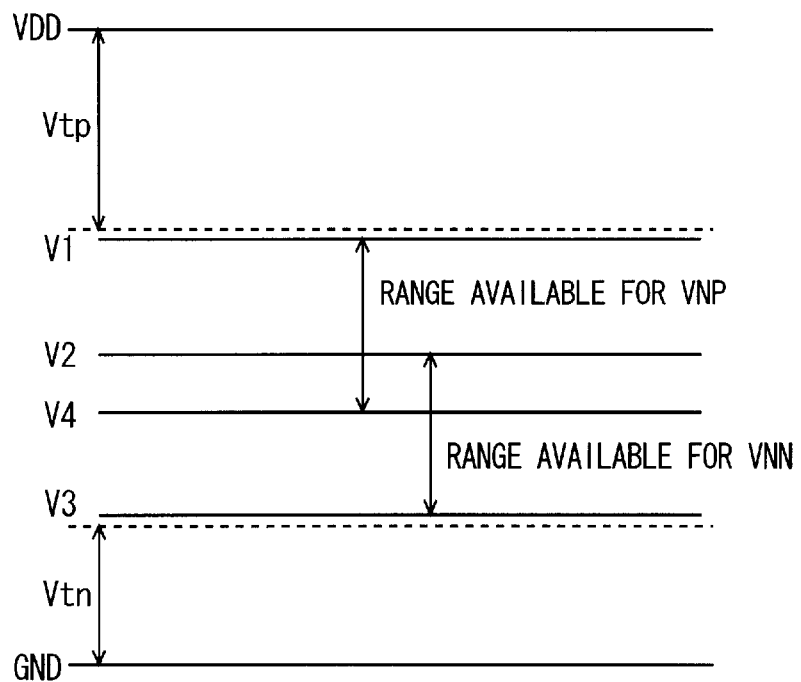
FIG. 3 is a model diagram showing other exemplary ranges available for the potentials of the first and second nodes in the level conversion circuit shown in FIG. 1.
Figure 4:
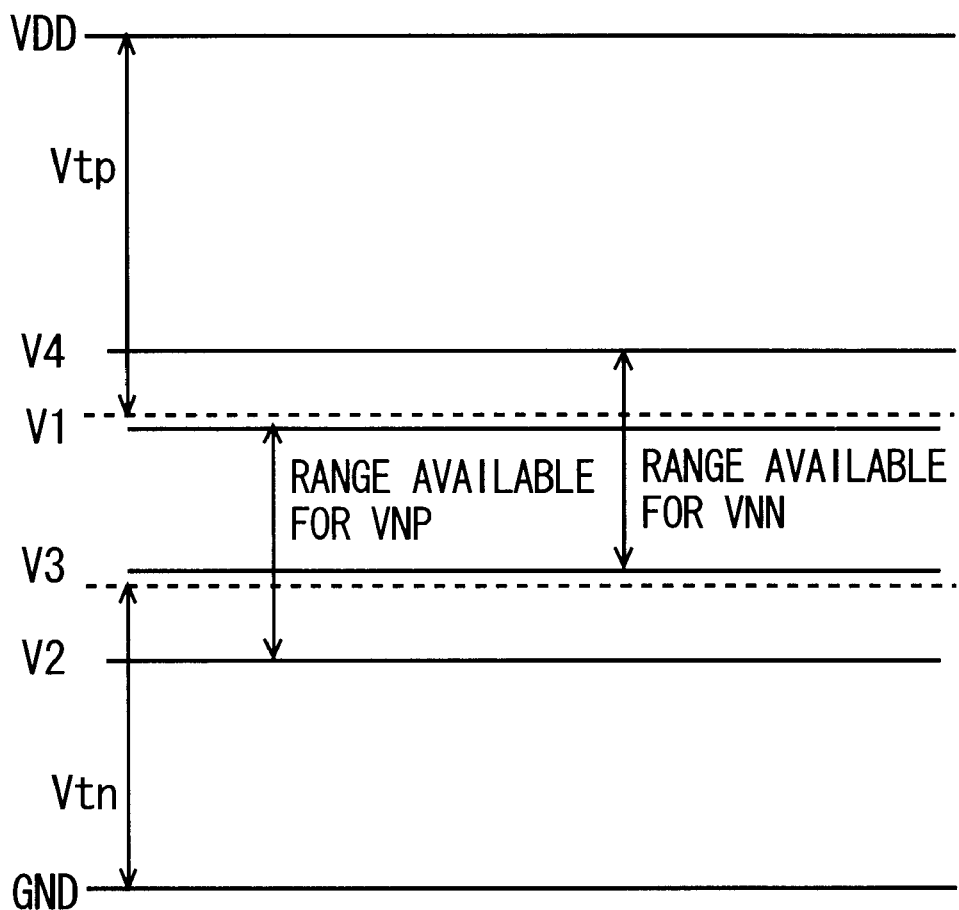
FIG. 4 is a model diagram showing further exemplary ranges available for the potentials of the first and second nodes in the level conversion circuit shown in FIG. 1.

FIGS. 2, 3 and 4 are model diagrams showing exemplary ranges available for the potential VNP of the first node NP and the potential VNN of the second node NN in the level conversion circuit 1 shown in FIG. 1.

As shown in FIGS. 2 to 4, the range available for the potential VNP of the first node NP is between a first level V1 lowering from the supply potential VDD by the threshold voltage Vtp of the p-channel MOSFET 101 and a second level V2 lower than the first level V1. The range available for the potential VNN of the second node NN is between a third level V3 rising from the ground potential GND by the threshold voltage Vtn of the n-channel MOSFET 102 and a fourth level V4 higher than the third level V3.

Referring to FIG. 2, the threshold voltage Vtp of the p-channel MOSFET 101 and the threshold voltage Vtn of the n-channel MOSFET 102 are relatively small. In this case, the potential VNP of the first node NP is higher than the potential VNN of the second node NN. Thus, currents flowing in the p-channel MOSFET 201 and the n-channel MOSFET 202 of the driver part 20 are relatively reduced. Therefore, a through current in the driver part 20 is relatively reduced, while an operating speed is relatively reduced.

Referring to FIG. 3, the threshold voltage Vtp of the p-channel MOSFET 101 and the threshold voltage Vtn of the n-channel MOSFET 102 are somewhat large. In this case, the difference between the potential VNP of the first node NP and the potential VNN of the second node NN is reduced. Thus, the values of the currents flowing in the p-channel MOSFET 201 and the n-channel MOSFET 202 of the driver part 20 are somewhat increased. Therefore, the through current in the driver part 20 is somewhat increased as compared with the case shown in FIG. 2, while the operating speed is somewhat higher than that in the case of FIG. 2.

Referring to FIG. 4, the threshold voltage Vtp of the p-channel MOSFET 101 and the threshold voltage Vtn of the n-channel MOSFET 102 are relatively large. In this case, the potential VNP of the first node NP is lower than the potential VNN of the second node NN. Thus, the currents flowing in the p-channel MOSFET 201 and the n-channel MOSFET 202 of the driver part 20 are relatively increased. Therefore, the through current in the driver part 20 is relatively increased, while the operating current is relatively increased.

Figure 5:
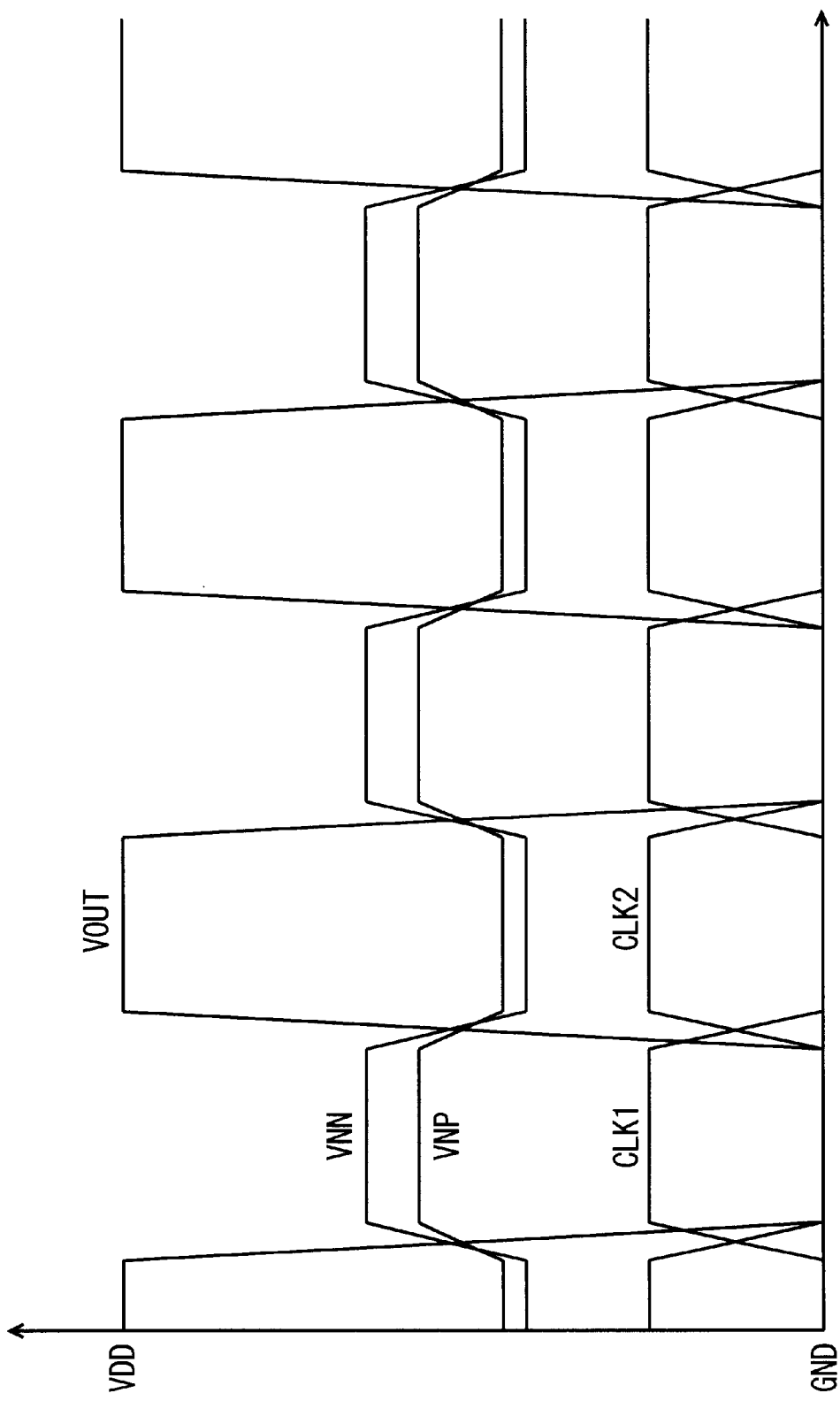
FIG. 5 is a voltage waveform diagram showing exemplary operation of the level conversion circuit shown in FIG. 1.

FIG. 5 is a voltage waveform diagram showing exemplary operation of the level conversion circuit 1 shown in FIG. 1. The exemplary operation shown in FIG. 5 corresponds to the case of FIG. 4, and the high level of the potential VNP of the first node NP is lower than the high level of the potential VNN of the second node NN while the low level of the potential VNP of the first node NP is higher than the low level of the potential VNN of the second node NN. In the exemplary operation shown in FIG. 5, the through current in the driver part 20 is relatively increased, while the operating speed is increased.

As shown in FIG. 5, the potential VNP of the first node NP and the potential VNN of the second node NN change in phase with each other. When the input signal CLK1 goes high and the input signal CLK2 goes low, the potential VNP of the first node NP and the potential VNN of the second node NN go high. Thus, the output potential VOUT reaches the ground potential GND.

When the input signal CLK1 goes low and the input signal CLK2 goes high, on the other hand, the potential VNP of the first node NP and the potential VNN of the second node NN go low. Thus, the output potential VOUT reaches the supply potential VDD.

In the level conversion circuit 1 according to this embodiment, the degrees of ON states of the p-channel MOSFET 201 and the n-channel MOSFET 202 which are regularly on are so controlled as to enable operation also when voltage amplitudes of the input signals CLK1 and CLK2 are smaller than the threshold voltages Vtp and Vtn of the p-channel MOSFET 201 and the n-channel MOSFET 202. Also when the threshold voltages Vtp and Vtn of the p-channel MOSFET 201 and the n-channel MOSFET 202 remarkably deviate from design values, further, a waveform of the output potential Vout corresponding to level change of the input signals CLK1 and CLK2 is obtained. Thus, the level conversion circuit 1 can reliably operate also when the threshold voltages Vtp and Vtn of the p-channel MOSFET 201 and the n-channel MOSFET 202 deviate from the design values due to variations in fabrication steps.

Further, the degrees of ON states of the p-channel MOSFET 201 and the n-channel MOSFET 202 which are regularly on are so controlled as to enable high-speed operation. In addition, a transition period of the level of the output potential Vout is shortened due to the enabled high-speed operation, thereby shortening the flowing period of the threshold current. Thus, power consumption can be reduced.

Further, no level-shifting circuit is required also when voltage amplitudes of the input signals CLK1 and CLK2 are small, whereby the area can be reduced.

Figure 6:
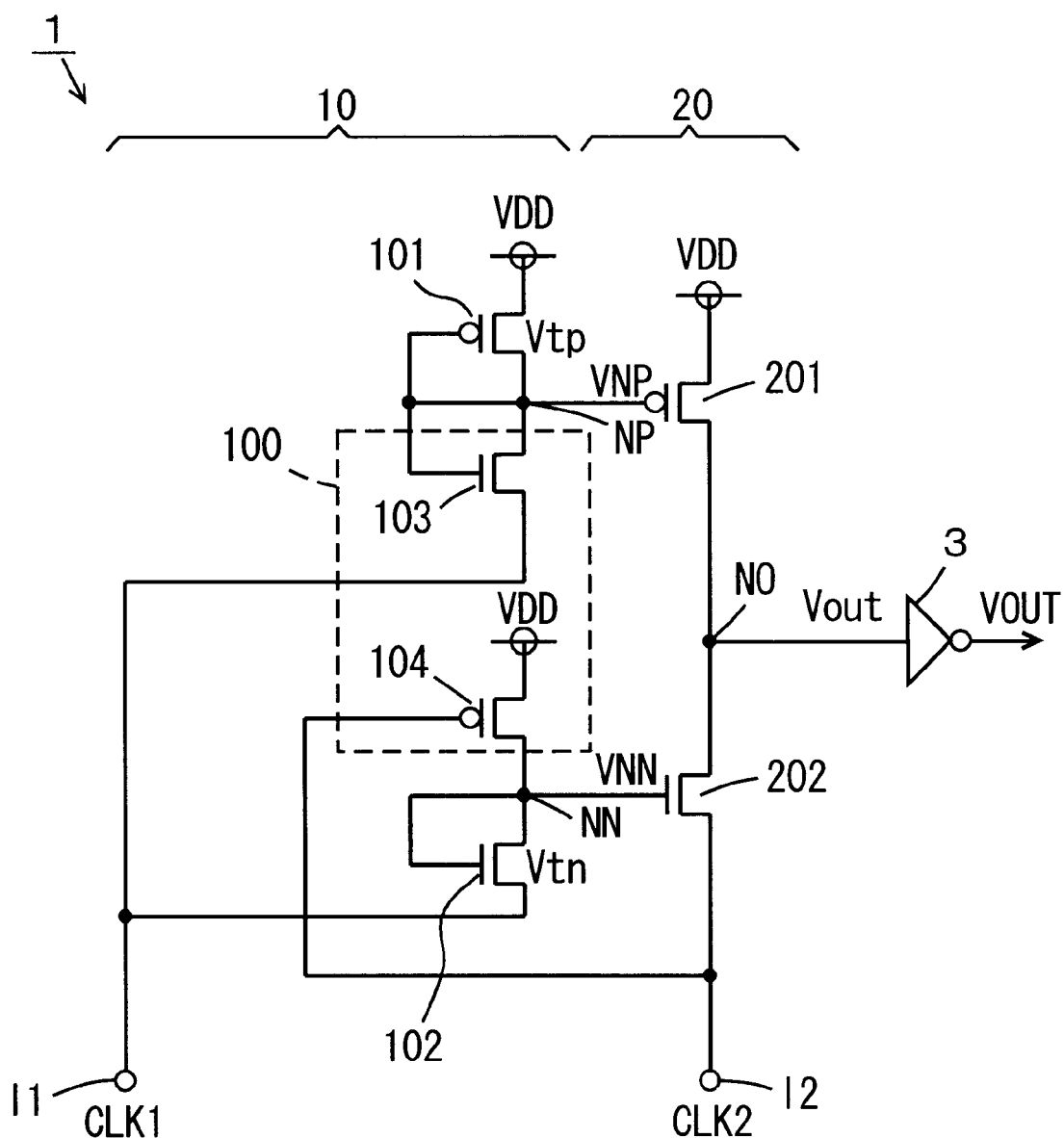
FIG. 6 is a circuit diagram showing a first exemplary circuit structure of the level conversion circuit shown in FIG. 1.

FIG. 6 is a circuit diagram showing a first exemplary circuit structure of the level conversion circuit 1 shown in FIG. 1.

As shown in FIG. 6, the control circuit 100 includes an n-channel MOSFET 103 and a p-channel MOSFET 104. The n-channel MOSFET 103 has a source connected to the input node I1, and a drain and a gate connected to the first node NP. The p-channel MOSFET 104 has a source connected to a power supply terminal, a drain connected to the second node NN and a gate connected to the input node I2.

Thus, the level conversion circuit 1 is formed by six MOSFETs in the example shown in FIG. 6. Therefore, the area can be reduced.

It is assumed here that Vtp represents the threshold voltage of the p-channel MOSFET 101, and Vth represents the threshold voltage of the n-channel MOSFET 102.

Also when the threshold voltages of the p-channel and n-channel MOSFETs vary with the level conversion circuit 1 in fabrication steps, the threshold voltages of the p-channel MOSFETs 101, 104 and 201 are identical to each other and the threshold voltages of the n-channel MOSFETs 102, 103 and 202 are identical to each other in the same level conversion circuit 1.

In the example shown in FIG. 6, the p-channel MOSFET 101 sets the potential VNP of the first node NP to a level lowering from the supply potential VDD by a least the absolute value of the threshold voltage Vtp. Thus, the p-channel MOSFET 201 is regularly on. Further, the n-channel MOSFET 102 sets the potential VNN of the second node NN to a level rising from the ground potential by at least the absolute value of the threshold voltage Vtn. Thus, the n-channel MOSFET 202 is regularly on.

The n-channel MOSFET 103 controls the potential VNP of the first node NP to a high or low level in response to the level of the input signal CLK1. Further, the p-channel MOSFET 104 controls the potential VNN of the second node NN to a high or low level in response to the level of the input signal CLK2. Thus, one of the p-channel MOSFET 201 and the n-channel MOSFET 202 is strongly turned on while the other one is weakly turned on.

Figure 7:
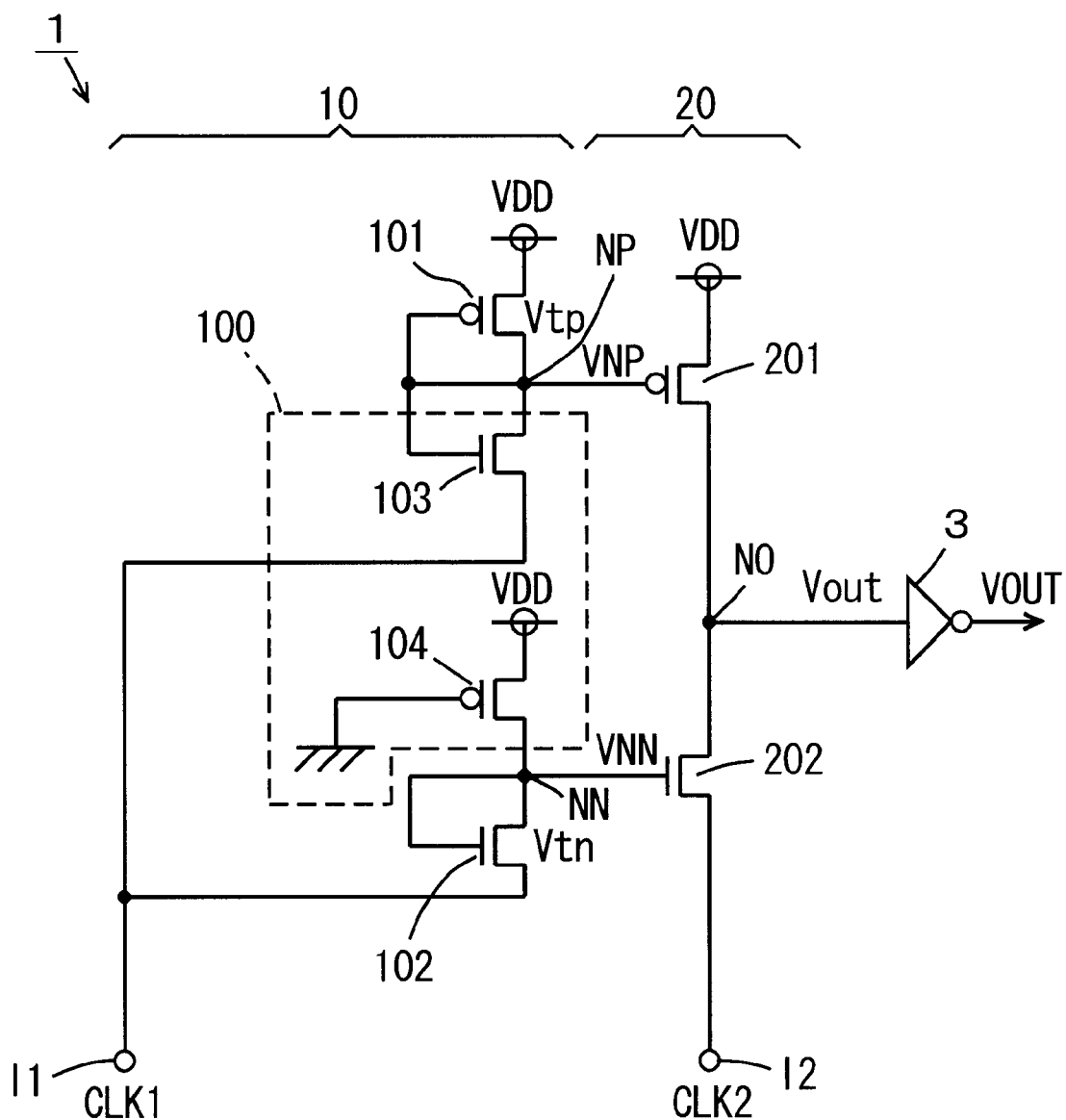
FIG. 7 is a circuit diagram showing a second exemplary circuit structure of the level conversion circuit shown in FIG. 1.

FIG. 7 is a circuit diagram showing a second exemplary circuit structure of the level conversion circuit 1 shown in FIG. 1.

The level conversion circuit 1 shown in FIG. 7 is different from the level conversion circuit 1 shown in FIG. 6 in a point that the gate of the p-channel MOSFET 104 of the control circuit 100 is connected to a ground terminal. In this case, the p-channel MOSFET 104 is regularly on and serves as load resistance. Thus, the n-channel MOSFET 202 of the driver part 20 is regularly on.

The potential VNN of the second node NN is controlled to a high or low level in response to the level of the input signal CLK1. Thus, the n-channel MOSFET 202 is strongly or weakly turned on.

The structures of the remaining parts and operation of the level conversion circuit 1 shown in FIG. 7 are similar to those of the level conversion circuit 1 shown in FIG. 6.

Figure 8:
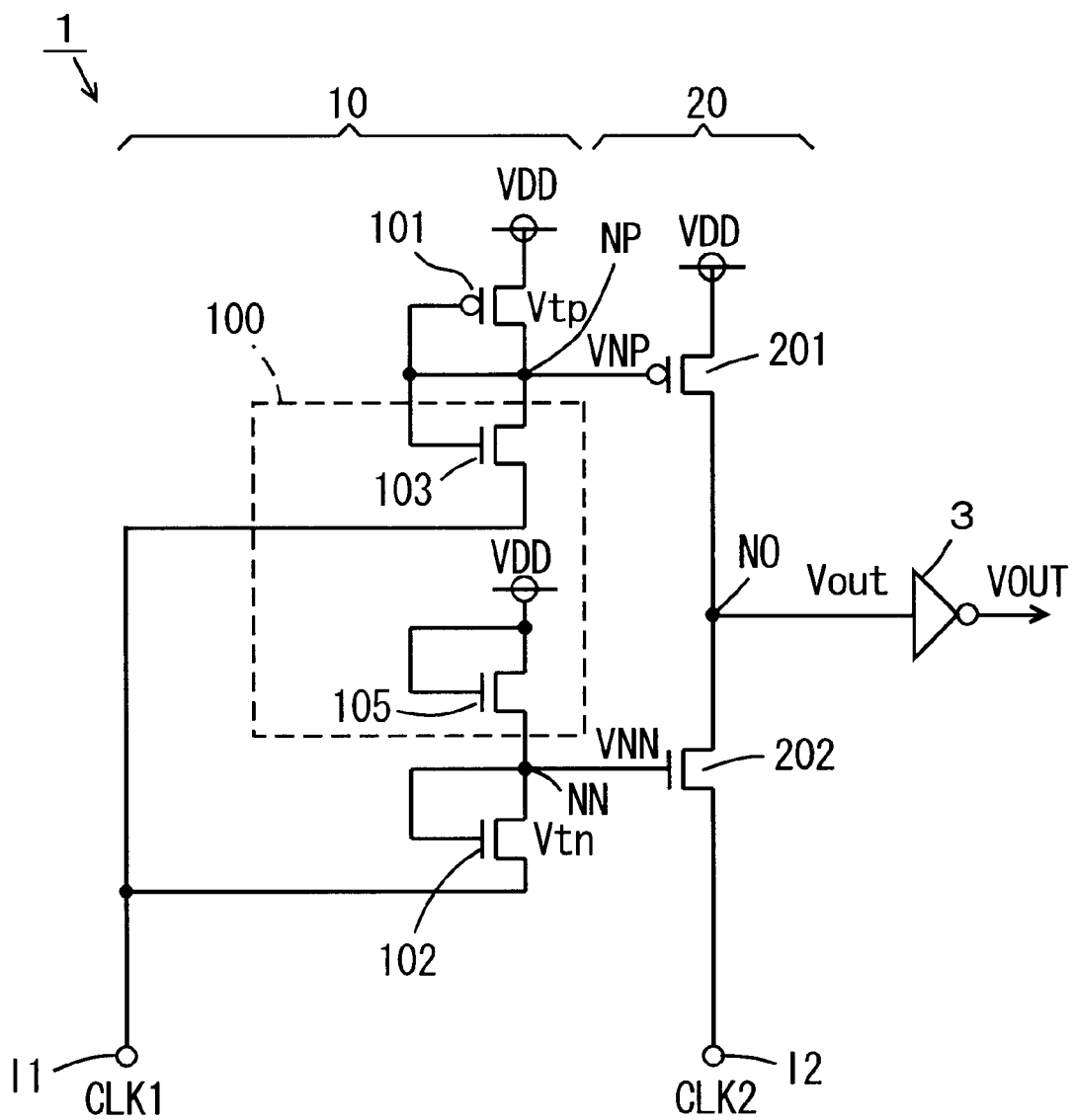
FIG. 8 is a circuit diagram showing a third exemplary circuit structure of the level conversion circuit shown in FIG. 1.

FIG. 8 is a circuit diagram showing a third exemplary circuit structure of the level conversion circuit 1 shown in FIG. 1.

The level conversion circuit 1 shown in FIG. 8 is different from the level conversion circuit 1 shown in FIG. 7 in a point that the control circuit 100 includes an n-channel MOSFET 105 in place of the p-channel MOSFET 104. The n-channel MOSFET 105 has a source connected to the second node NN, and a drain and a gate connected to a power supply terminal. In this case, the n-channel MOSFET 105 is regularly on and serves as load resistance. Thus, the n-channel MOSFET 202 of the driver part 20 is regularly on.

The potential VNN of the second potential NN is controlled to a high or low level in response to the level of the input signal CLK1. Thus, the n-channel MOSFET 202 is strongly or weakly turned on.

The structures of the remaining parts and operation of the level conversion circuit 1 shown in FIG. 8 are similar to those of the level conversion circuit 1 shown in FIG. 6.

Figure 9:
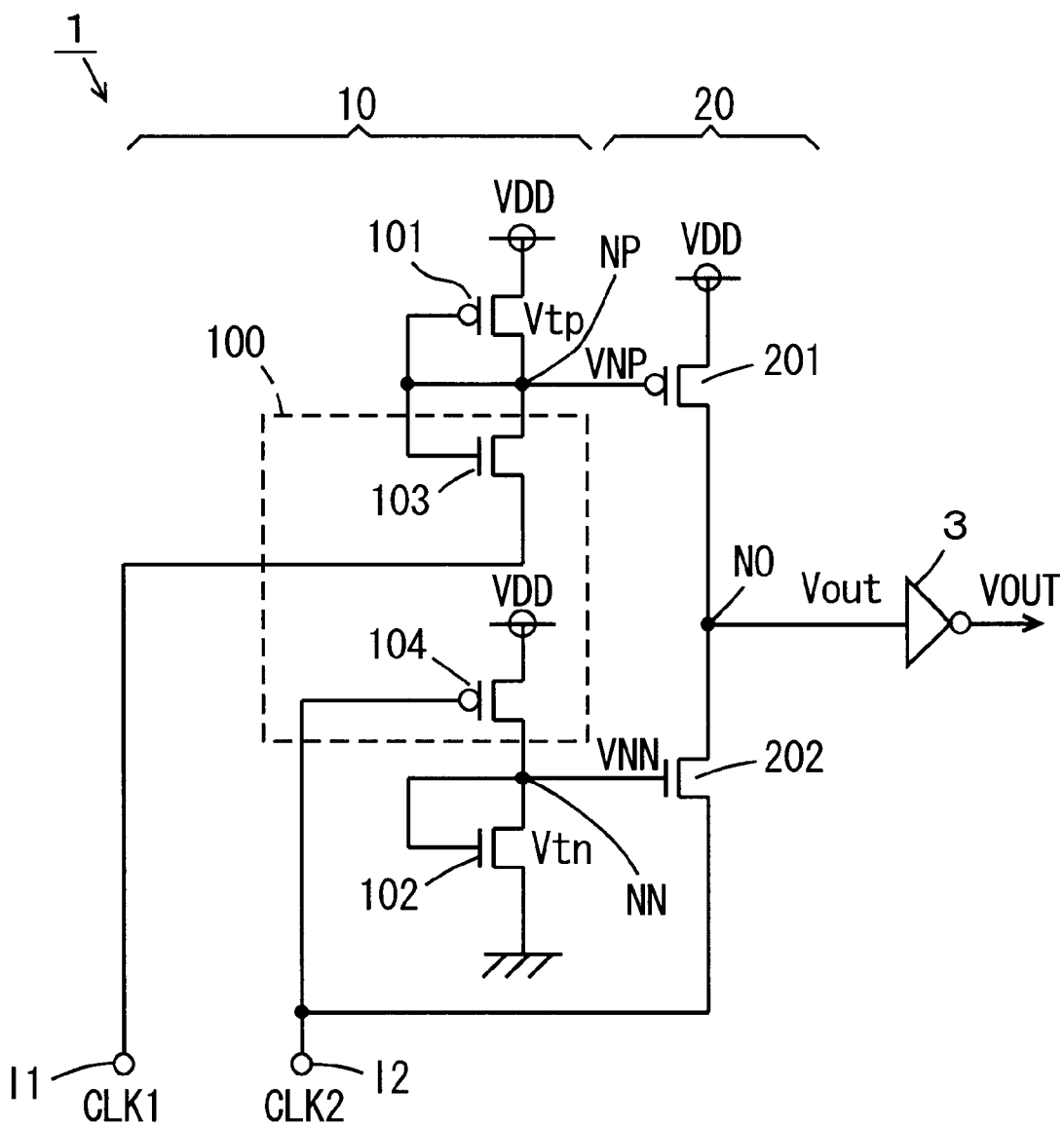
FIG. 9 is a circuit diagram showing a fourth exemplary circuit structure of the level conversion circuit shown in FIG. 1.

FIG. 9 is a circuit diagram showing a fourth exemplary circuit structure of the level conversion circuit 1 shown in FIG. 1.

The level conversion circuit 1 shown in FIG. 9 is different from the level conversion circuit 1 shown in FIG. 6 in a point that the source of the n-channel MOSFET 102 is connected to a ground terminal. In this case, the n-channel MOSFET 102 sets the potential VNN of the second node NN to a level rising from the ground potential by at least the absolute value of the threshold voltage Vtn. Thus, the n-channel MOSFET 202 of the driver part 20 is regularly on.

The p-channel MOSFET 104 controls the potential VNN of the second node NN to a high or low level in response to the level of the input signal CLK2. Thus, the n-channel MOSFET 202 is strongly or weakly turned on.

The structures of the remaining parts and operation of the level conversion circuit 1 shown in FIG. 9 are similar to those of the level conversion circuit 1 shown in FIG. 6.

Figure 10:
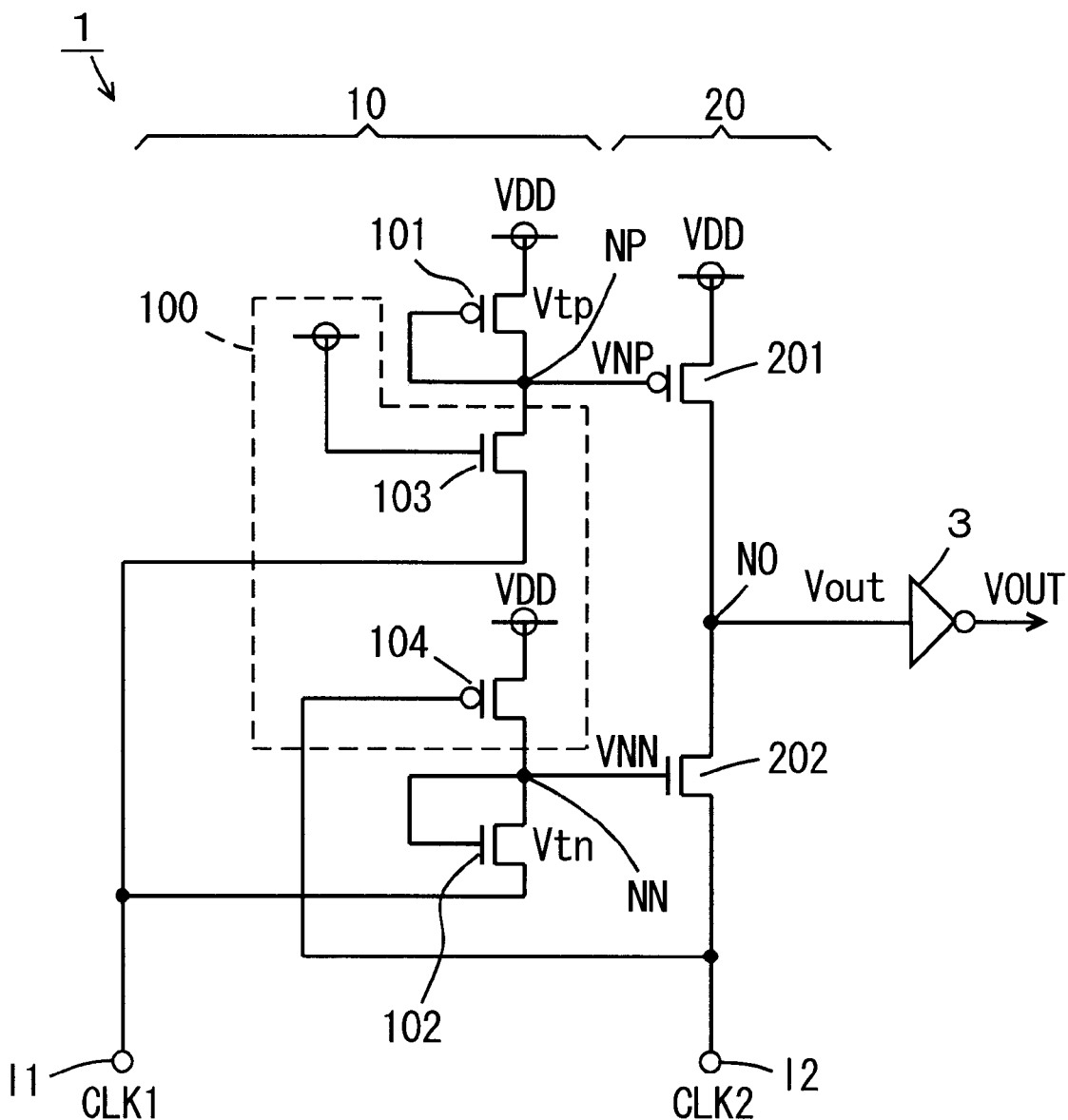
FIG. 10 is a circuit diagram showing a fifth exemplary circuit structure of the level conversion circuit shown in FIG. 1.

FIG. 10 is a circuit diagram showing a fifth exemplary circuit structure of the level conversion circuit 1 shown in FIG. 1.

The level conversion circuit 1 shown in FIG. 10 is different from the level conversion circuit 1 shown in FIG. 6 in a point that the gate of the n-channel MOSFET 103 of the control circuit 100 is connected to a power supply terminal. In this case, the n-channel MOSFET 103 is regularly on and serves as load resistance. Thus, the potential VNP of the first node NP is controlled to a high or low level in response to the level of the input signal CLK1. Therefore, the p-channel MOSFET 201 of the driver part 20 is strongly or weakly turned on.

The structures of the remaining parts and operation of the level conversion circuit 1 shown in FIG. 10 are similar to those of the level conversion circuit 1 shown in FIG. 6.

Figure 11:
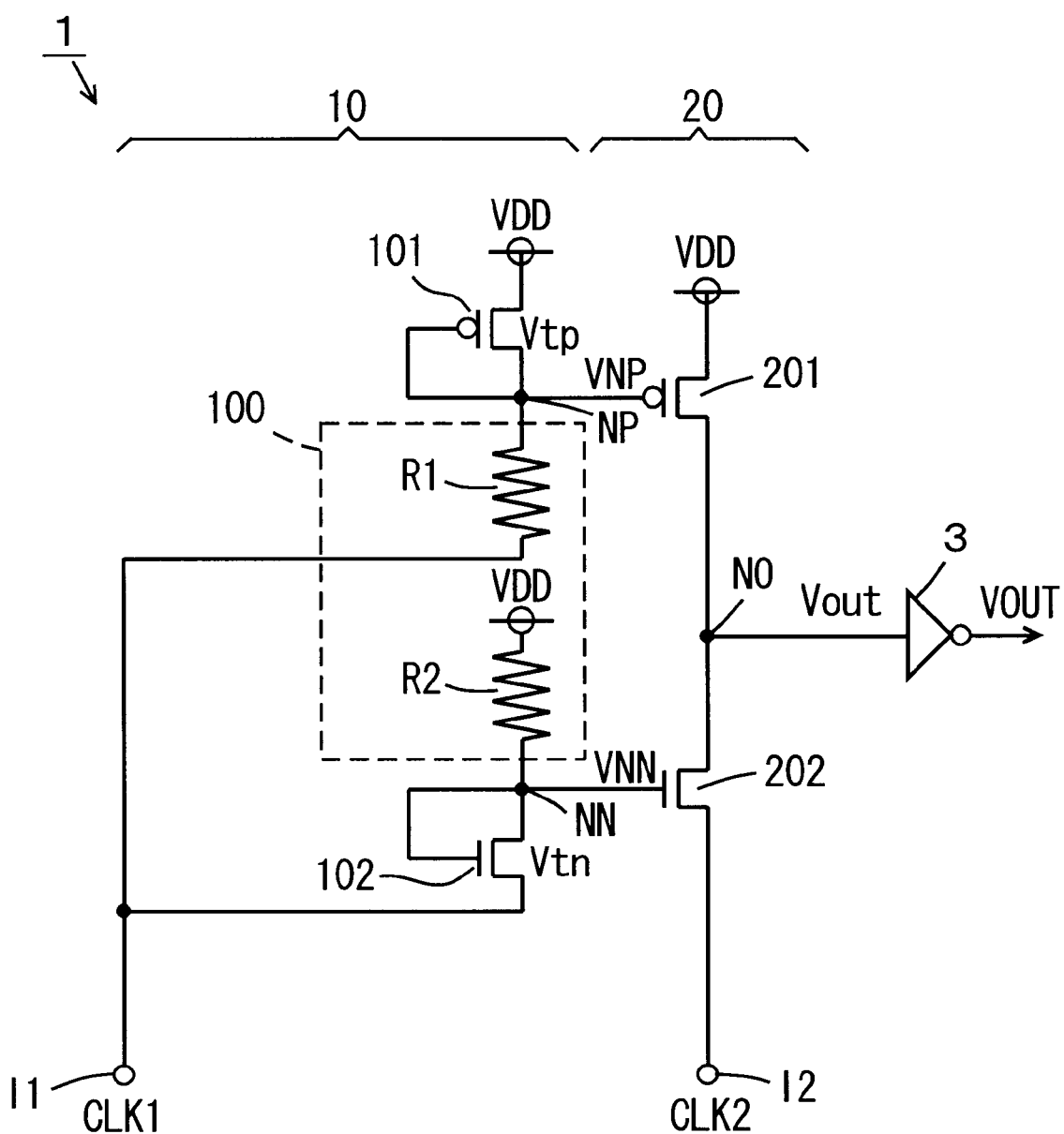
FIG. 11 is a circuit diagram showing a sixth exemplary circuit structure of the level conversion circuit shown in FIG. 1.

FIG. 11 is a circuit diagram showing a sixth exemplary circuit structure of the level conversion circuit 1 shown in FIG. 1.

The level conversion circuit 1 shown in FIG. 11 is different from the level conversion circuit 1 shown in FIG. 6 in a point that the control circuit 100 is formed by resistive elements R1 and R2. The resistive element R1 has an end connected to the first node NP and another end connected to the input node I1. The resistive element R2 has an end connected to a power supply terminal and another end connected to the second node NN. In this case, the potential VNP of the first node NP is controlled to a high or low level and the potential VNN of the second node NN is controlled to a high or low level in response to the level of the input signal CLK1.

The structures of the remaining parts and operation of the level conversion circuit 1 shown in FIG. 11 are similar to those of the level conversion circuit 1 shown in FIG. 6.

Figure 12:
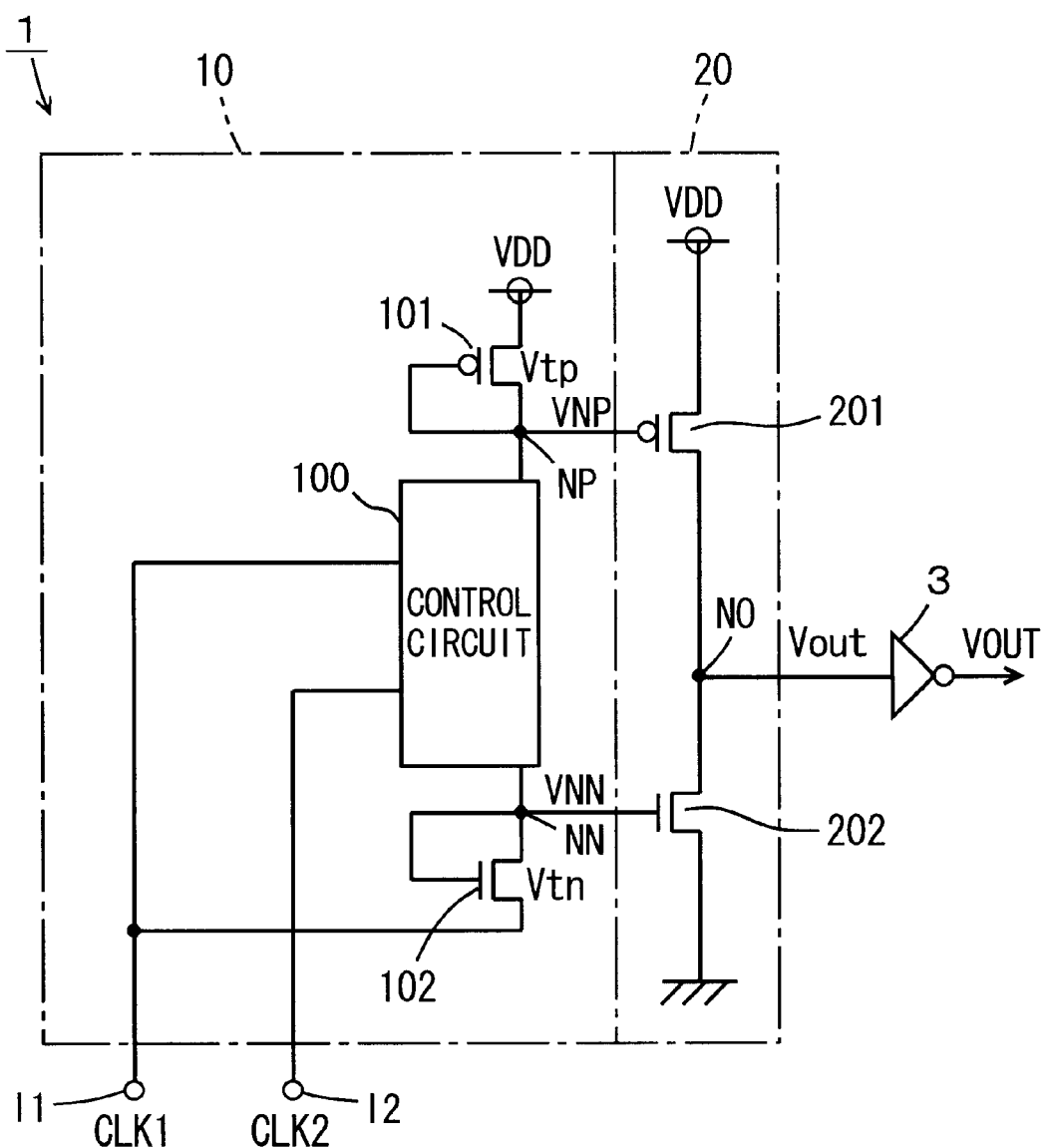
FIG. 12 is a circuit diagram showing the structure of a level conversion circuit according to a second embodiment of the present invention.

FIG. 12 is a circuit diagram showing the structure of a level conversion circuit 1 according to a second embodiment of the present invention.

The level conversion circuit 1 shown in FIG. 12 is different from the level conversion circuit 1 shown in FIG. 1 in a point that the source of an n-channel MOSFET 202 of a driver part 20 is connected to a ground terminal.

Also in the level conversion circuit 1 according to this embodiment, the potential VNN of a second node NN is set to a level rising from a low level of an input signal CLK1 by at least the absolute value of the threshold voltage Vtn of an n-channel MOSFET 102.

When the input signal CLK1 is low, the potential VNN of the second node NN reaches a level rising from the low level by the absolute value of the threshold voltage Vtn. At this time, the source of the n-channel MOSFET 202 is at a ground potential. Thus, the n-channel MOSFET 202 is weakly turned on. When the input signal CLK1 is high, on the other hand, the potential VNN of the second node NN reaches a level rising from the high level by the absolute value of the threshold voltage Vtn. At this time, the source of the n-channel MOSFET 202 is at the ground potential. Thus, the n-channel MOSFET 202 is strongly turned on.

The structures of the remaining parts and operation of the level conversion circuit 1 according to the second embodiment are similar to those of the level conversion circuit 1 according to the first embodiment.

FIG. 13 is a circuit diagram showing the structure of a level conversion circuit 1 according to a third embodiment of the present invention.

The level conversion circuit 1 shown in FIG. 13 is different from the level conversion circuit 1 shown in FIG. 1 in a point that the source of an n-channel MOSFET 202 of a driver part 20 is connected to a power supply terminal receiving a negative potential Vee.

Also in the level conversion circuit 1 according to this embodiment, the potential VNN of a second node NN is set to a level rising from a low level of an input signal CLK1 by at least the absolute value of the threshold voltage Vtn of an n-channel MOSFET 102.

When the input signal CLK1 is low, the potential VNN of the second node NN reaches a level rising from the low level by the absolute value of the threshold voltage Vtn. At this time, the source of the n-channel MOSFET 202 is at the negative potential Vee. Thus, the n-channel MOSFET 202 is weakly turned on. When the input signal CLK1 is high, on the other hand, the potential VNN of the second node NN reaches a level rising from the high level by the absolute value of the threshold voltage Vtn. At this time, the source of the n-channel MOSFET 202 is at the negative potential Vee. Thus, the n-channel MOSFET 202 is strongly turned on.

The structures of the remaining parts and operation of the level conversion circuit 1 according to the third embodiment are similar to those of the level conversion circuit 1 according to the first embodiment.

FIG. 14 is a circuit diagram showing the structure of a level conversion circuit 1 according to a fourth embodiment of the present invention.

In the level conversion circuit 1 shown in FIG. 14, a control part 10 includes a control circuit 100a and an n-channel MOSFET 102. The control circuit 100a is connected to input nodes I1 and I2, a first node NP and a second node NN. The input nodes I1 and I2 are supplied with input signals CLK1 and CLK2 respectively, similarly to the level conversion circuit 1 according to the first embodiment.

The n-channel MOSFET 102 has a source connected to the input node I1, and a drain and a gate connected to the second node NN. The structures of the remaining parts of the level conversion circuit 1 shown in FIG. 14 are similar to those of the level conversion circuit 1 shown in FIG. 1.

The control circuit 100a controls the potential VNP of the first node NP and the potential VNN of the second node NN in response to the input signals CLK1 and CLK2. The control circuit 100a sets the potential VNP of the first node NP to a level between a supply potential VDD and the level of the input signal CLK1. The potential VNN of the second node NN is set to a level rising from a low level of the input signal CLK1 by at least the absolute value of the threshold voltage Vtn of the n-channel MOSFET 102.

Thus, one of a p-channel MOSFET 201 and an n-channel MOSFET 202 of a driver part 20 is strongly turned on while the other one is weakly turned on. Thus, neither of the p-channel MOSFET 201 and the n-channel MOSFET 202 of the driver part 20 is completely turned off.

The structures of the remaining parts and operation of the level conversion circuit 1 according to the fourth embodiment are similar to those of the level conversion circuit 1 according to the first embodiment.

Figure 15:
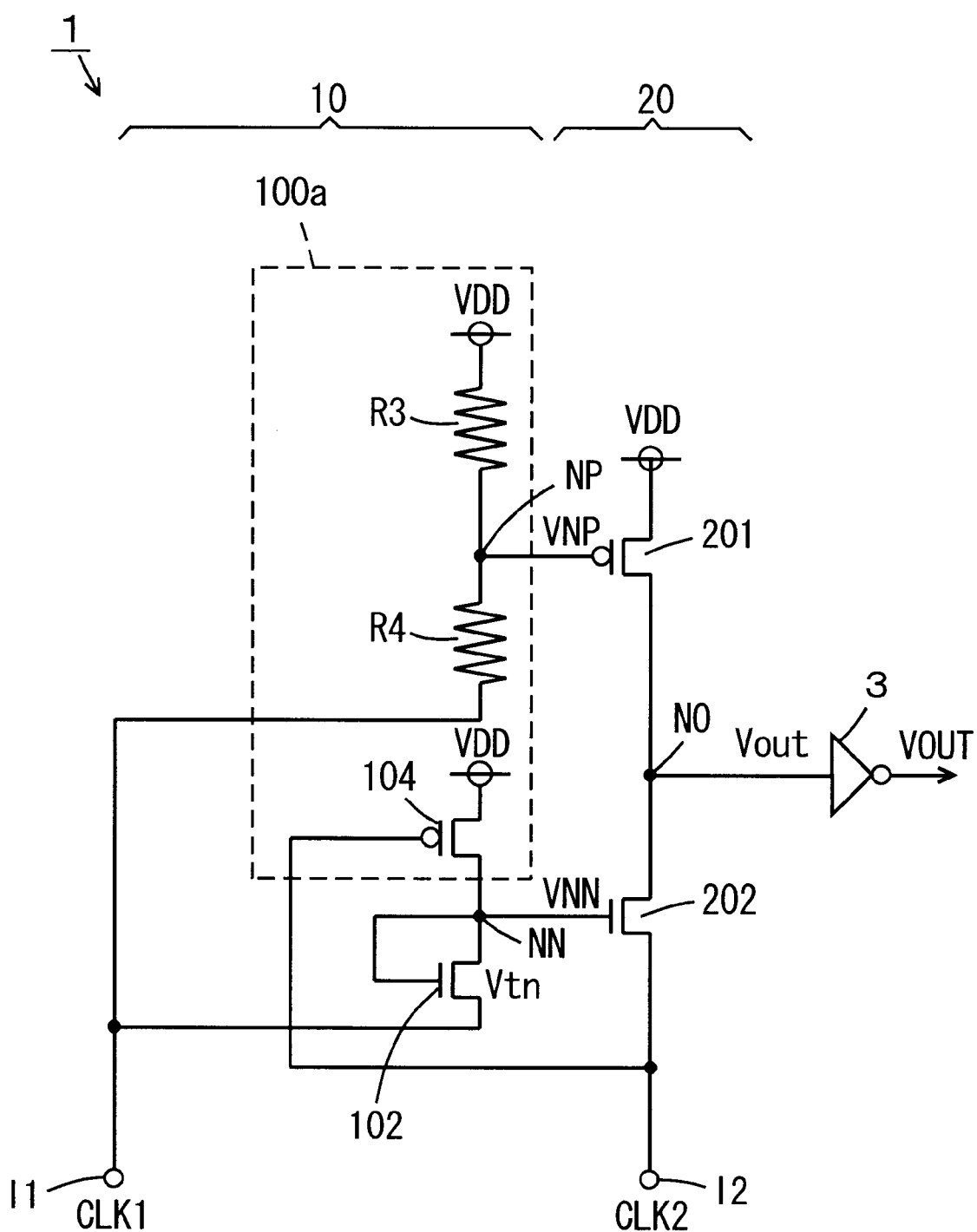
FIG. 15 is a circuit diagram showing a first exemplary circuit structure of the level conversion circuit shown in FIG. 14.

FIG. 15 is a circuit diagram showing a first exemplary circuit structure of the level conversion circuit 1 shown in FIG. 14.

As shown in FIG. 15, the control circuit 100a includes resistive elements R3 and R4 and a p-channel MOSFET 104. The resistive element R3 has an end connected to a power supply terminal and another end connected to the first node NP. The resistive element R4 has an end connected to the first node NP and another end connected to the input node I1. The p-channel MOSFET 104 has a source connected to a power supply terminal, a drain connected to the second node NN and a gate connected to the input node I2.

In the example shown in FIG. 15, the resistive elements R3 and R4 set the potential VNP of the first node NP to a level between the supply potential VDD and the level of the input signal CLK1. Thus, the p-channel MOSFET 201 is regularly on. Further, the n-channel MOSFET 102 sets the potential VNN of the second node NN to a level rising from a ground potential by at least the absolute value of the threshold voltage Vtn. Thus, the n-channel MOSFET 202 is regularly on.

The potential VNP of the first node NP is controlled to a high or low level in response to the level of the input signal CLK1. The potential VNN of the second node NN is controlled to a high or low level in response to the levels of the input signals CLK1 and CLK2. Thus, one of the p-channel MOSFET 201 and the n-channel MOSFET 202 is strongly turned on and the other one is weakly turned on.

When the input signal CLK1 is high, the potential VNP of the first node NP is set to a level between the supply potential VDD and the high level of the input signal CLK1. Thus, the p-channel MOSFET 201 is weakly turned on. At this time, the n-channel MOSFET 202 is strongly turned on.

When the input signal CLK1 is low, on the other hand, the potential VNP of the first node NP is set to a level between the supply potential VDD and the low level of the input signal CLK1. Thus, the p-channel MOSFET 201 is strongly turned on. At this time, the n-channel MOSFET 202 is weakly turned on.

Figure 16:
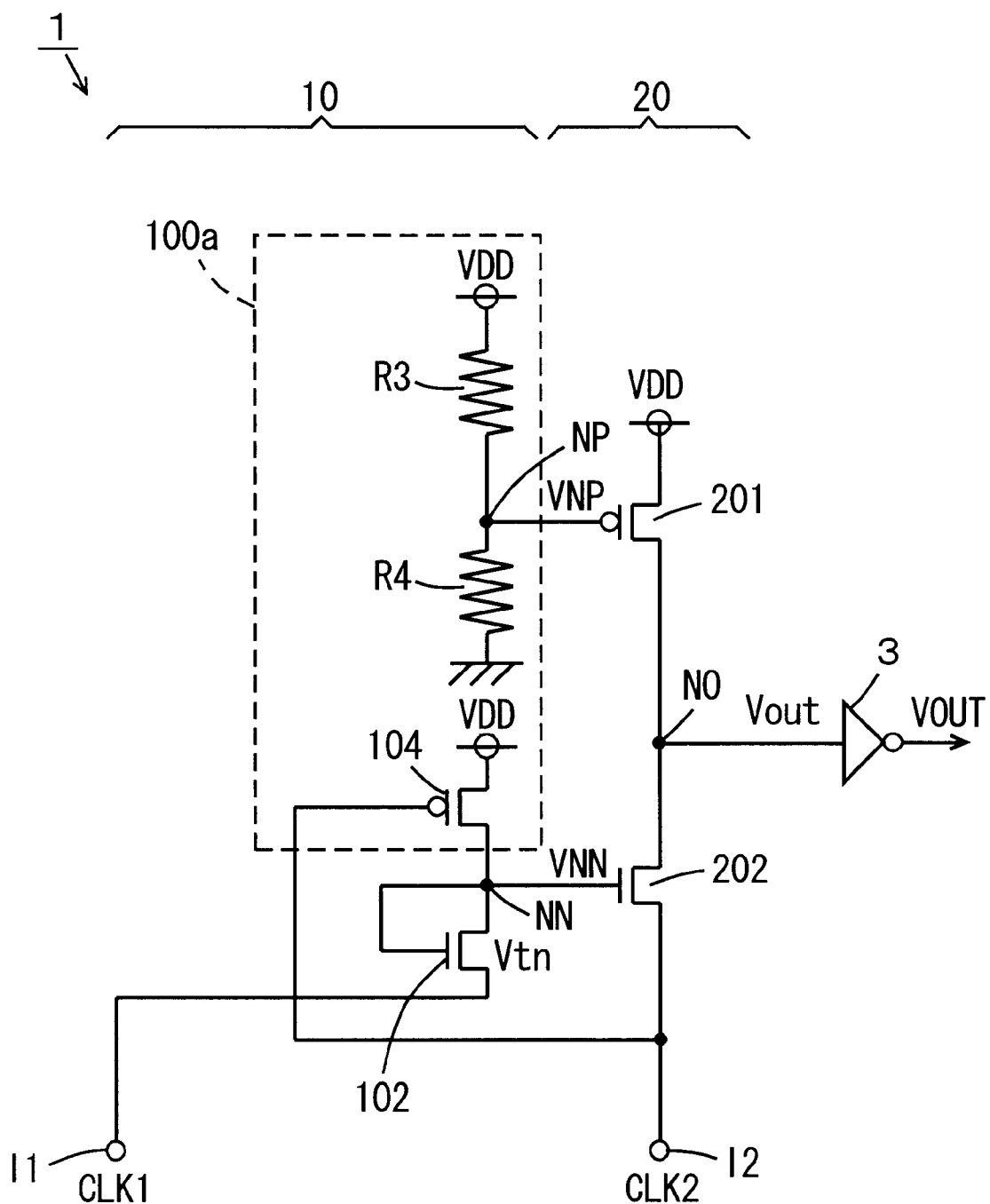
FIG. 16 is a circuit diagram showing a second exemplary circuit structure of the level conversion circuit shown in FIG. 14.

FIG. 16 is a circuit diagram showing a second exemplary circuit structure of the level conversion circuit 1 shown in FIG. 14.

The level conversion circuit 1 shown in FIG. 16 is different from the level conversion circuit 1 shown in FIG. 1 in a point that the other end of the resistive element R4 of the control circuit 100a is connected to a ground terminal.

In this case, the resistive elements R3 and R3 set the potential VNP of the first node NP to a prescribed potential between the supply potential VDD and the ground potential. Thus, the p-channel MOSFET 202 is regularly on.

The p-channel MOSFET 201 is weakly turned on when the n-channel MOSFET 202 is strongly turned on, while the former is strongly turned on when the latter is weakly turned on.

Figure 17:
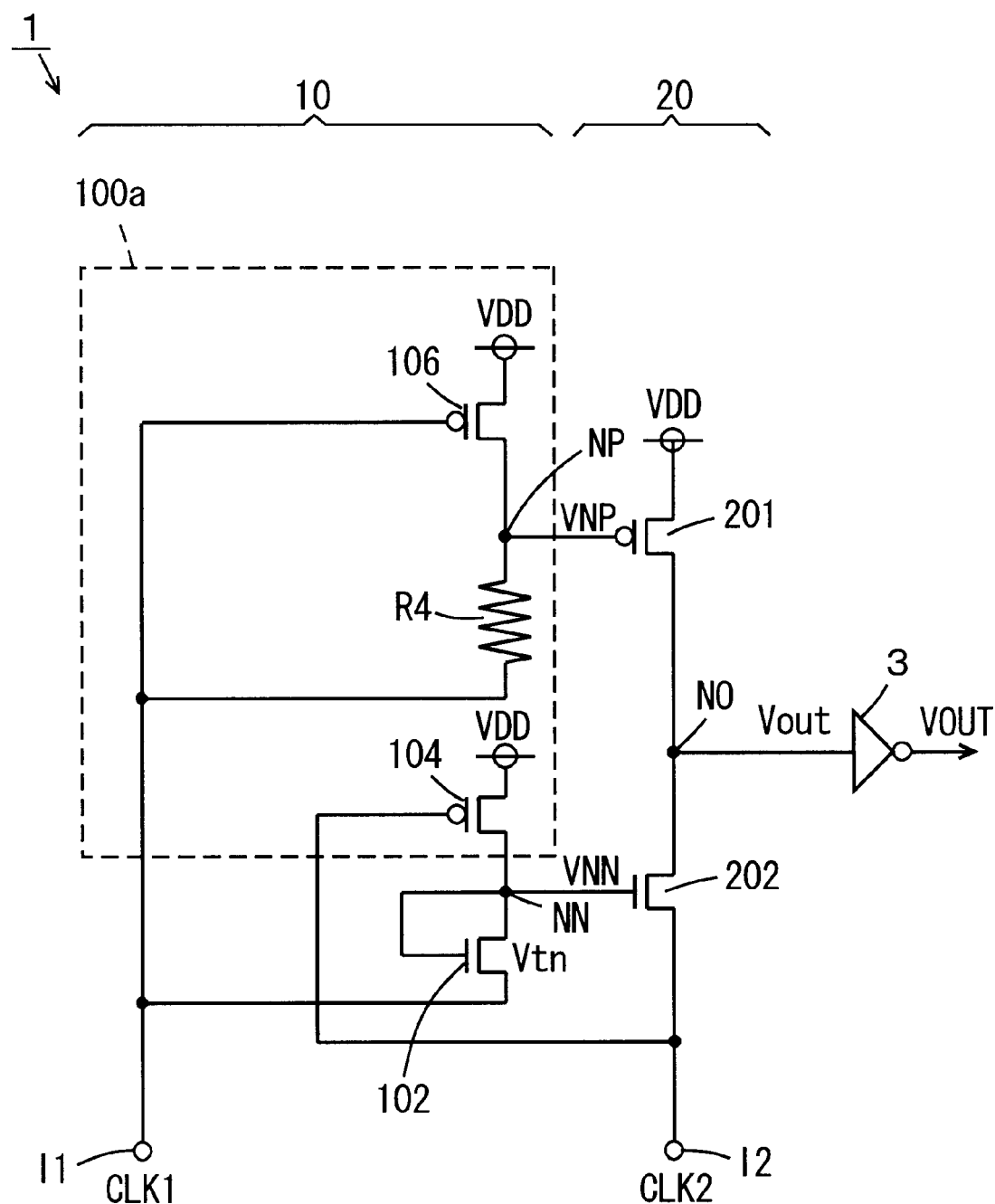
FIG. 17 is a circuit diagram showing a third exemplary circuit structure of the level conversion circuit shown in FIG. 14.

FIG. 17 is a circuit diagram showing a third exemplary circuit structure of the level conversion circuit 1 shown in FIG. 14.

The level conversion circuit 15 shown in FIG. 17 is different from the level conversion circuit 1 shown FIG. 15 in a point that a p-channel MOSFET 106 is provided in place of the resistive element R3 of the control circuit 100a. The p-channel MOSFET 106 has a source connected to a power supply terminal, a drain connected to the first node NP and a gate connected to the input node I1.

When the input signal CLK1 is high, the potential VNP of the first node NP goes high. Thus, the p-channel MOSFET 201 is weakly turned on. When the input signal CLK1 is low, on the other hand, the potential VNP of the first node NP goes low. Thus, the p-channel MOSFET 201 is strongly turned on.

While the level conversion circuit 1 according to each of the first to fourth embodiments operates in response to the mutually complementarily changing input signals CLK1 and CLK2, a level conversion circuit 1 according to a fifth embodiment shown below operates in response to a single input signal CLK.

Figure 18:
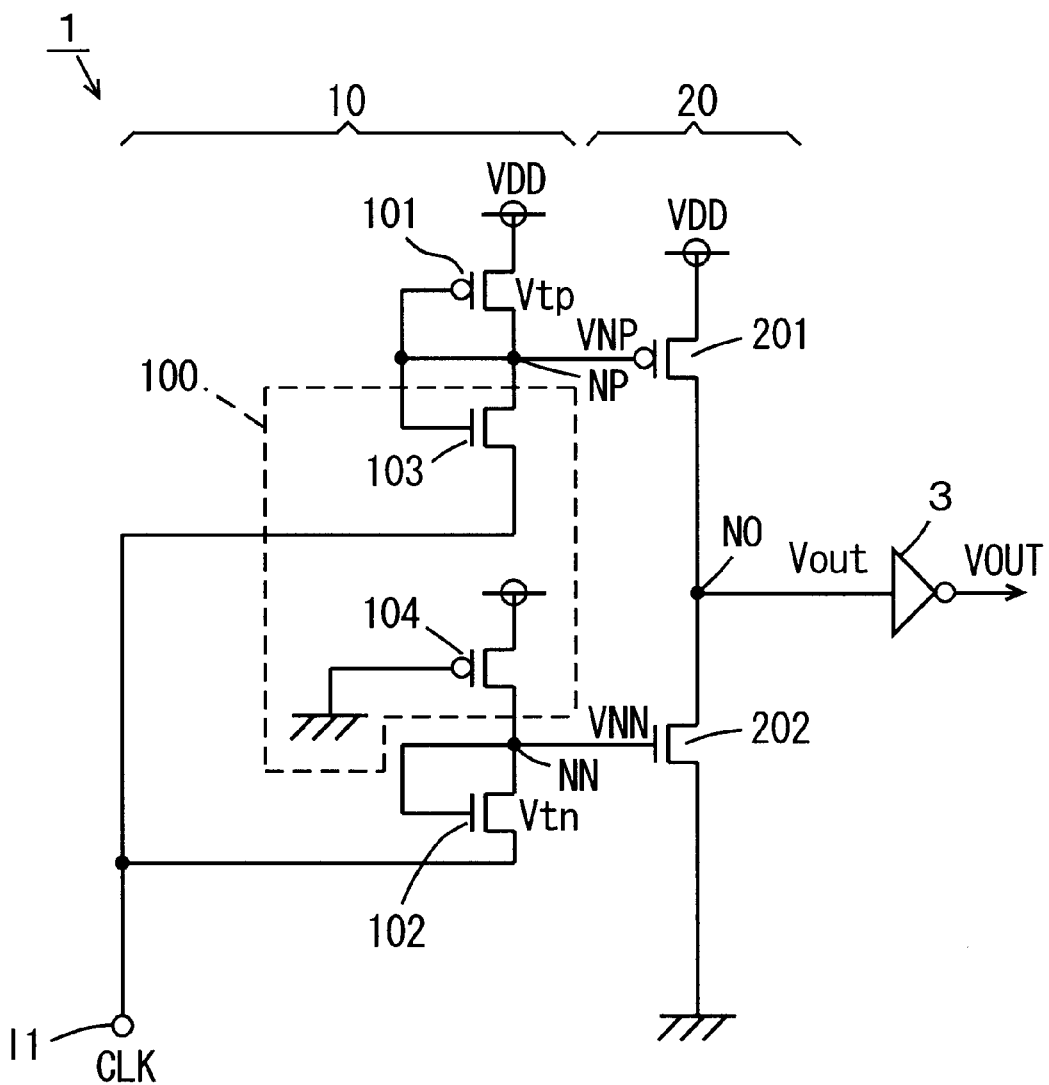
FIG. 18 is a circuit diagram showing the structure of a level conversion circuit according to a fifth embodiment of the present invention.

FIG. 18 is a circuit diagram showing the structure of the level conversion circuit 1 according to the fifth embodiment of the present invention.

Referring to FIG. 18, an n-channel MOSFET 103 of a control circuit 100 has a source connected to an input node I1 receiving the single input signal CLK, and a drain and a gate connected to a first node NP. A p-channel MOSFET 104 has a source connected to a power supply terminal, a drain connected to a second node NN and a gate connected to a ground terminal. An n-channel MOSFET 202 of a driver part 20 has a source connected to a ground terminal.

The structures of the remaining parts of the level conversion circuit 1 shown in FIG. 18 are similar to those of the level conversion circuit 1 shown in FIG. 6.

Figure 19:
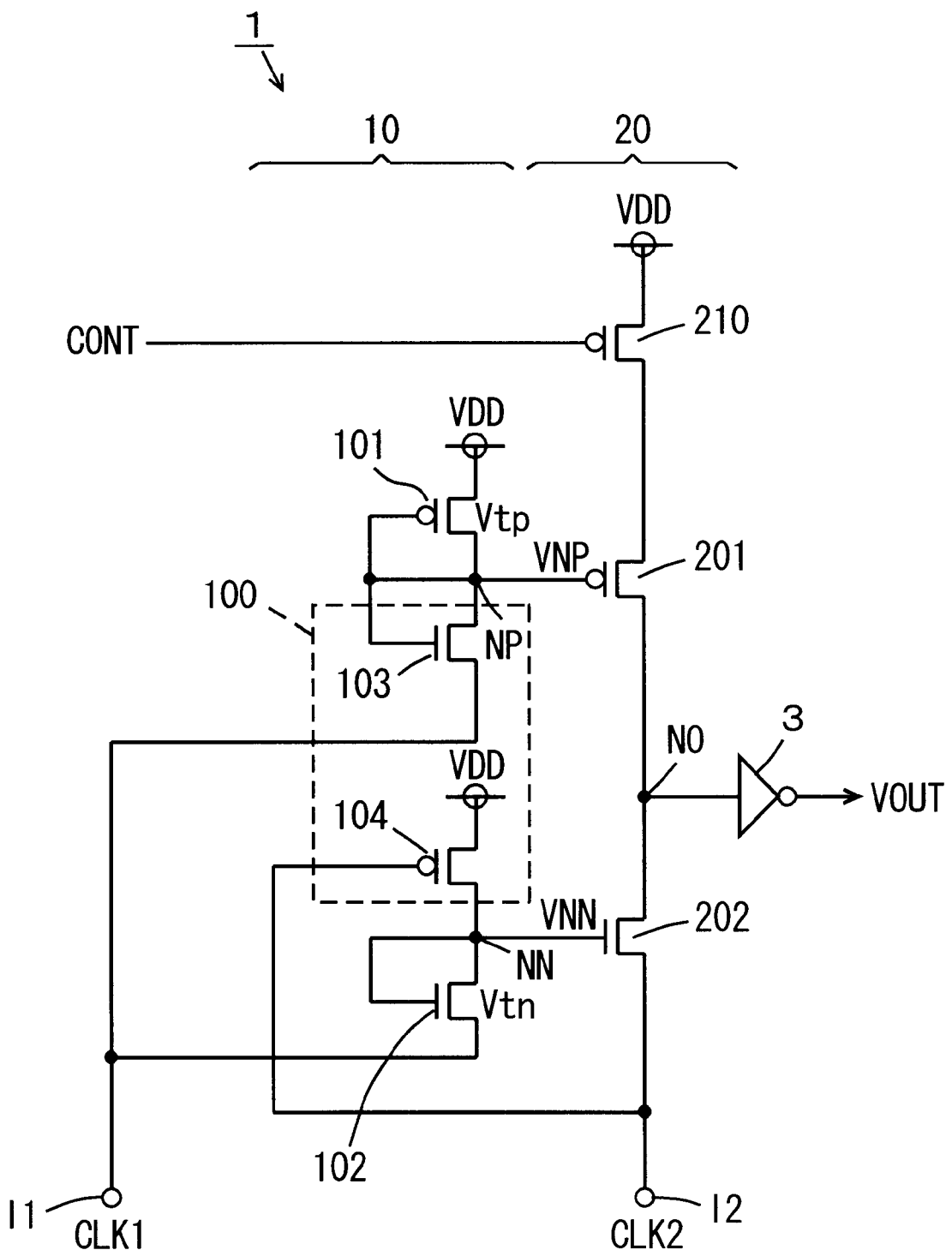
FIG. 19 is a circuit diagram showing the structure of a level conversion circuit according to a sixth embodiment of the present invention.

FIG. 19 is a circuit diagram showing the structure of a level conversion circuit 1 according to a sixth embodiment of the present invention.

In the level conversion circuit 1 shown in FIG. 19, a control part 10 is similar in structure to the control part 10 of the level conversion circuit 1 shown in FIG. 6. In a driver part 20, a p-channel MOSFET 210 is connected between the source of a p-channel MOSFET 201 and a power supply terminal. The gate of the p-channel MOSFET 210 is supplied with a control signal CONT. The structures of the remaining parts of the level conversion circuit 1 shown in FIG. 19 are similar to those of the level conversion circuit 1 shown in FIG. 6.

Figure 20:
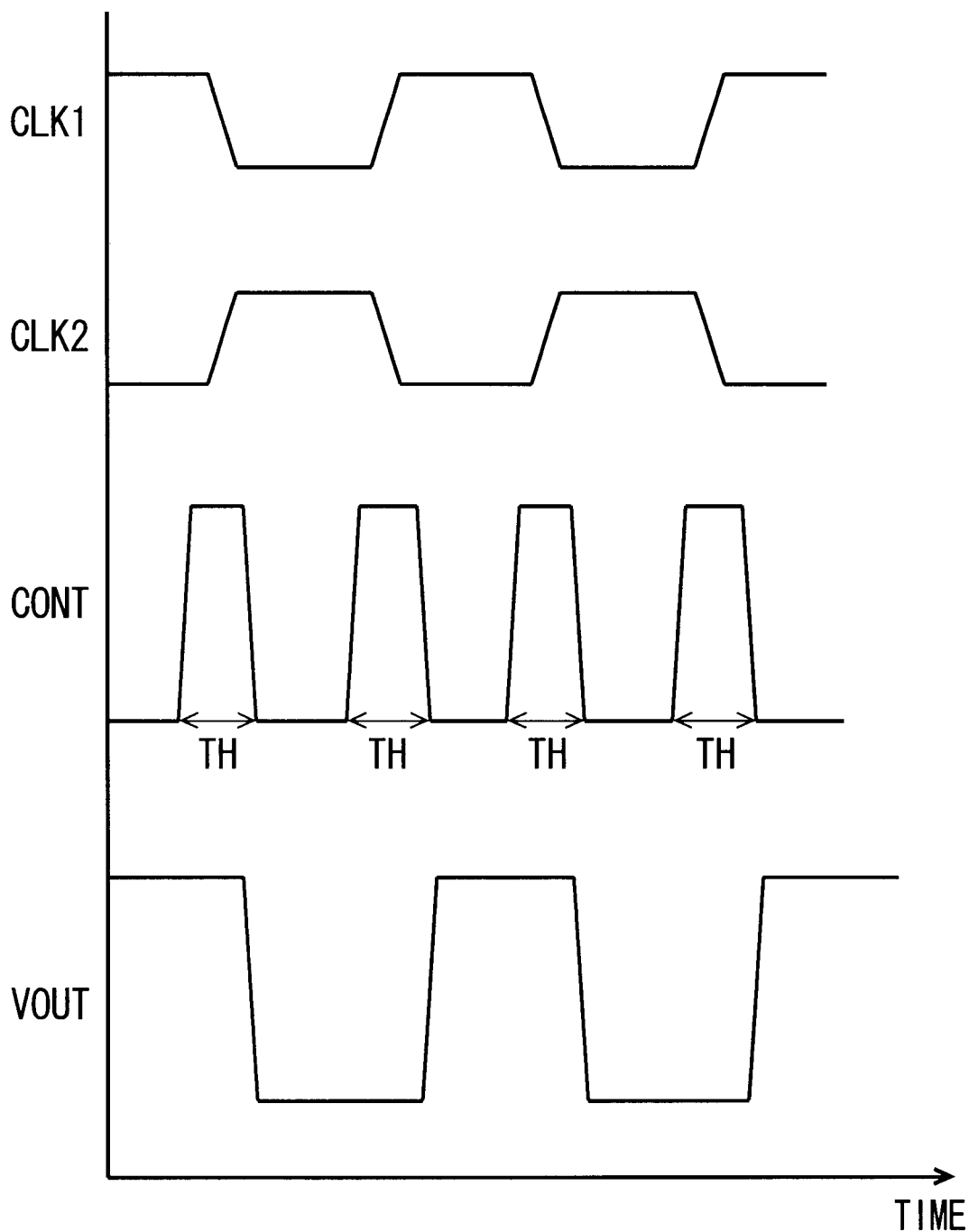
FIG. 20 is a voltage waveform diagram showing exemplary operation of the level conversion circuit shown in FIG. 19.

FIG. 20 is a waveform diagram showing exemplary operation of the level conversion circuit 1 shown in FIG. 19.

As shown in FIG. 20, input signals CLK1 and CLK2 mutually complementarily change to high and low levels. An output potential VOUT changes with a voltage amplitude larger than those of the input signals CLK1 and CLK2.

The control signal CONT goes high in periods when the input signals CLK1 and CLK2 make transitions between the high and low levels, and goes low in the remaining periods.

The periods when the control signal CONT goes high are referred to as through current blocking periods TH. The p-channel MOSFET 210 is turned off in the through current blocking periods TH. Thus, a through current flowing from the power supply terminal through the p-channel MOSFET 201 and the n-channel MOSFET 202 is blocked. Therefore, power consumption can be reduced.

The characteristics of the inventive level conversion circuit were simulated. FIG. 21 illustrates the circuit structure of a level conversion circuit 1 employed for these simulations. The structure of the level conversion circuit 1 shown in FIG. 21 is similar to that of the level conversion circuit 1 shown in FIG. 6. First, the high-speed property of operation of the level conversion circuit 1 shown in FIG. 21 was examined.

In general, transistors of bulk silicon have threshold voltages Vtp and Vtn of (−0.9±0.1) V, for example, and (0.7±0.1) V, for example, respectively. On the other hand, thin-film transistors employing polycrystalline silicon have threshold voltages Vtp and Vtn of (−2.5±1 to 1.5) V, for example, and (1.8±1 to 1.5) V, for example, respectively. Thus, the variations of the threshold voltages of thin-film transistors employing polycrystalline silicon are large in fabrication steps as compared with those of transistors of bulk silicon.

Figure 22A:
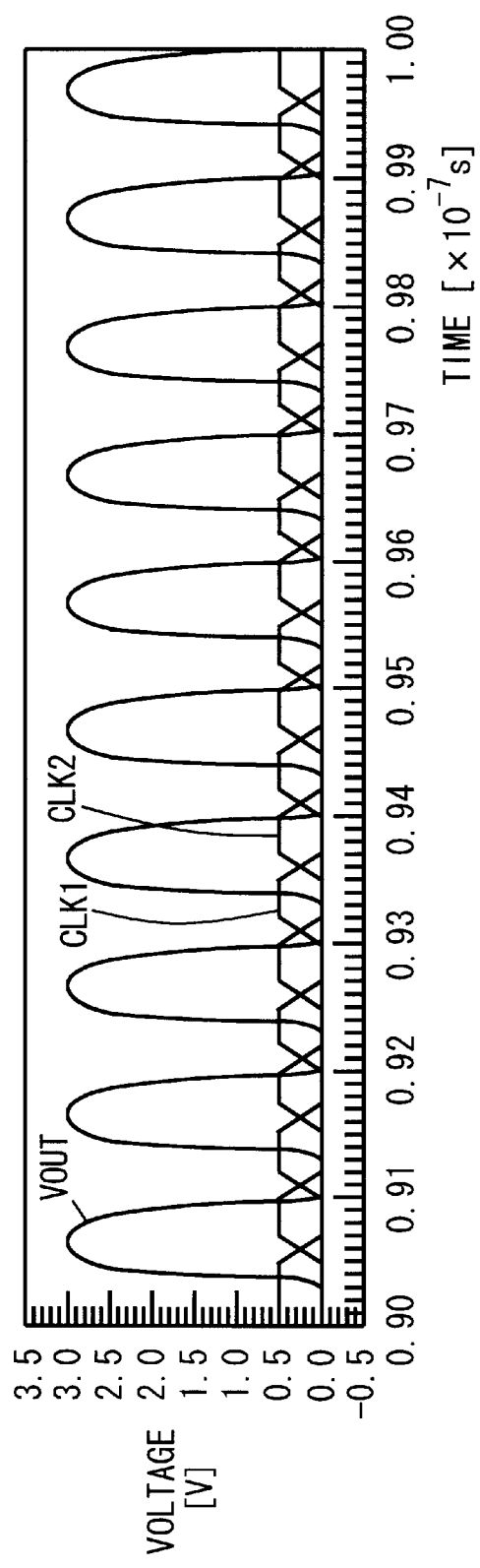
FIGS. 22a and 22b are voltage waveform diagrams showing the results of a simulation with transistors made of bulk silicon.
Figure 22B:
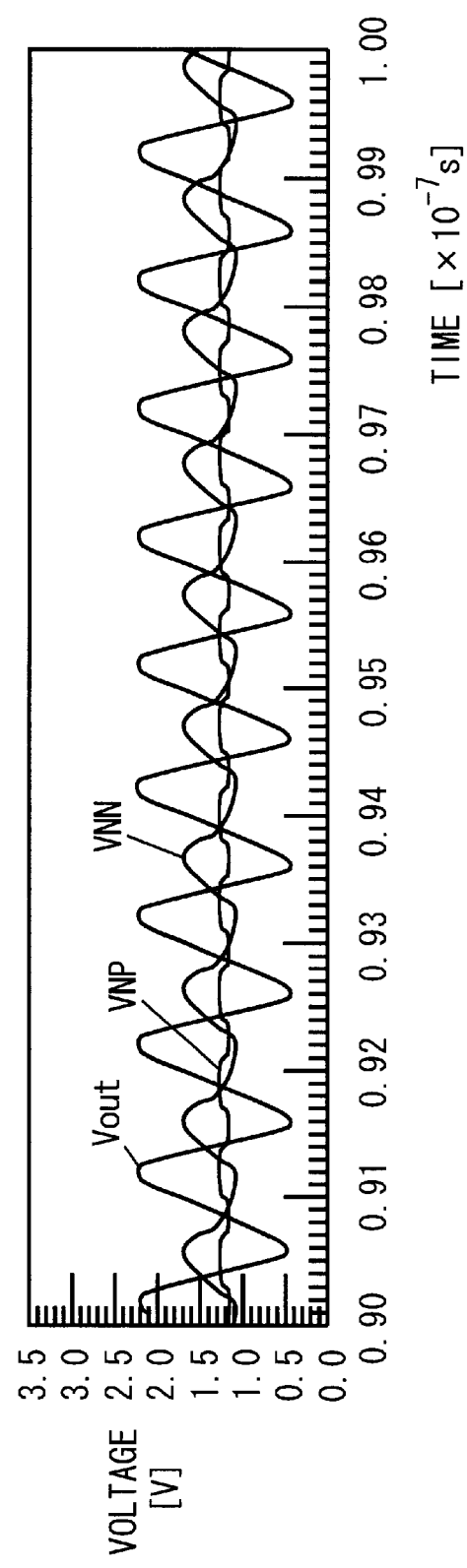

FIGS. 22a and 22b illustrate the results of a simulation on the level conversion circuit 1 formed by transistors of bulk silicon.

The frequency of the input signals CLK1 and CLK2 was set to 1 GHz, the input voltage amplitude (the width of deflection of the input signals CLK1 and CLK2) was set to 0.5 V, and the output voltage amplitude (the width of deflection of the output potential VOUT) was set to 3.0 V.

FIG. 22a shows the waveforms of the input signals CLK1 and CLK2 and the output potential VOUT, and FIG. 22b shows the waveforms of the potential VNP of the first node NP, the potential VNN of the second node NN and the output potential Vout of the output node NO.

From the results of the simulation shown in FIGS. 22a and 22b, it is understood that an output potential VOUT having a duty ratio of 50% is obtained in response to the input signals CLK1 and CLK2 also at the high frequency of 1 GHz. Thus, high-speed operation is enabled in the level conversion circuit 1 formed by transistors of bulk silicon.

Figure 23A:
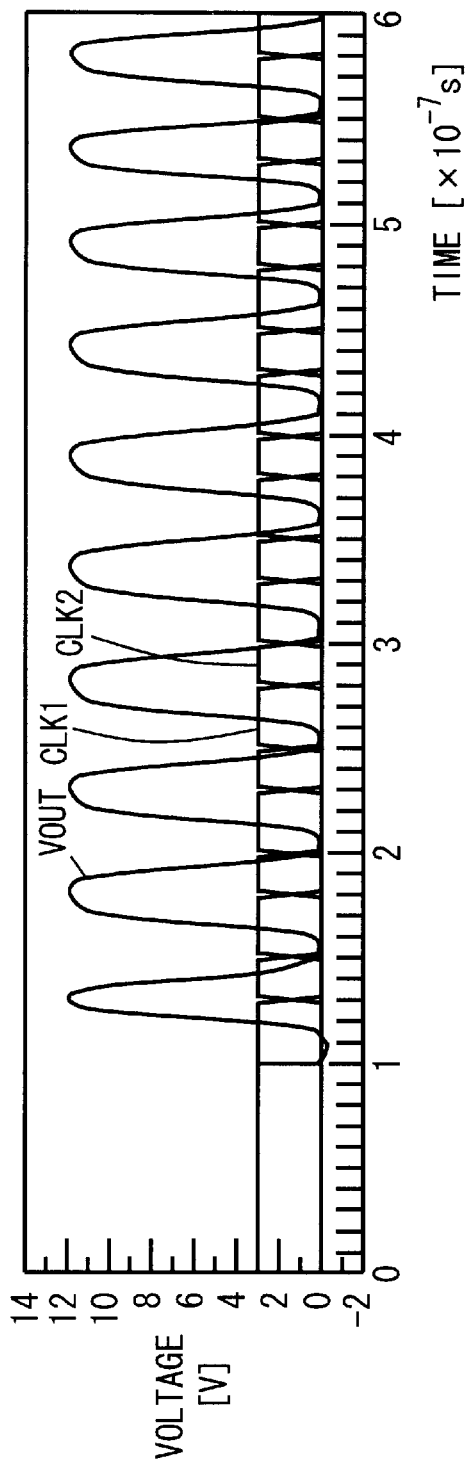
FIGS. 23a and 23b are voltage waveform diagrams showing the results of a simulation with thin-film transistors made of polycrystalline silicon.
Figure 23B:
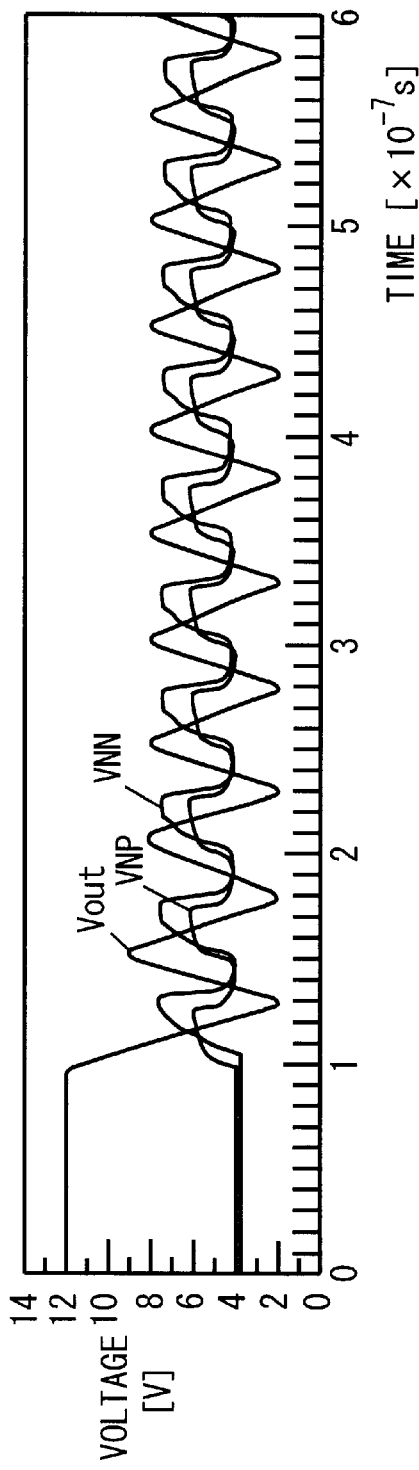

FIGS. 23a and 23b illustrate the results of a simulation on the level conversion circuit 1 formed by thin-film transistors of polycrystalline silicon.

The frequency of the input signals CLK1 and CLK2 was set to 20 MHz, the input voltage amplitude was set to 3.0 V, and the output voltage amplitude was set to 12 V.

FIG. 23a shows the waveforms of the input signals CLK1 and CLK2 and the output potential VOUT, and FIG. 23b shows the waveforms of the potential VNP of the first node NP, the potential VNN of the second node NN and the output potential Vout of the output node NO.

From the results of the simulation shown in FIGS. 23a and 23b, it is understood that an output potential VOUT having a duty ratio of 50% is obtained in response to the input signals CLK1 and CLK2 also at the high frequency of 20 MHz. Thus, high-speed operation is enabled also in the level conversion circuit 1 formed by thin-film transistors of polycrystalline silicon.

Then, voltage waveforms were simulated with reference to varied threshold voltages of p-channel and n-channel MOSFETs of the level conversion circuit 1. In these simulations, the p-channel and n-channel MOSFETs of the level conversion circuit 1 were formed by thin-film transistors of polycrystalline silicon. The frequency of the input signals CLK1 and CLK2 was set to 2 MHz.

Figure 24A:
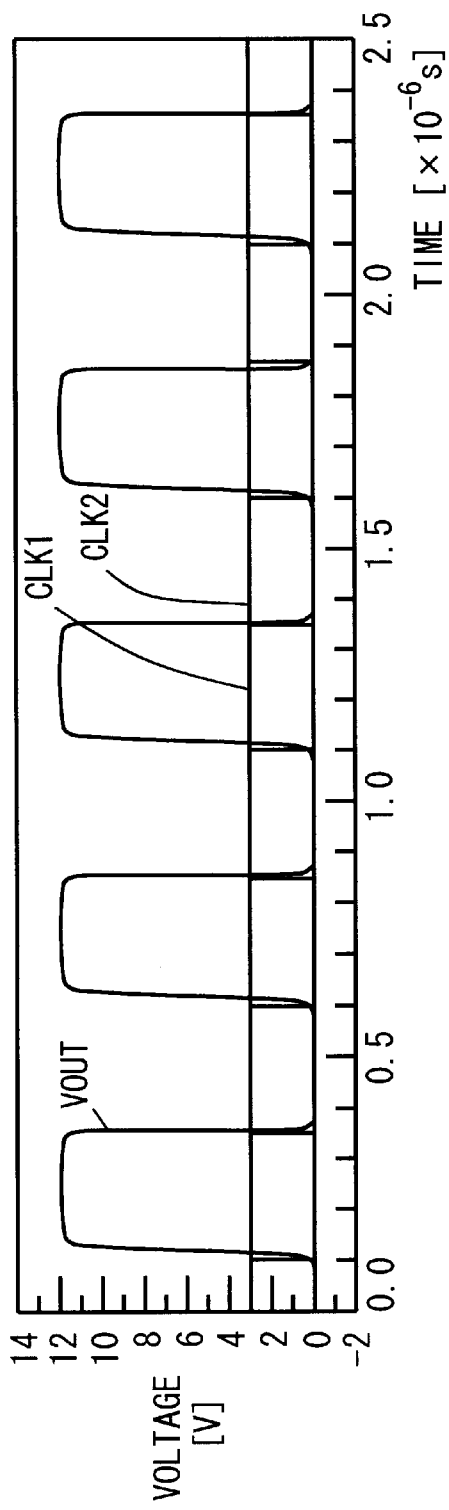
FIGS. 24a and 24b are waveform diagrams showing the results of a simulation with p-channel and n-channel MOSFETs having threshold voltages smaller than set values.
Figure 24B:
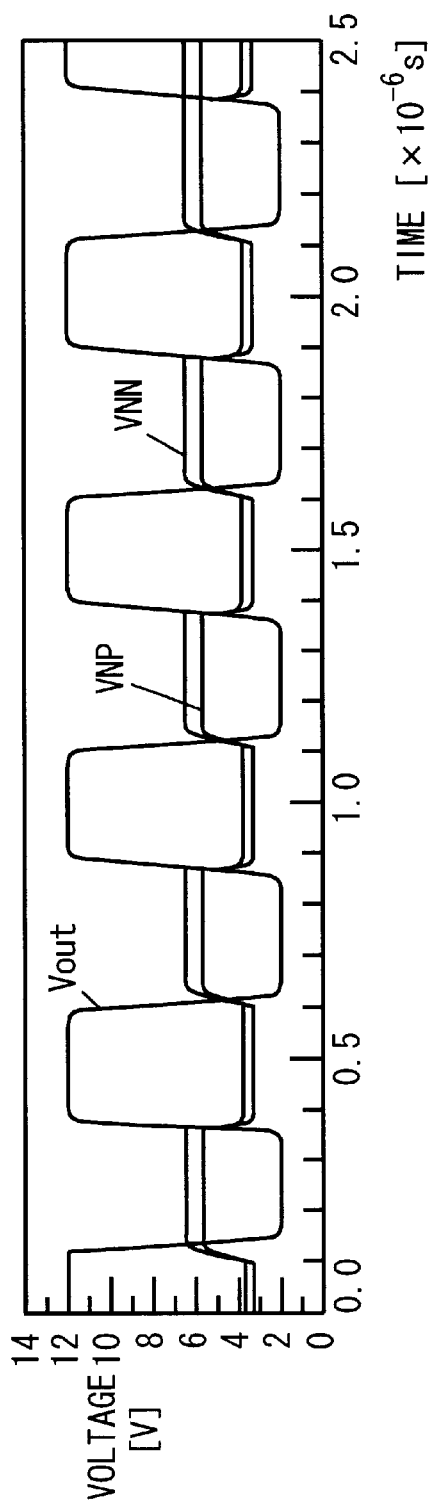

Referring to FIGS. 24a and 24b, the p-channel and n-channel MOSFETs have threshold voltages smaller than set values. In the simulation shown in FIGS. 24a and 24b, the threshold parameters (threshold voltages) of the p-channel and n-channel MOSFETs were set to −2.0 V and 1.3 V respectively.

Figure 25A:
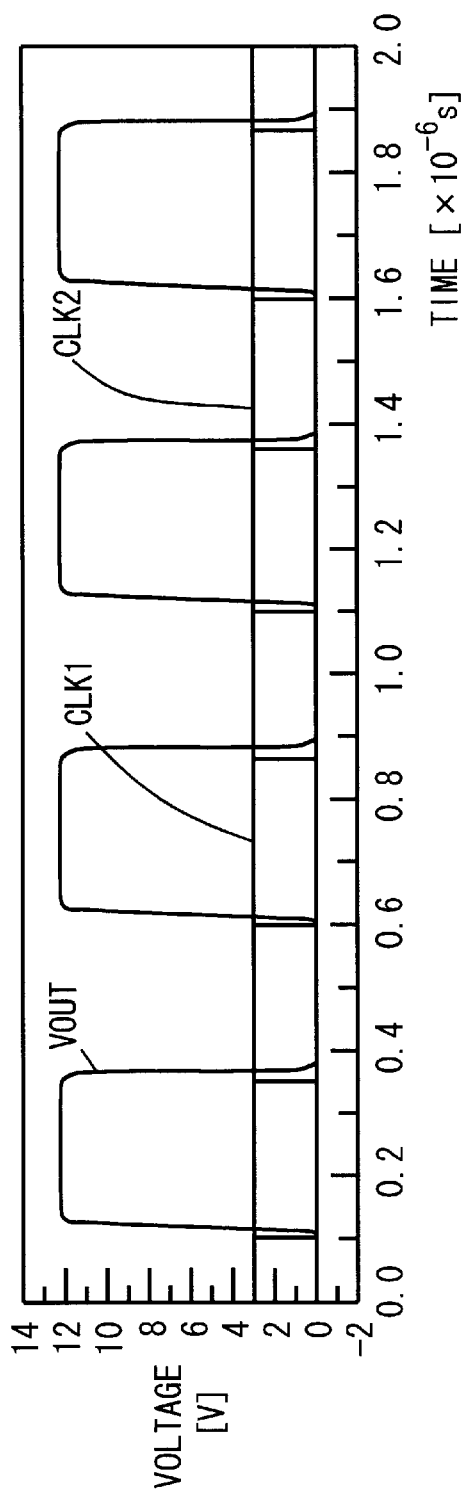
FIGS. 25a and 25b are waveform diagrams showing the results of a simulation with p-channel and n-channel MOSFETs having threshold voltages at set values.
Figure 25B:
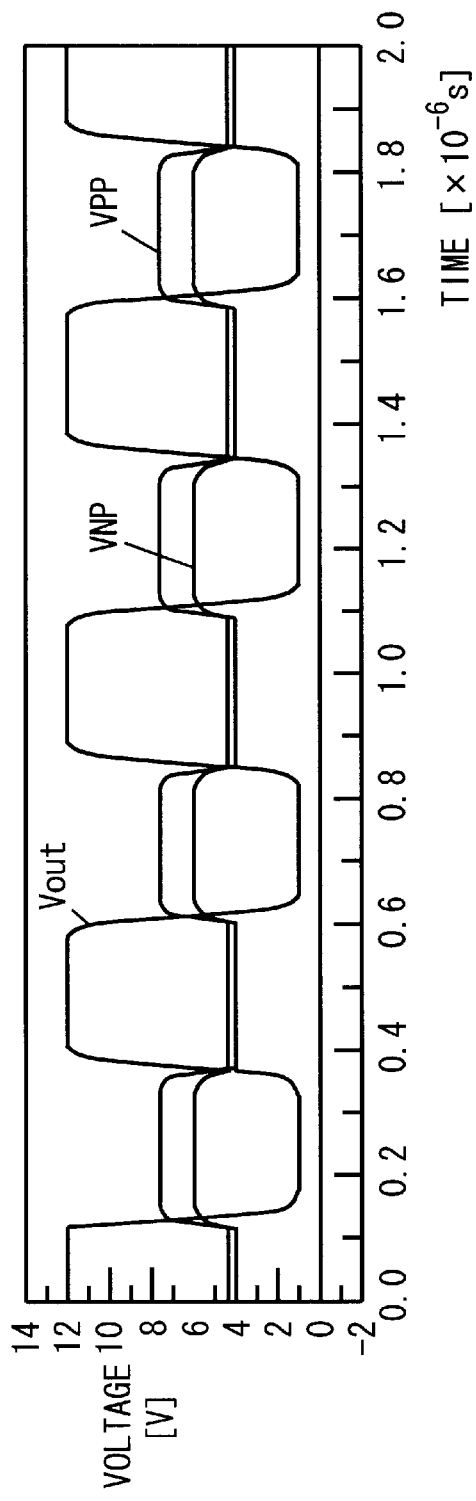

Referring to FIGS. 25a and 25b, the p-channel and n-channel MOSFETs have threshold voltages at set values. In the simulation shown in FIGS. 25a and 25b, the threshold parameters of the p-channel and n-channel MOSFETs were set to −3.5 V and 2.8 V respectively.

Figure 26A:
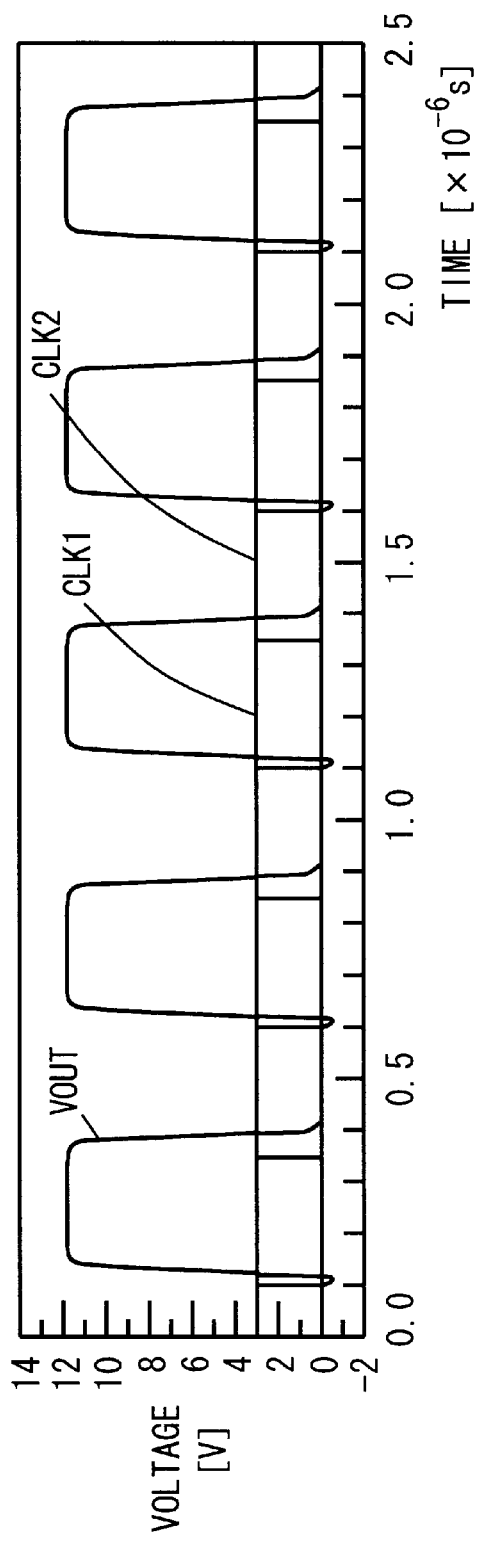
FIGS. 26a and 26b are waveform diagrams showing the results of a simulation with p-channel and n-channel MOSFETs having threshold voltages larger than set values.
Figure 26B:
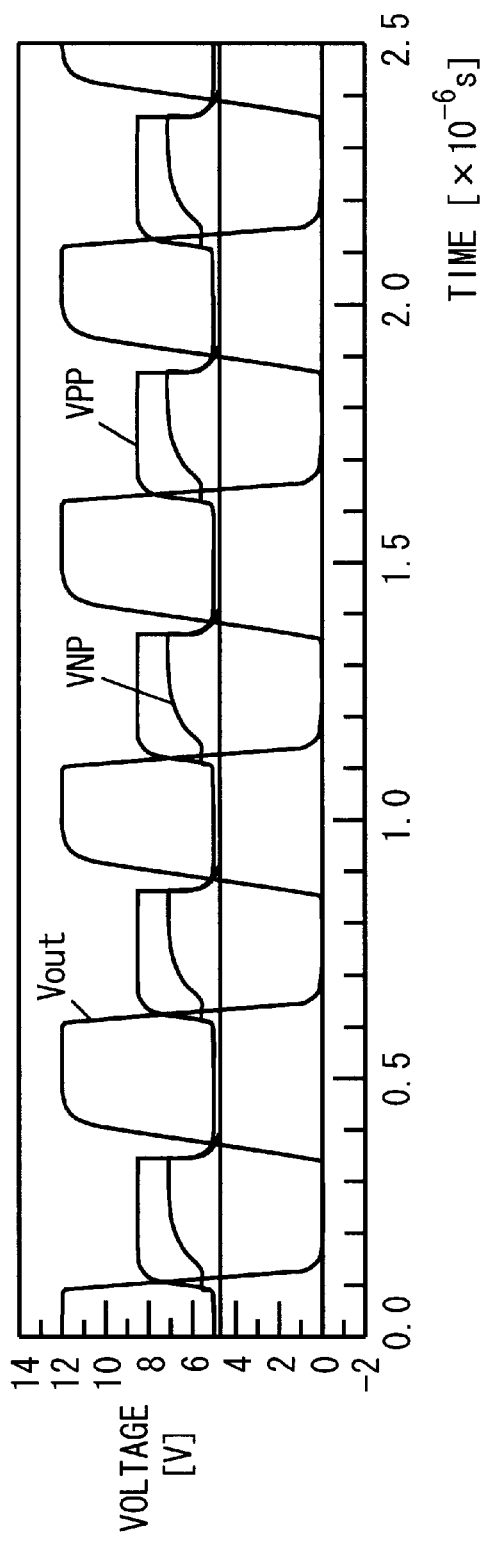

Referring to FIGS. 26a and 26b, the p-channel and n-channel MOSFETs have threshold voltages larger than set values. In the simulation shown in FIGS. 26a and 26b, the threshold parameters of the p-channel and n-channel MOSFETs were set to −5.0 V and 4.3 V respectively.

From the results shown in FIGS. 24a, 24b, 25a, 25b, 26a and 26b, it is understood that output potentials VOUT having duty ratios of 50% are obtained in response to the input signals CLK1 and CLK2 also when the threshold parameters of the p-channel and n-channel MOSFETs relatively remarkably deviate from the set values.

Figure 27:
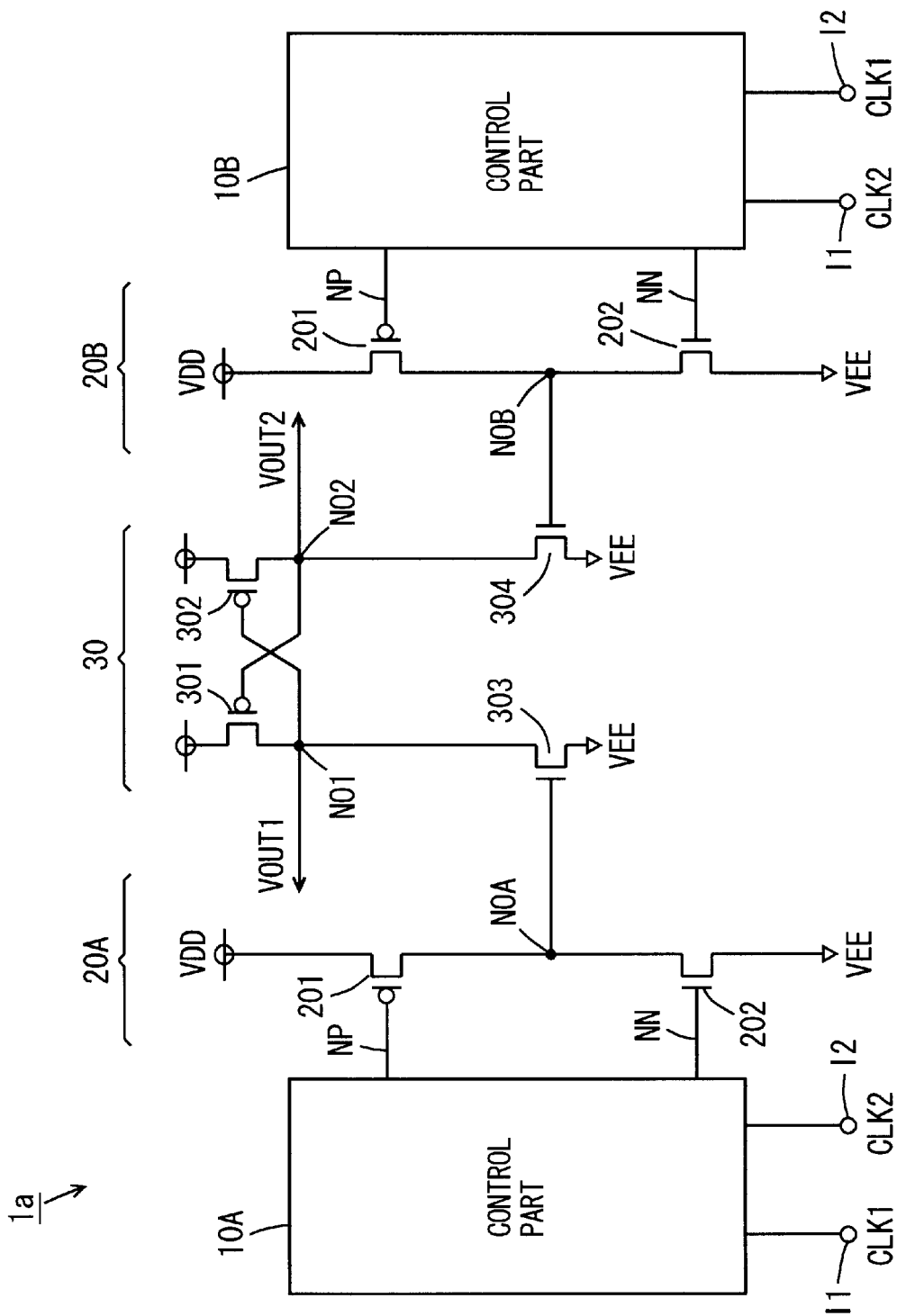
FIG. 27 is a circuit diagram showing the structure of a level conversion circuit according to a seventh embodiment of the present invention.

FIG. 27 is a circuit diagram showing the structure of a level conversion circuit 1a according to a seventh embodiment of the present invention.

The level conversion circuit 1a shown in FIG. 27 comprises two control parts 10A and 10B, two driver parts 20A and 20B and a single PMOS cross-coupled differential amplifier 30.

The control parts 10A and 10B and the driver parts 20A and 20B are similar in structure to the control part 10 and the driver part 20 in each of the first to sixth embodiments. However, input nodes I1 and I2 of the control part 10A are supplied with input signals CLK1 and CLK2 respectively, while input nodes I1 and I2 of the control part 10B are supplied with the input signals CLK2 and CLK1 respectively.

The driver parts 20A and 20B have n-channel MOSFETs 303 and 304 supplied with a prescribed potential VEE. The prescribed potential VEE is a positive potential lower than a supply potential VDD, a ground potential, a negative potential, the clock signal CLK1 or the clock signal CLK2.

The differential amplifier 30 includes p-channel MOSFETs 301 and 302 and the n-channel MOSFETs 303 and 304. The p-channel MOSFETs 301 and 302 have sources connected to power supply terminals, drains connected to output nodes NO1 and NO2 respectively and gates cross-coupled to the output nodes NO2 and NO1 respectively. The n-channel MOSFETs 303 and 304 have the sources supplied with the prescribed potential VEE, drains connected to the output nodes NO1 and NO2 respectively and gates connected to output nodes NOA and NOB of the driver parts 20A and 20B respectively.

In the level conversion circuit 1a according to this embodiment, the output nodes NO1 and NO2 of the differential amplifier 30 output mutually complementarily changing output potentials VOUT1 and VOUT2. The output potentials VOUT1 and VOUT2 change between the supply potential VDD and the ground potential.

Figure 28:
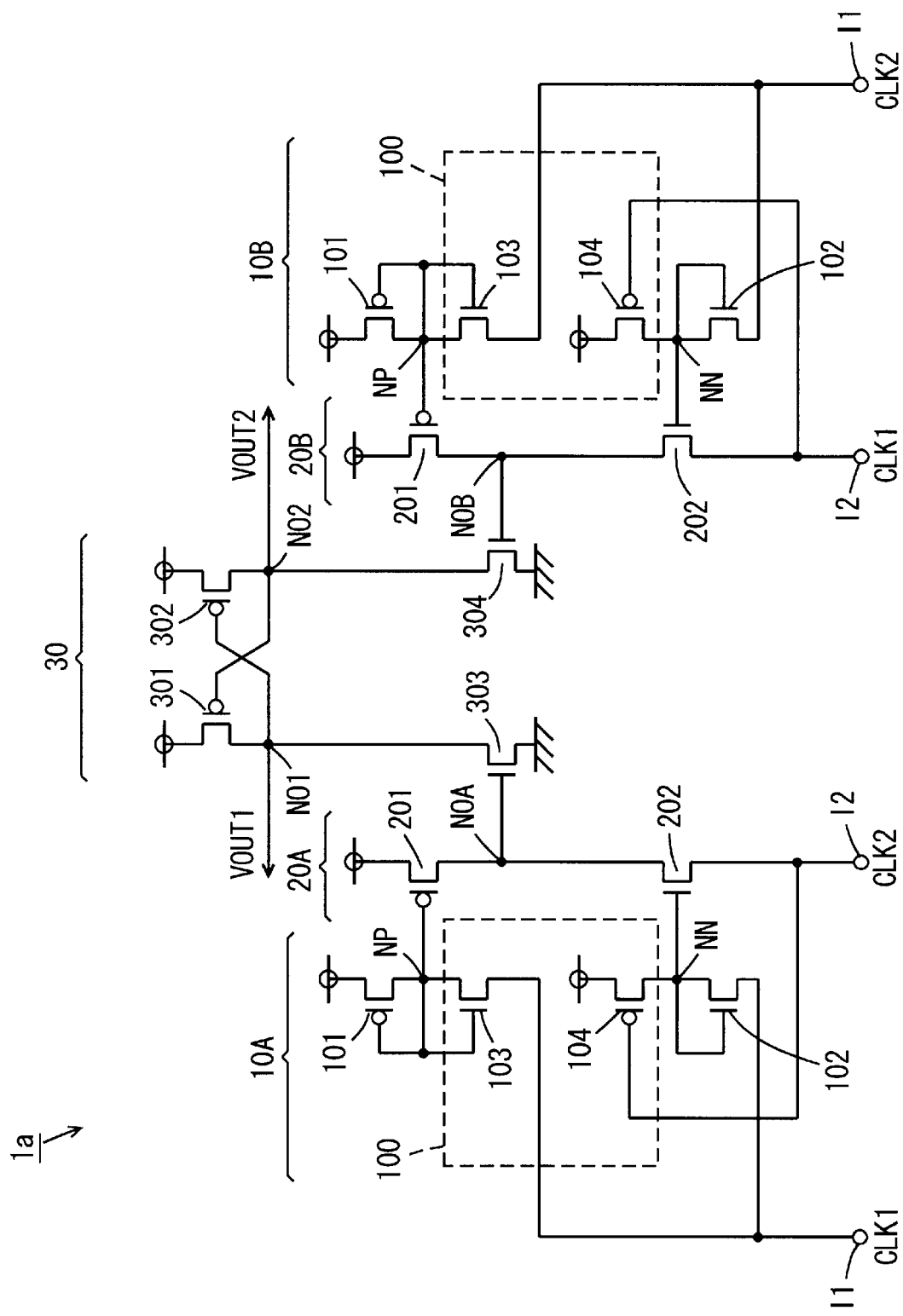
FIG. 28 is a circuit diagram showing an exemplary specific structure of the level conversion circuit shown in FIG. 27.

FIG. 28 is a circuit diagram showing an exemplary specific structure of the level conversion circuit 1a shown in FIG. 27.

Referring to FIG. 28, the control parts 10A and 10B are similar in structure to the control part 10 shown in FIG. 6. The sources of n-channel MOSFETs 202 of the driver parts 20A and 20B are connected to the input nodes I2. The sources of the n-channel MOSFETs 303 and 304 of the differential amplifier 30 are connected to ground terminals.

Figure 29:
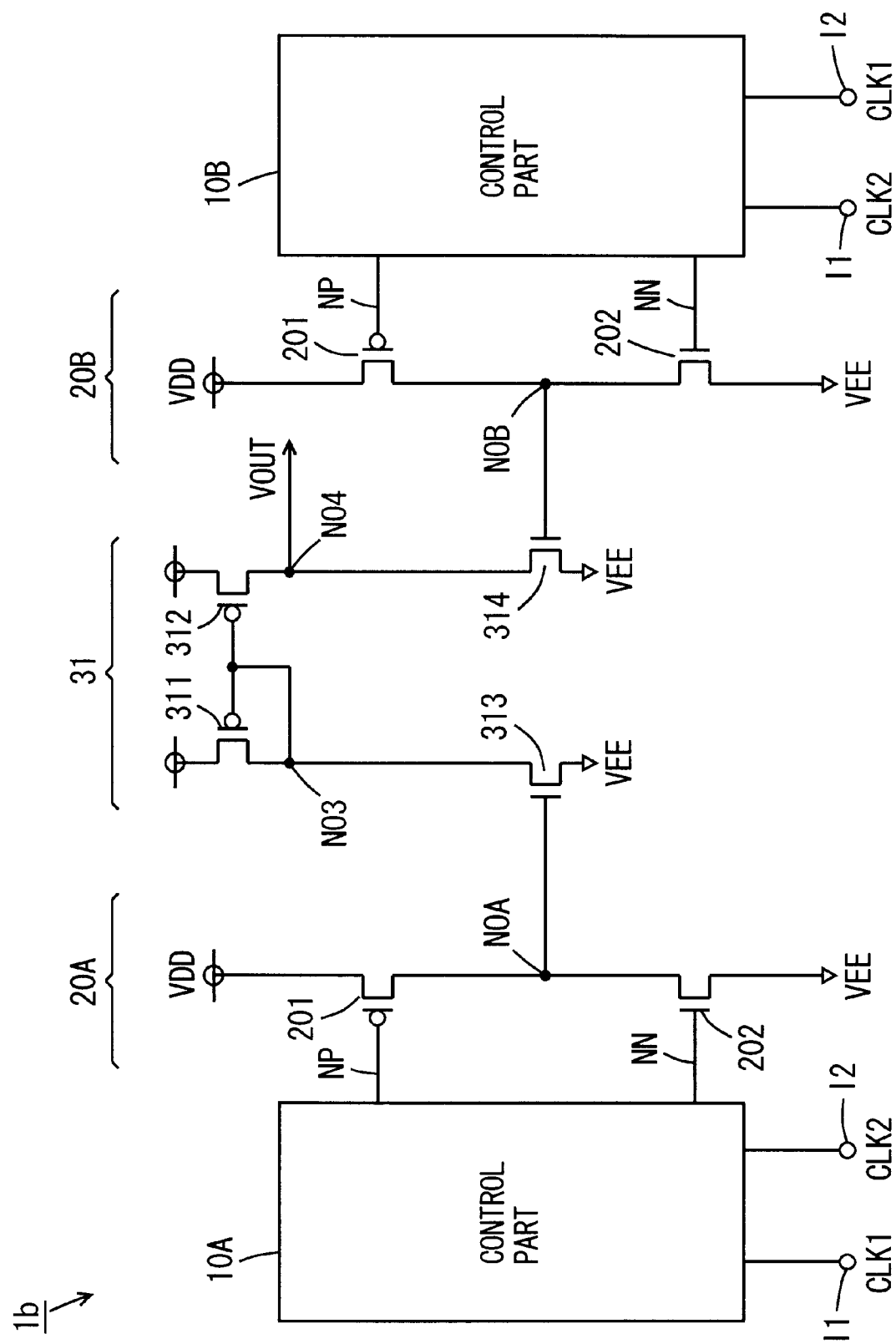
FIG. 29 is a circuit diagram showing the structure of a level conversion circuit according to an eighth embodiment of the present invention.

FIG. 29 is a circuit diagram showing the structure of a level conversion circuit 1b according to an eighth embodiment of the present invention.

The level conversion circuit 1b shown in FIG. 29 is different from the level conversion circuit 1a shown in FIG. 27 in a point that a current mirror amplifier 31 is connected in place of the PMOS cross-coupled differential amplifier 30.

The current mirror amplifier 31 includes p-channel MOSFETs 311 and 312 and n-channel MOSFETs 313 and 314. The p-channel MOSFETs 311 and 312 have sources connected to power supply terminals, drains connected to output nodes NO3 and NO4 respectively, and gates connected to the output node NO3. The n-channel MOSFETs 313 and 314 have sources supplied with a prescribed potential VEE, drains connected to the output nodes NO3 and NO4 respectively, and gates connected to output nodes NO1 and NO2 of driver parts 20A and 20B respectively.

In the level conversion circuit 1b according to this embodiment, the output node NO4 of the current mirror amplifier 31 outputs an output potential VOUT. The output potential VOUT changes between a supply potential VDD and a ground potential.

FIG. 30 is a circuit diagram showing the structure of a level conversion circuit 1c according to a ninth embodiment of the present invention.

In the level conversion circuit 1c shown in FIG. 30, a plurality of PMOS cross-coupled differential amplifiers 30 are connected between output nodes NOA and NOB of driver parts 20A and 20B. The structures of the remaining parts of the level conversion circuit 1c shown in FIG. 30 are similar to those of the level conversion circuit 1a shown in FIG. 27.

In the level conversion circuit 1c according to this embodiment, output nodes NO1 and NO2 of the plurality of differential amplifiers 30 output mutually complementarily changing output potentials VOUT1 and VOUT2. The output potentials VOUT1 and VOUT2 change between a supply potential VDD and a ground potential.

Figure 31:
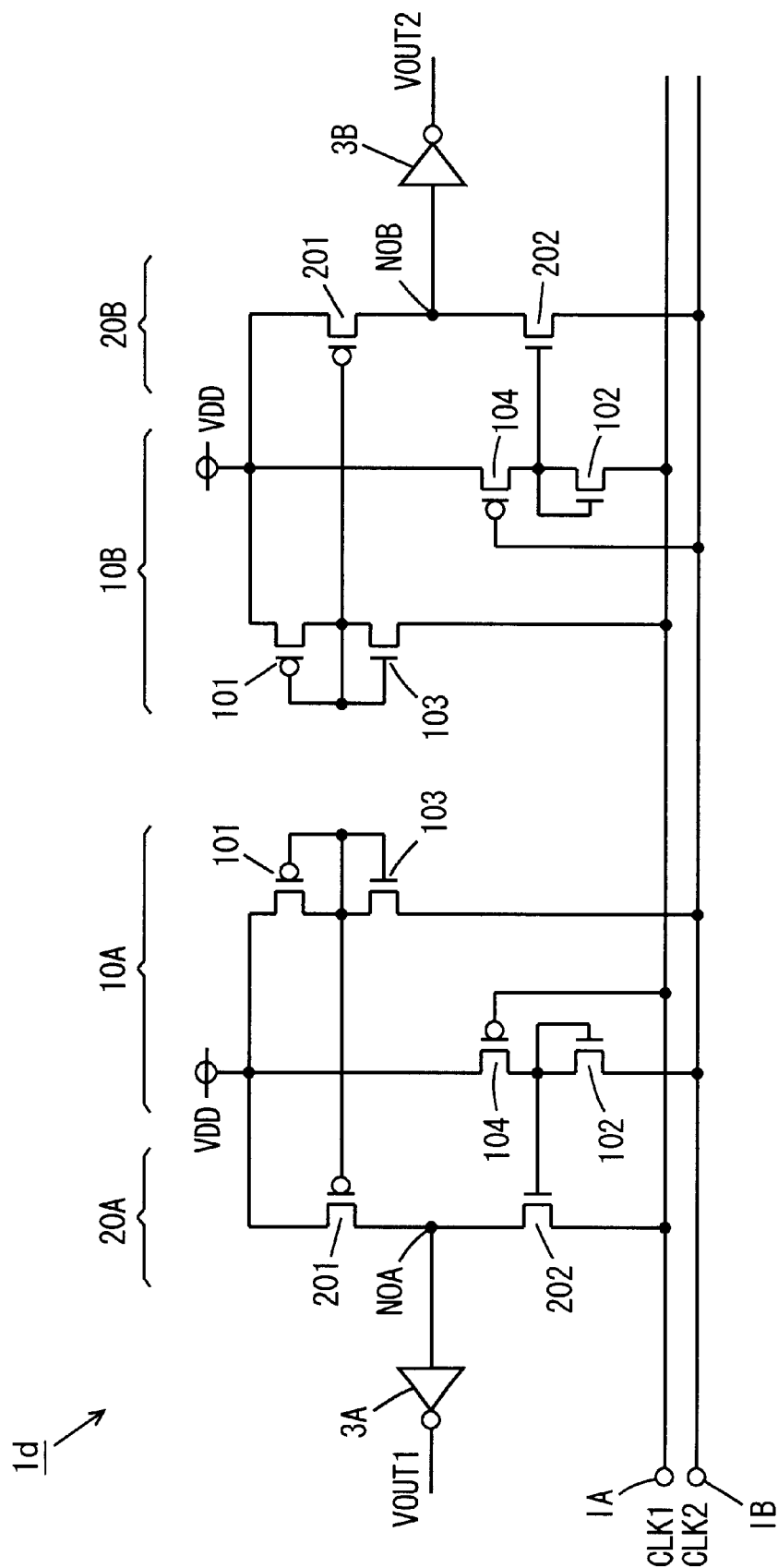
FIG. 31 is a circuit diagram showing the structure of a level conversion circuit according to a tenth embodiment of the present invention.

FIG. 31 is a circuit diagram showing the structure of a level conversion circuit 1d according to a tenth embodiment of the present invention. The level conversion circuit 1d shown in FIG. 31 is a pair-type level conversion circuit.

Referring to FIG. 31, the level conversion circuit 1d comprises two control parts 10A and 10B, two driver parts 20A and 20B and two inverters 3A and 3B.

The control parts 10A and 10B are similar in structure to the control part 10 shown in FIG. 6, and the driver parts 20A and 20B are similar in structure to the driver part 20 shown in FIG. 6. The gate of a p-channel MOSFET 104 of the control part 10A, the source of an n-channel MOSFET 202 of the driver part 20A and the sources of n-channel MOSFETs 102 and 103 of the control part 10B are connected to an input node IA receiving a clock signal CLK1. The sources of n-channel MOSFETs 102 and 103 of the control part 10A, the gate of a p-channel MOSFET 104 of the control part 10B and the source of an n-channel MOSFET 202 of the driver part 20B are connected to an input node IB receiving a clock signal CLK2.

The inverters 3A and 3B are connected to output nodes NOA and NOB of the driver parts 20A and 20B respectively. The inverters 3A and 3B output mutually complementarily changing output potentials VOUT1 and VOUT2. The output potentials VOUT1 and VOUT2 change between a supply potential VDD and a ground potential. Thus, the level conversion circuit 1d shown in FIG. 31 performs complementary operation.

Figure 32:
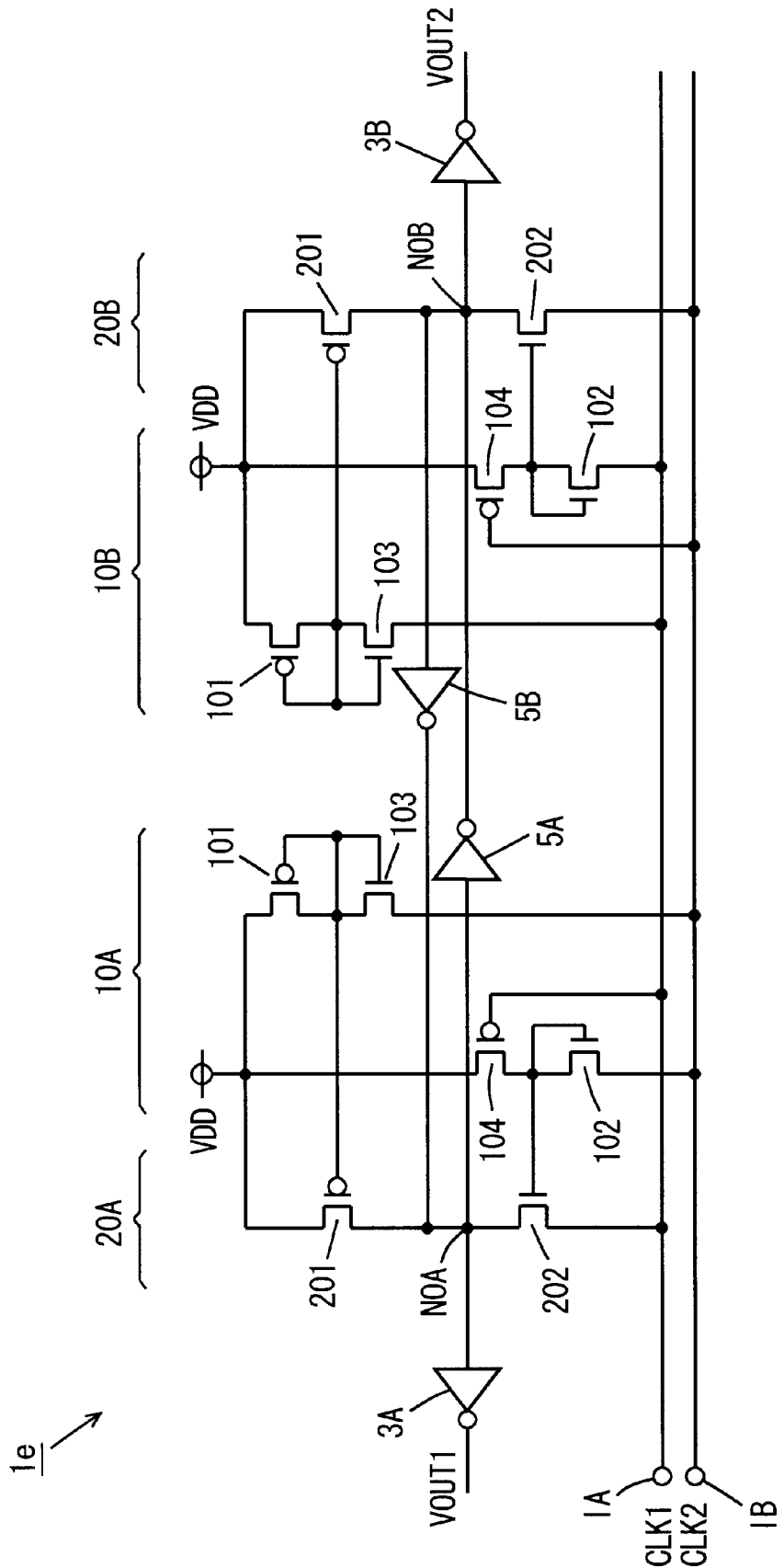
FIG. 32 is a circuit diagram showing the structure of a level conversion circuit according to an eleventh embodiment of the present invention.

FIG. 32 is a circuit diagram showing the structure of a level conversion circuit 1e according to an eleventh embodiment of the present invention. The level conversion circuit 1e shown in FIG. 32 is a pair-type and phase-adjusting type level conversion circuit.

The level conversion circuit 1e shown in FIG. 32 is different from the level conversion circuit 1d shown in FIG. 31 in a point that a pair of inverters 5A and 5B for phase adjusting are connected between output nodes NOA and NOB of driver parts 20A and 20B oppositely to each other.

In the level conversion circuit 1e according to this embodiment, the inverters 5A and 5B can put output potentials VOUT1 and VOUT2 of the output nodes NOA and NOB in phase. Thus, a phase shift between the output potentials VOUT1 and VOUT2 is reduced also when the variations of the threshold voltages of MOSFETS are large in fabrication steps.

Figure 33:
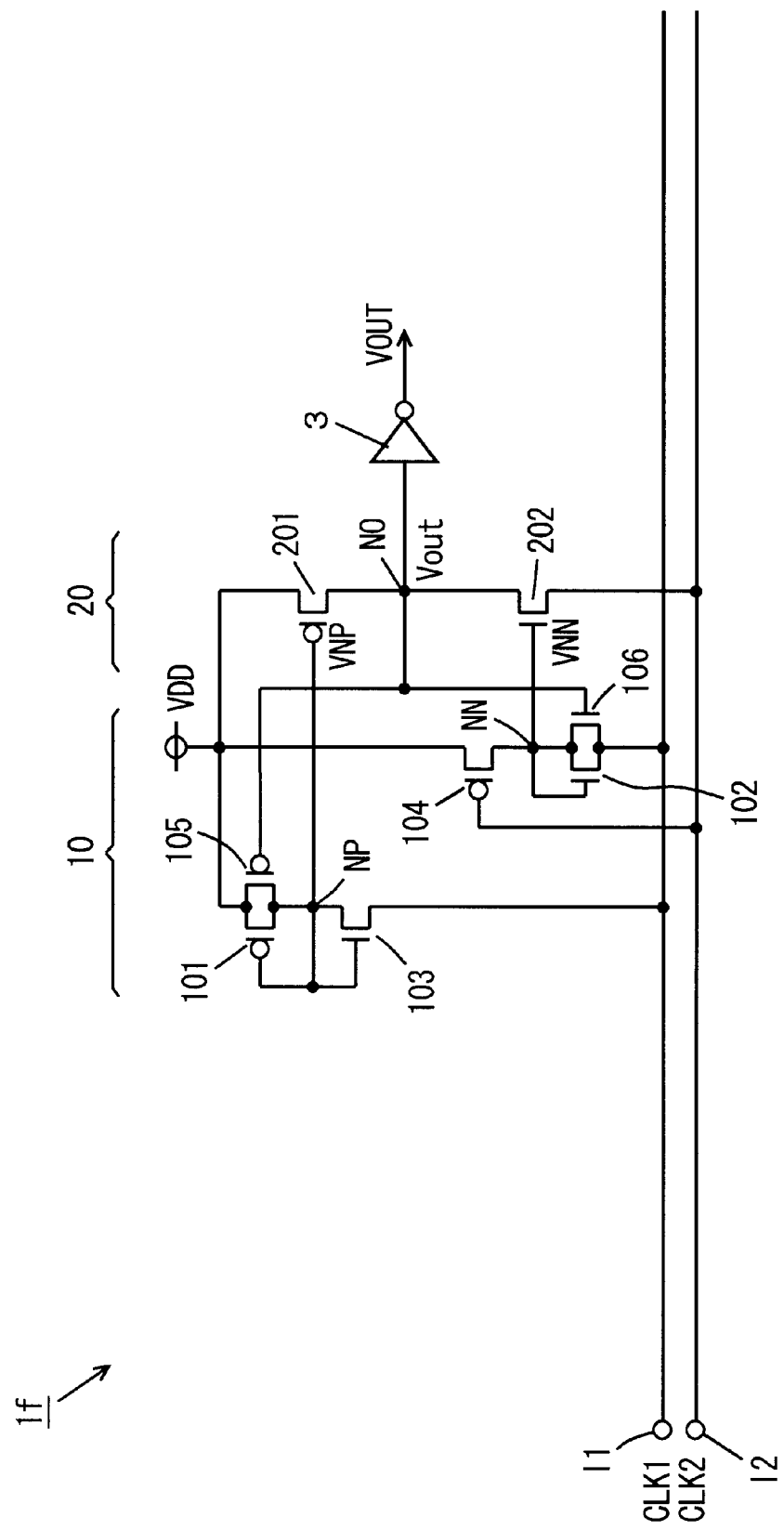
FIG. 33 is a circuit diagram showing the structure of a level conversion circuit according to a twelfth embodiment of the present invention.

FIG. 33 is a circuit diagram showing the structure of a level conversion circuit 1f according to a twelfth embodiment of the present invention. The level conversion circuit 1f shown in FIG. 33 is a low-voltage driven type level conversion circuit.

The level conversion circuit 1f shown in FIG. 33 is different from the level conversion circuit 1 shown in FIG. 6 in a point that a control part 10 further includes a p-channel MOSFET 105 and an n-channel MOSFET 106.

The p-channel MOSFET 105 has a source connected to a power supply terminal, a gate connected to an output node NO and a drain connected to a first node NP. The n-channel MOSFET 106 has a source connected to an input node I1, a gate connected to the output node NO and a drain connected to a second node NN.

As hereinabove described, the level conversion circuit 1 shown in FIG. 6 shifts the gate potentials of the p-channel MOSFET 201 and the n-channel MOSFET 202 of the driver part 20 to operating regions by the threshold voltages Vtp and Vtn of the p-channel MOSFET 101 and the n-channel MOSFET 102 of the control part 10 respectively. Thus, the p-channel MOSFET 201 and the n-channel MOSFET 202 can reliably operate also when the threshold voltages of the MOSFETs deviate from the design values due to variations in the fabrication steps. When the supply potential VDD is reduced and the threshold voltages deviate to exceed the design values due to the variations in the fabrication steps, however, the p-channel MOSFET 201 and the n-channel MOSFET 202 of the driver part 20 may not operate.

In order to avoid this, therefore, the p-channel MOSFET 105 and the n-channel MOSFET 106 are provided on the level conversion circuit 1f according to this embodiment. As hereinabove described, the range available for the output potential Vout of the output node NO is larger than those available for the potentials VNP and VNN of the first node NP and the second node NN. In other words, the range available for the output potential Vout of the output node NO is larger than those available for the gate potentials of the p-channel MOSFET 101 and the n-channel MOSFET 102. Thus, it follows that the gate potentials of the p-channel MOSFET 105 and the n-channel MOSFET 106 swing in a range larger tan the potentials VNP and VNN of the first and second nodes NP and NN. Therefore, the p-channel MOSFET 105 and the n-channel MOSFET 106 are more strongly turned on. Consequently, the potentials VNP and VNN of the first and second nodes NP and NN are not influenced by the threshold voltages of the p-channel MOSFET 101 and the n-channel MOSFET 102. Therefore, the level conversion circuit 1f shown in FIG. 33 can reliably operate also when the supply potential VDD is low and variations in fabrication steps are large.

Figure 34:
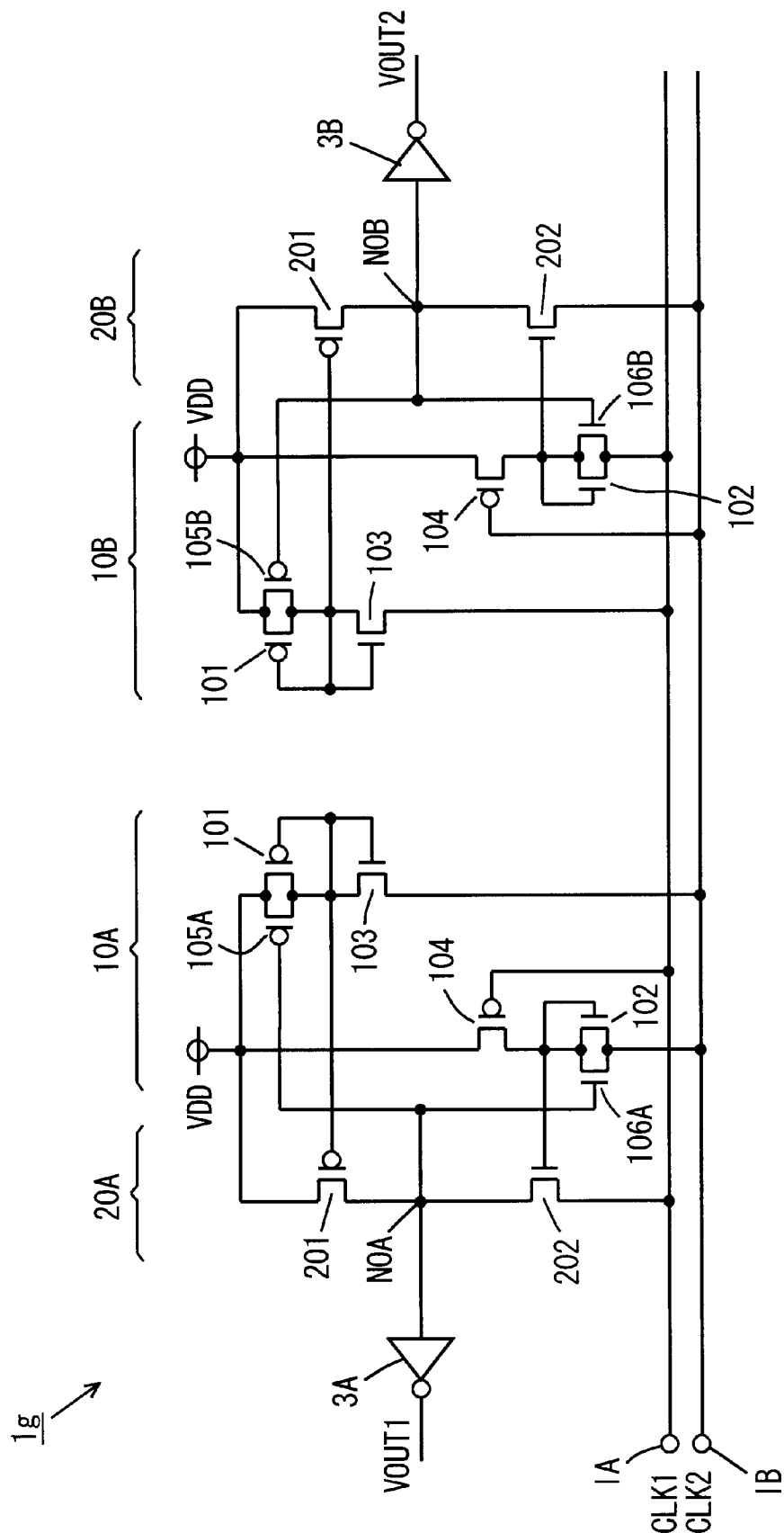
FIG. 34 is a circuit diagram showing the structure of a level conversion circuit according to a thirteenth embodiment of the present invention.

FIG. 34 is a circuit diagram showing the structure of a level conversion circuit 1g according to a thirteenth embodiment of the present invention. The level conversion circuit 1g shown in FIG. 34 is a low-voltage driven type and pair-type level conversion circuit.

The level conversion circuit 1g shown in FIG. 34 is different from the level conversion circuit 1d shown in FIG. 31 in a point that a control part 10A further includes a p-channel MOSFET 105A and an n-channel MOSFET 106A and a control part 10B further includes a p-channel MOSFET 105B and an n-channel MOSFET 106B. In other words, the control parts 10A and 10B are identical in structure to the control part 10 shown in FIG. 33.

In the level conversion circuit 1g according to this embodiment, inverters 3A and 3B output mutually complementarily changing output potentials VOUT1 and VOUT2, similarly to the level conversion circuit 1d shown in FIG. 31. The output potentials VOUT1 and VOUT2 change between a supply potential VDD and a ground potential. This level conversion circuit 1g can reliably operate also when the supply potential VDD is low and variations in fabrication steps are large, similarly to the level conversion circuit 1f shown in FIG. 33.

Figure 35:
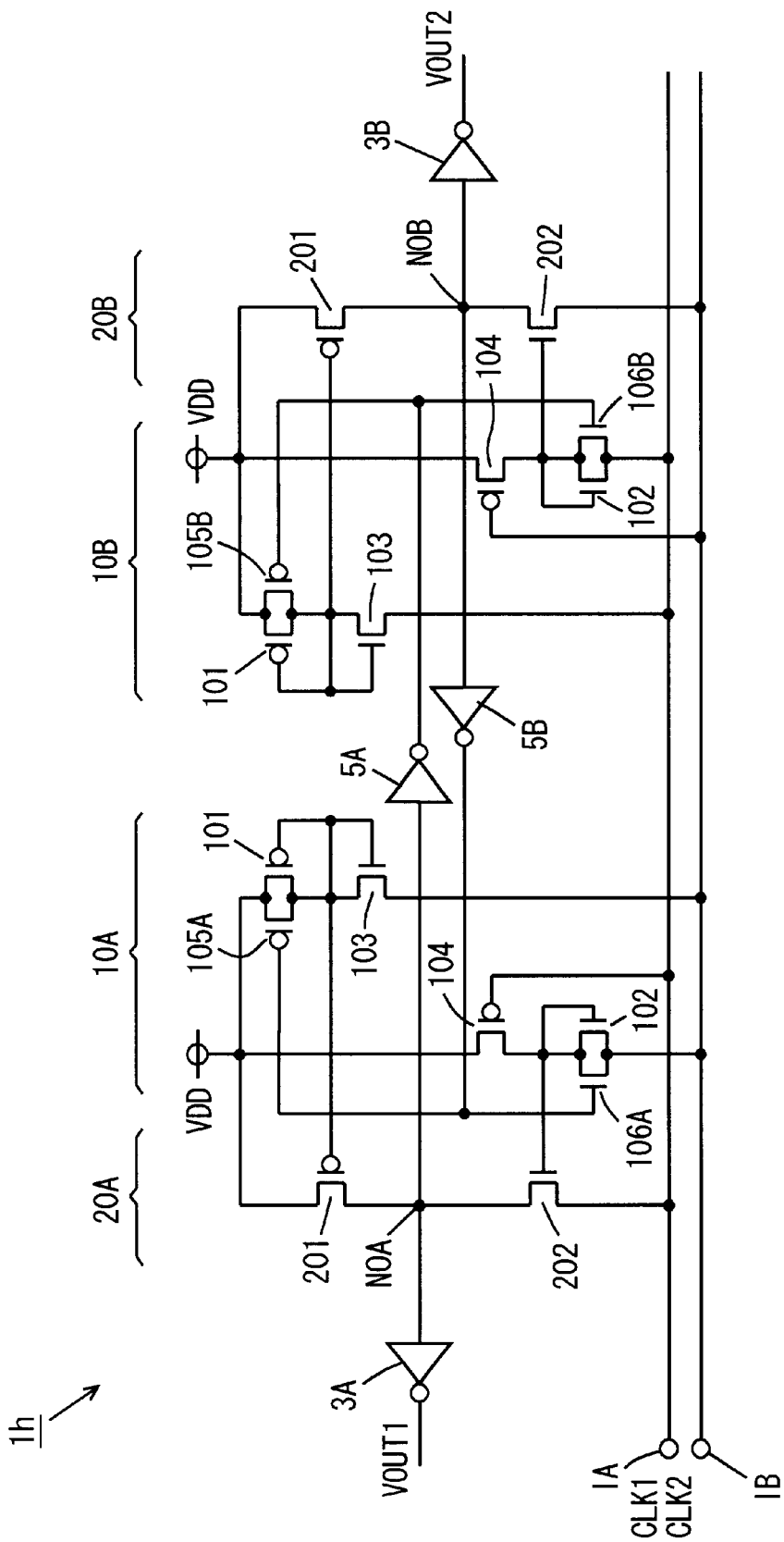
FIG. 35 is a circuit diagram showing the structure of a level conversion circuit according to a fourteenth embodiment of the present invention.

FIG. 35 is a circuit diagram showing the structure of a level conversion circuit 1h according to a fourteenth embodiment of the present invention. The level conversion circuit 1h shown in FIG. 35 is a low-voltage driven type, pair type and phase adjusting type level conversion circuit.

The level conversion circuit 1h shown in FIG. 35 is different from the level conversion circuit 1g shown in FIG. 34 in a point that a pair of inverters 5A and 5B for phase adjusting are connected between output nodes NOA and NOB of driver parts 20A and 20B oppositely to each other.

In the level conversion circuit 1h according to this embodiment, a phase shift between output potentials VOUT1 and VOUT2 is reduced also when the variations of the threshold voltages of MOSFETs are large in fabrication steps. Further, the level conversion circuit 1h can reliably operate also when a supply potential VDD is low.

Figure 36:
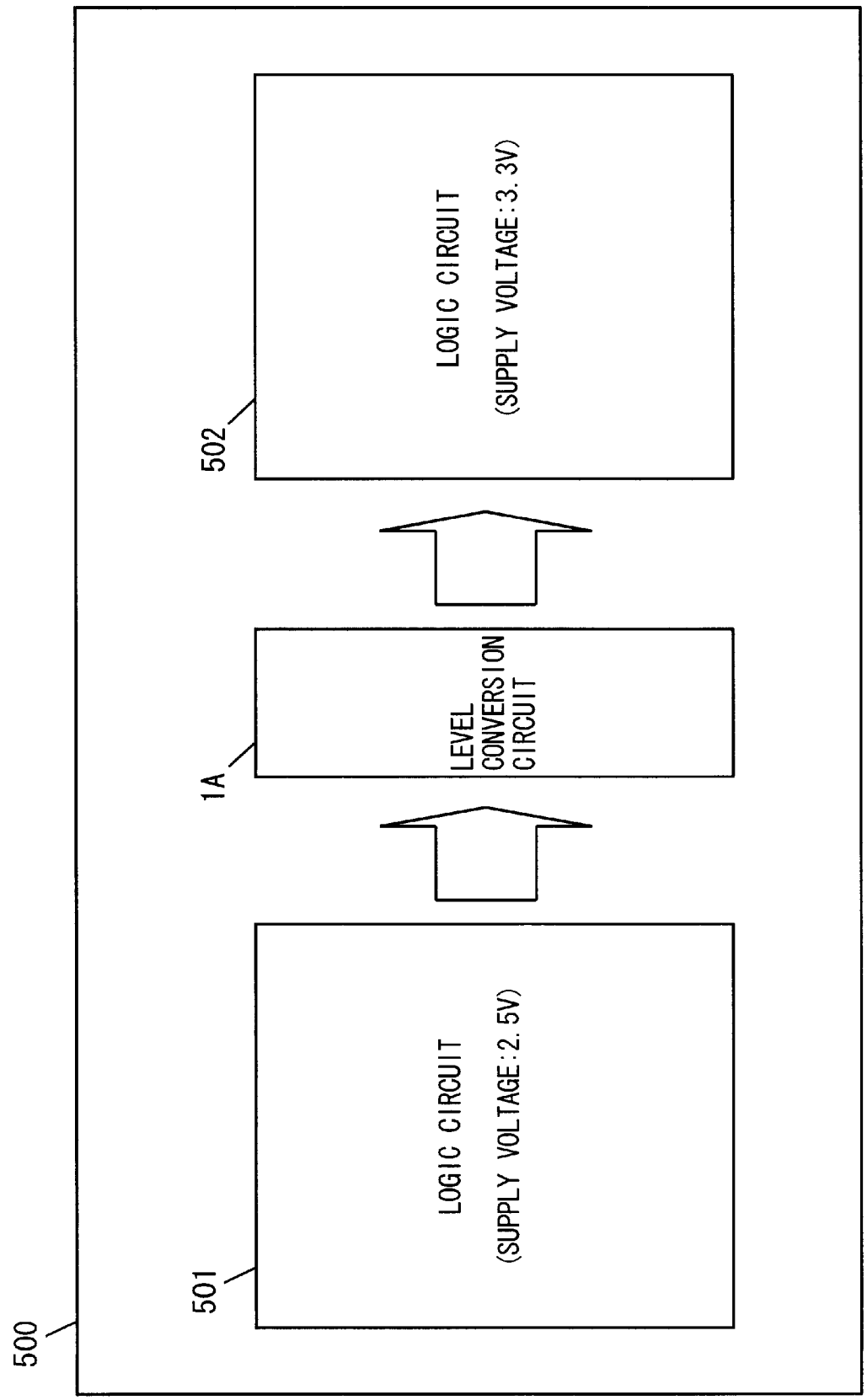
FIG. 36 is a block diagram showing a first exemplary semiconductor device employing the level conversion circuit according to the present invention.

FIG. 36 is a block diagram showing a first exemplary semiconductor device employing the inventive level conversion circuit.

In the semiconductor device shown in FIG. 36, a logic circuit 501 operating with a supply voltage of 2.5 V, a logic circuit 502 operating with a supply voltage of 3.3 V and a level conversion circuit 1A are mixedly provided on a chip 500. The level conversion circuit 1A level-converts a 2.5 V-system signal supplied from the logic circuit 501 to a 3.3 V-system signal and supplies the level-converted signal to the logic circuit 502.

The level conversion circuit 1A is formed by any of the level conversion circuits 1 and 1a to 1h according to the first to fourteenth embodiments. Thus, the semiconductor device shown in FIG. 36 can reliably operate also when the variations of the threshold voltages of p-channel and n-channel MOSFETs are large in fabrication steps, while enabling high-speed operation, reduction of power consumption and area reduction.

Figure 37:
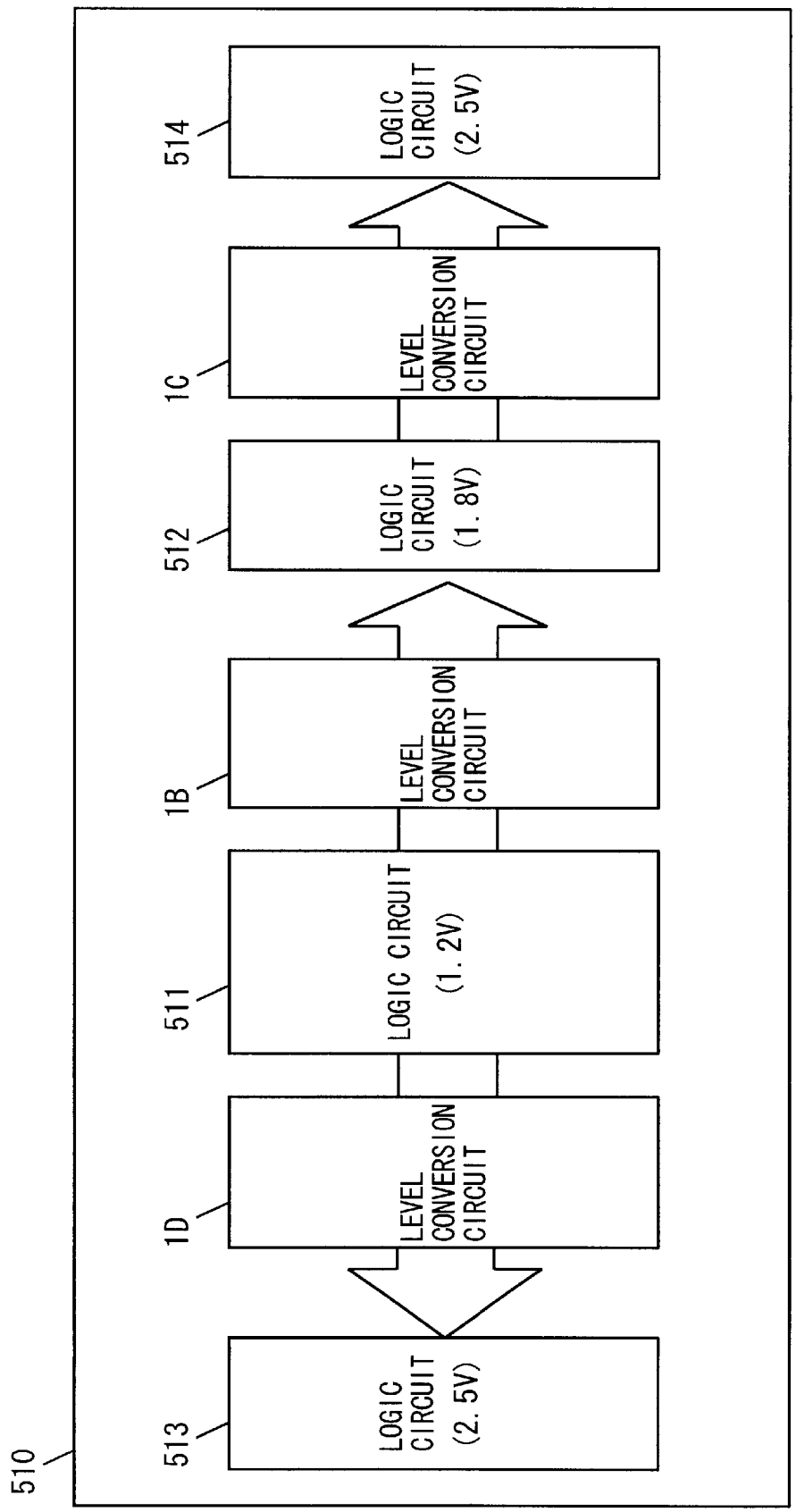
FIG. 37 is a block diagram showing a second exemplary semiconductor device employing the level conversion circuit according to the present invention.

FIG. 37 is a block diagram showing a second exemplary semiconductor device employing the inventive level conversion circuit.

In the semiconductor device shown in FIG. 37, a logic circuit 511 operating with a supply voltage of 1.2 V, a logic circuit 512 operating with a supply voltage of 1.8 V, logic circuits 513 and 514 operating with a supply voltage of 2.5 V and level conversion circuits 1B, 1C and 1D are mixedly provided on a chip 510.

The level conversion circuit 1B level-converts a 1.2 V-system signal supplied from the logic circuit 511 to a 1.8 V-system signal and supplies the level-converted signal to the logic circuit 512. The level conversion circuit 1C level-converts a 1.8 V-system signal supplied from the logic circuit 512 to a 2.5 V-system signal and supplies the level-converted signal to the logic circuit 514. The level conversion circuit 1D level-converts a 1.2 V-system signal supplied from the logic circuit 511 to a 2.5 V-system signal and supplies the level-converted signal to the logic circuit 513.

The level conversion circuits 1B, 1C and 1D are formed by any of the level conversion circuits 1 and 1a to 1h according to the first to fourteenth embodiments. Thus, the semiconductor device shown in FIG. 37 can reliably operate also when the variations of the threshold voltages of p-channel and n-channel MOSFETs are large in fabrication steps, while enabling high-speed operation, reduction of power consumption and area reduction.

Figure 38:
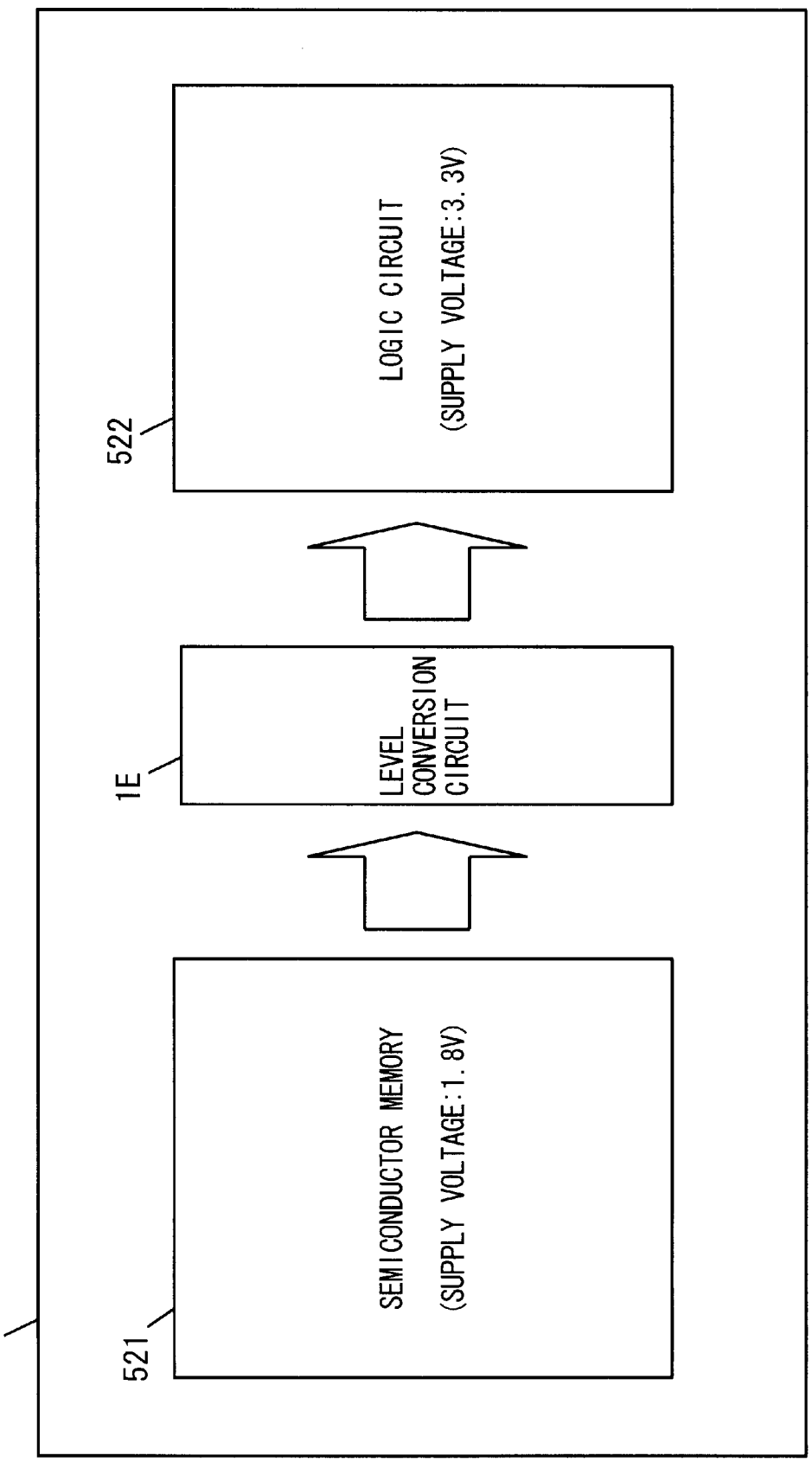
FIG. 38 is a block diagram showing a third exemplary semiconductor device employing the level conversion circuit according to the present invention.

FIG. 38 is a block diagram showing a third exemplary semiconductor device employing the inventive level conversion circuit.

In the semiconductor device shown in FIG. 38, a semiconductor memory 521 operating with a supply voltage of 1.8 V, a logic circuit 522 operating with a supply voltage of 3.3 V and a level conversion circuit 1E are mixedly provided on a chip 520. The semiconductor memory 521 is a DRAM (dynamic random access memory), an SRAM (static random access memory), a FLASH (flash memory), an FERAM (ferroelectric memory) or the like. The level conversion circuit 1E level-converts a 1.8-V system signal supplied from the semiconductor memory 521 to a 3.3 V-system signal and supplies the level-converted signal to the logic circuit 522.

The level conversion circuit 1E is formed by any of the level conversion circuits 1 and 1a to 1h according to the first to fourteenth embodiments. Thus, the semiconductor device shown in FIG. 38 can reliably operate also when the variations of the threshold voltages of p-channel and n-channel MOSFETs are large in fabrication steps, while enabling high-speed operation, reduction of power consumption and area reduction.

Figure 39:
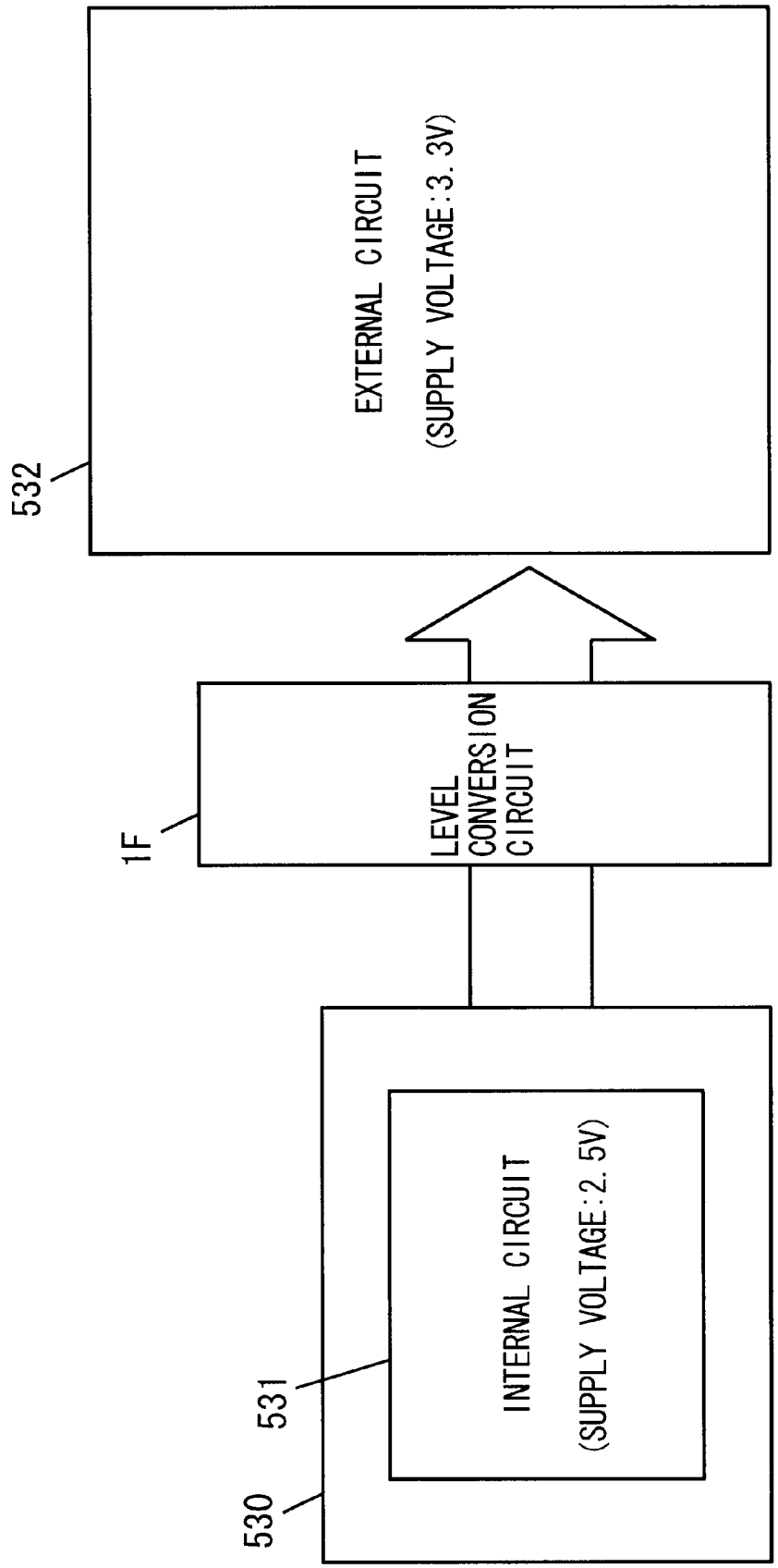
FIG. 39 is a block diagram showing a fourth exemplary semiconductor device employing the level conversion circuit according to the present invention.

FIG. 39 is a block diagram showing a fourth exemplary semiconductor device employing the inventive level conversion circuit.

In the semiconductor device shown in FIG. 39, an internal circuit 531 operating with a supply voltage of 2.5 V is formed in a chip 530. The internal circuit 531 is formed by a semiconductor element. A level conversion circuit 1F level-converts a 2.5-V system signal supplied from the internal circuit 531 to a 3.3 V-system signal and supplies the level-converted signal to an external circuit 532 operating with a supply voltage of 3.3 V.

The level conversion circuit 1F is formed by any of the level conversion circuits 1 and 1a to 1h according to the first to fourteenth embodiments. Thus, the semiconductor device shown in FIG. 39 can reliably operate also when the variations of the threshold voltages of p-channel and n-channel MOSFETs are large in fabrication steps, while enabling high-speed operation, reduction of power consumption and area reduction.

Figure 40:
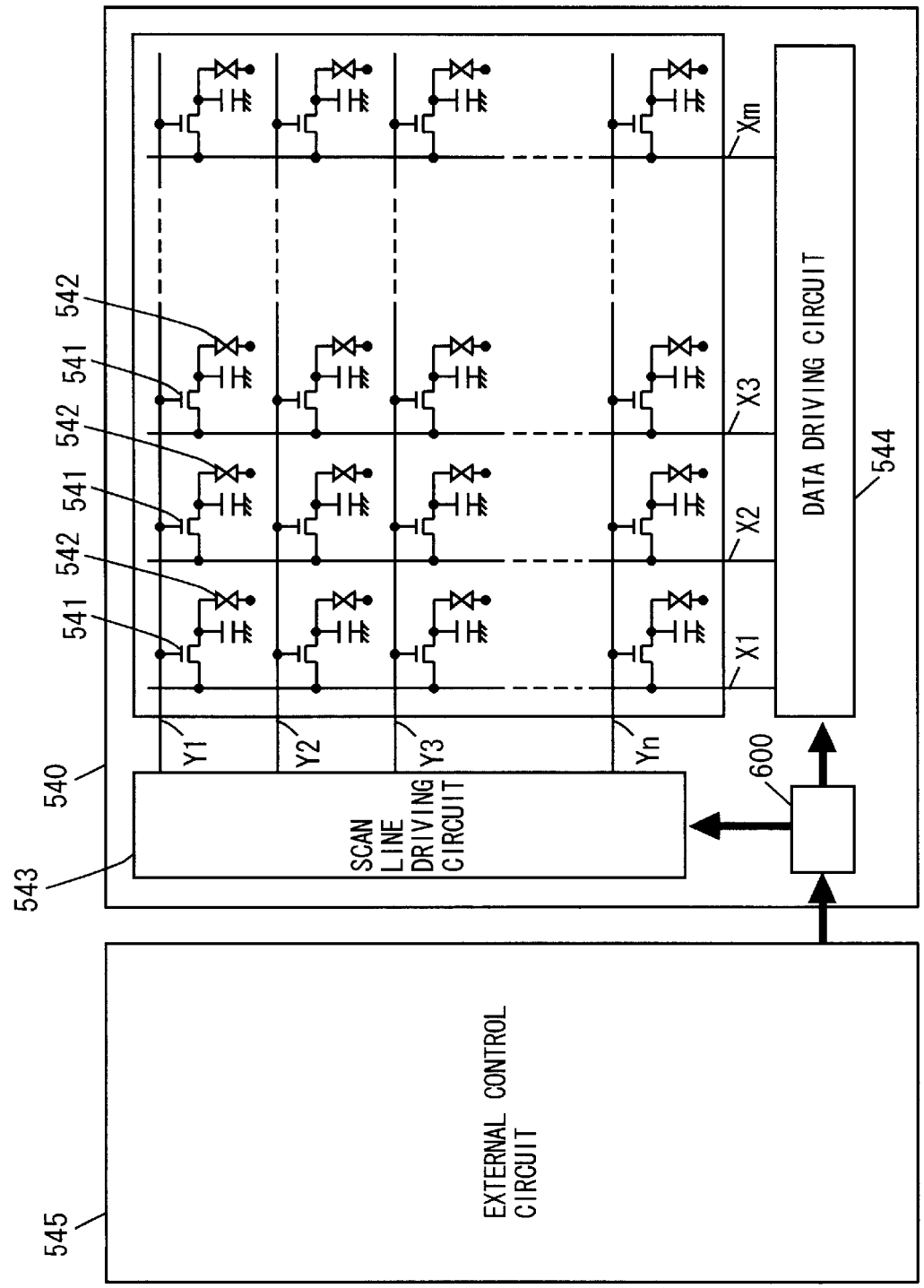
FIG. 40 is a block diagram showing an exemplary liquid crystal display unit employing the level conversion circuit according to the present invention.

FIG. 40 is a block diagram showing an exemplary liquid crystal display unit employing the inventive level conversion circuit.

In the liquid crystal display unit shown in FIG. 40, a plurality of scan electrodes Y1, Y2, . . . , Yn and a plurality of data electrodes X1, X2, . . . , Xm are arranged on a glass substrate 540 to intersect with each other, where n and m represent arbitrary integers respectively. Liquid crystal elements 542 are provided on the intersections between the plurality of scan electrodes Y1 to Yn and the plurality of data electrodes X1 to Xm through thin-film transistors 541 respectively. The thin-film transistors 541 are made of polycrystalline silicon obtained by polycrystallizing amorphous silicon by laser annealing, for example.

A scan line driving circuit 543, a data driving circuit 544 and a voltage conversion circuit 600 are also provided on the glass substrate 540. The scan electrodes Y1 to Yn are connected to the scan line driving circuit 543, and the data electrodes X1 to Xm are connected to the data driving circuit 544. The voltage conversion circuit 600 level-converts mutually complementarily changing basic clock signals having small amplitudes supplied from an external control circuit 545 to clock signals of different voltages and supplies the level-converted signals to the scan line driving circuit 543 and the data driving circuit 544.

FIG. 41 is a block diagram showing the structure of the voltage conversion circuit 600 employed in the liquid crystal display unit shown in FIG. 40.

In the voltage conversion circuit 600 shown in FIG. 41, a step-up power supply circuit 601, a negative power supply circuit 602 and level conversion circuits 1G, 1H, 1I and 1J are formed on the glass substrate 540. The level conversion circuit 1G is supplied with external supply voltages of 8 V and 3.3 V. In this structure, internal circuits are the scan line driving circuit 543 and the data driving circuit 544 shown in FIG. 40.

The level conversion circuit 1G level-converts a basic clock signal supplied from the external control circuit 545 of FIG. 40 to a signal changing in the range of 0 V to 8 V and supplies the level-converted signal to the internal circuits and the level conversion circuits 1H, 1I and 1J. The level conversion circuit 1H level-converts the signal supplied from the level conversion circuit 1G to a signal changing in the range of 0 V to 12 V on the basis of a supply voltage of the step-up power supply circuit 601 and supplies the level-converted signal to the internal circuits and the level conversion circuit 1J.

The level conversion circuit 1I level-converts the signal supplied from the level conversion circuit 1G to a signal changing in the range of −3 V to 8 V on the basis of a negative supply voltage of the negative power supply circuit 602 and supplies the level-converted signal to the internal circuits. The level conversion circuit 1J level-converts the signal supplied from the level conversion circuit 1H to a signal changing in the range of −3 V to 12 V on the basis of the negative supply voltage of the negative power supply circuit 602 and supplies the level-converted signal to the internal circuits.

The level conversion circuits 1G, 1H, 1I and 1J are formed by any of the level conversion circuits 1 and 1a to 1h according to the first to fourteenth embodiments. Thus, the liquid crystal display unit shown in FIG. 40 can reliably operate also when the variations of the threshold voltages of p-channel and n-channel MOSFETs are large in fabrication steps, while enabling high-speed operation, reduction of power consumption, area reduction and improvement in definition.

FIG. 42 is a block diagram showing an exemplary organic EL device employing the inventive level conversion circuit.

In the organic EL device shown in FIG. 42, a plurality of scan electrodes Y1, Y2, . . . , Yn and a plurality of data electrodes X1, X2, . . . , Xm are arranged on a glass substrate 550 to intersect with each other. Organic EL elements 552 are provided on the intersections between the plurality of scan electrodes Y1 to Yn and the plurality of data electrodes X1 to Xm through thin-film transistors 551. The thin-film transistors 551 are made of polycrystalline silicon obtained by polycrystallizing amorphous silicon by laser annealing, for example.

A scan line driving circuit 553, a data driving circuit 554 and a voltage conversion circuit 700 are also provided on the glass substrate 550. The scan electrodes Y1 to Yn are connected to the scan line driving circuit 553, and the data electrodes X1 to Xm are connected to the data driving circuit 554. The voltage conversion circuit 700 level-converts mutually complementarily changing basic clock signals having small amplitudes supplied from an external control circuit 555 to clock signals of different voltages and supplies the level-converted signals to the scan line driving circuit 553 and the data driving circuit 554. The voltage conversion circuit 700 is similar in structure to the voltage conversion circuit 600 shown in FIG. 41.

The voltage conversion circuit 700 is formed by any of the level conversion circuits 1 and 1a to 1h according to the first to fourteenth embodiments. Thus, the organic EL device shown in FIG. 42 can reliably operate also when the variations of the threshold voltages of p-channel and n-channel MOSFETs are large in fabrication steps, while enabling high-speed operation, reduction of power consumption, area reduction and improvement in definition.

Figure 43:
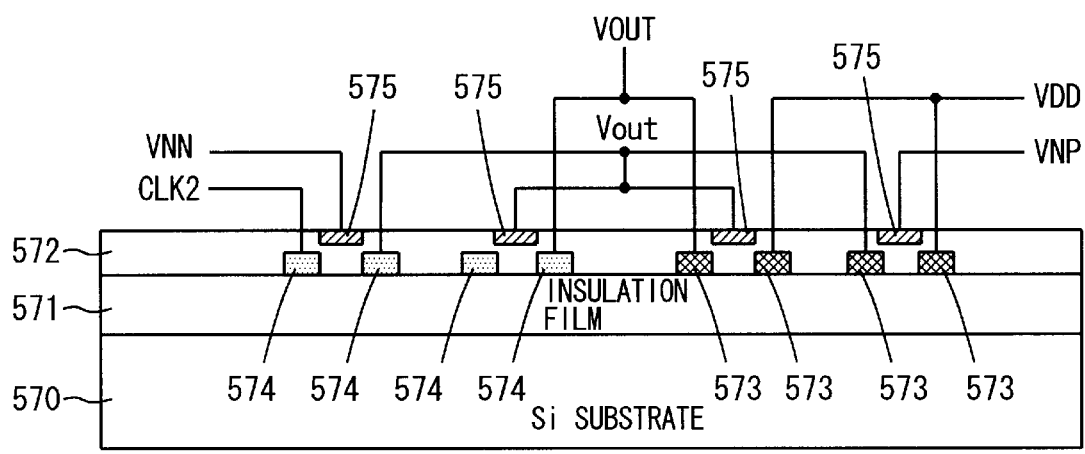
FIG. 43 is a sectional view showing an example of the inventive level conversion circuit formed by an SOI device.

FIG. 43 is a sectional view showing an exemplary level conversion circuit according to the present invention formed by an SOI (silicon on insulator) device.

In the SOI device shown in FIG. 43, an insulator film 571 is formed on an Si (silicon) substrate 570, while an amorphous, polycrystalline or single-crystalline silicon layer 572 is formed on the insulator film 571. A plurality of pairs of p-type regions 573 and a plurality of pairs of n-type regions 574 are formed in the silicon layer 572.

Gate electrodes 575 are formed on regions between the pairs of p-type regions 573 and those between the pairs of n-type regions 574. Thus, the SOI device forms the level conversion circuit 1 shown in FIG. 6, for example.

The inventive level conversion circuit can be formed not only by the SOI device but also by any of various types of semiconductor elements.

Figure 44:
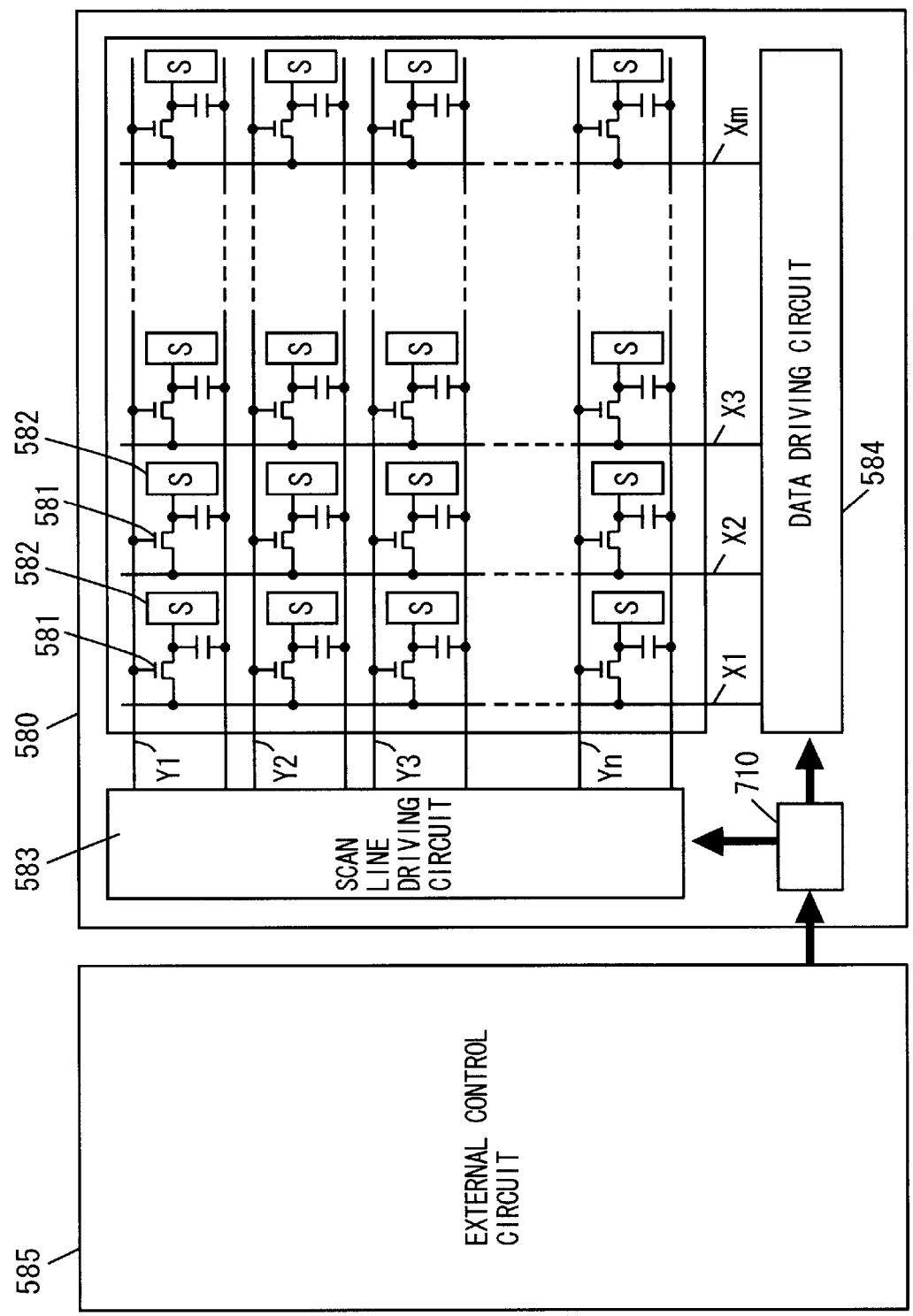
FIG. 44 is a block diagram showing an exemplary sensor device employing the level conversion circuit according to the present invention.
Figure 45:
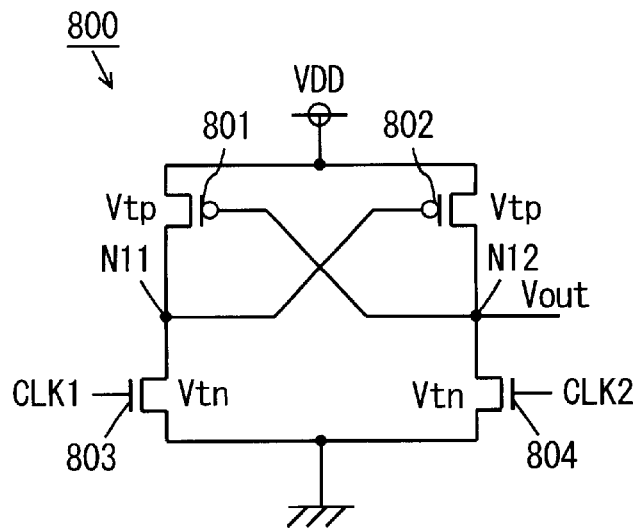
FIG. 45 is a circuit diagram showing a first exemplary conventional level conversion circuit.
Figure 46:
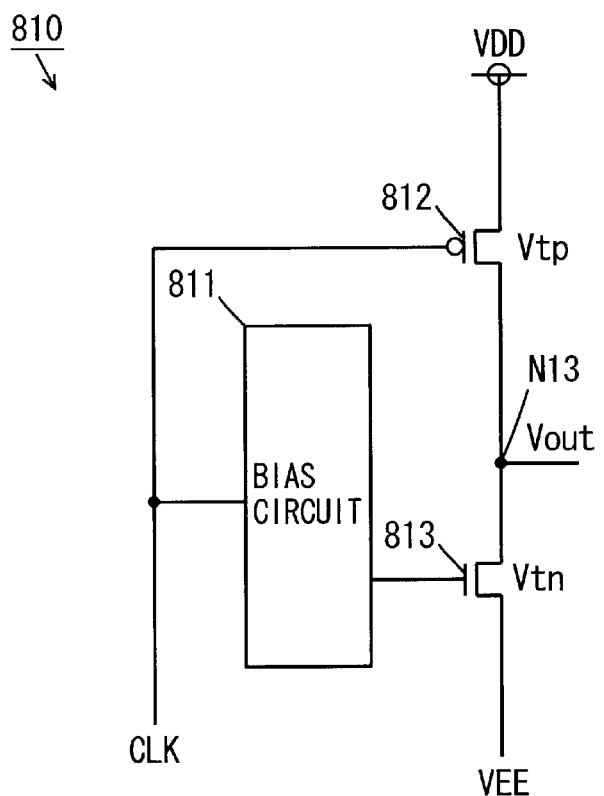
FIG. 46 is a circuit diagram showing a second exemplary conventional level conversion circuit.
Figure 47:
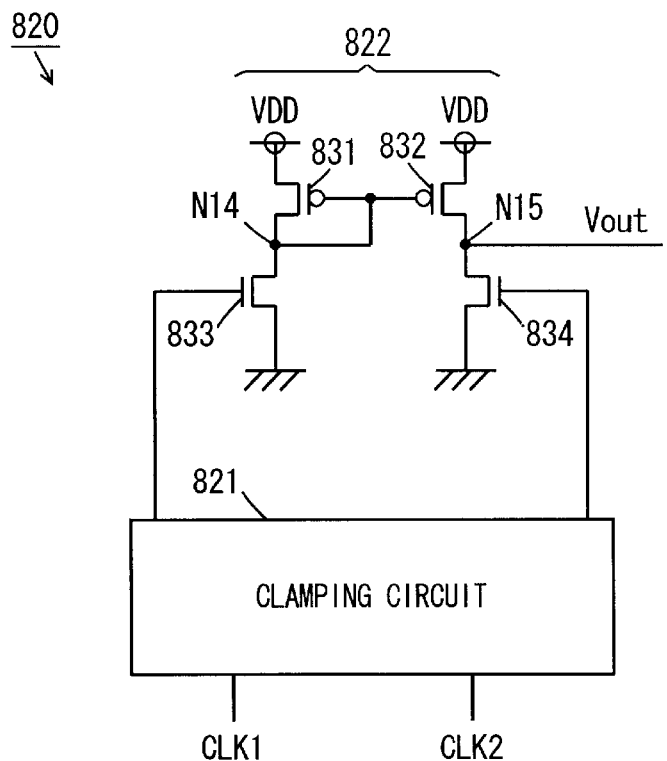
FIG. 47 is a circuit diagram showing a third exemplary conventional level conversion circuit.
Figure 48:
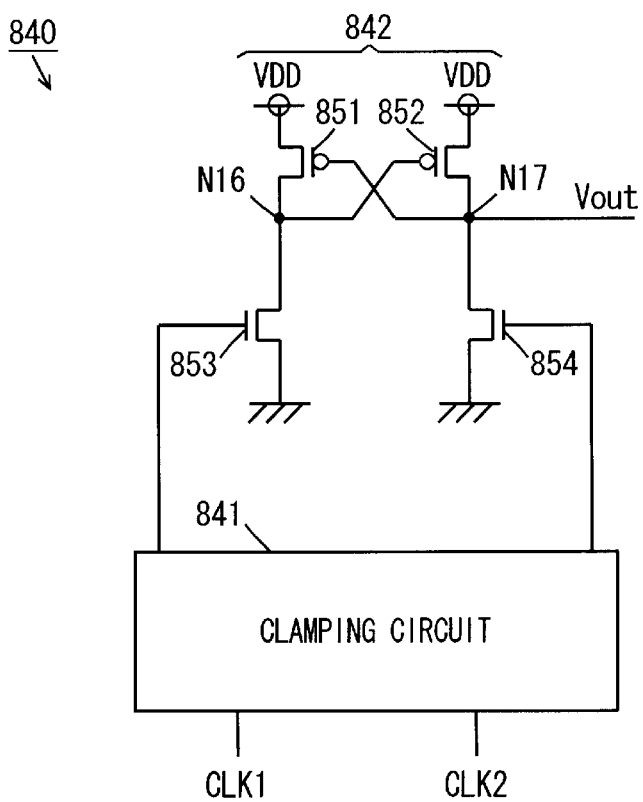
FIG. 48 is a circuit diagram showing a fourth exemplary conventional level conversion circuit.

FIG. 44 is a block diagram showing an exemplary sensor device employing the inventive level conversion circuit.

In the sensor device shown in FIG. 44, a plurality of scan electrodes Y1, Y2, . . . , Yn and a plurality of data electrodes X1, X2, . . . , Xm are arranged on a glass substrate 580 to intersect with each other. The glass substrate 580 may be replaced with a panel substrate of plastic or the like. Sensors 582 are provided on the intersections between the plurality of scan electrodes Y1 to Yn and the plurality of data electrodes X1 to Xm through thin-film transistors 581. The thin-film transistors 581 are made of polycrystalline silicon obtained by polycrystallizing amorphous silicon by laser annealing, for example.

The sensors 582 can be formed by photodetectors, for example. In this case, an image sensor is formed. Alternatively, the sensors 582 may be formed by pressure sensors detecting pressure difference through resistance or electrostatic capacitance. In this case, a surface roughness sensor sensing surface roughness of a substance or a pattern sensor sensing a pattern such as a fingerprint is formed.

A scan line driving circuit 583, a data driving circuit 584 and a voltage conversion circuit 710 are also provided on the glass substrate 580. The scan electrodes Y1 to Yn are connected to the scan line driving circuit 583, and the data electrodes X1 to Xm are connected to the data driving circuit 584. The voltage conversion circuit 710 level-converts mutually complementarily changing basic clock signals having small amplitudes supplied from an external control circuit 585 to clock signals of different voltages, and supplies the level-converted signals to the scan line driving circuit 583 and the data driving circuit 584. The voltage conversion circuit 710 is similar in structure to the voltage conversion circuit 600 shown in FIG. 41.

The voltage conversion circuit 710 is formed by any of the level conversion circuits 1 and 1a to 1h according to the first to fourteenth embodiments. Thus, the sensor device shown in FIG. 44 can reliably operate also when the variations of the threshold voltages of p-channel and n-channel MOSFETs are large in fabrication steps, while enabling high-speed operation, reduction of power consumption, area reduction and improvement in definition.

While the voltage amplitudes of the input signals CLK1 and CLK2 are smaller than the amplitude of the output potential VOUT in the level conversion circuit according to each of the aforementioned embodiments, the inventive level conversion circuit can also be formed to receive input signals CLK1 and CLK2 changing with voltage amplitudes equal to the amplitude (the potential difference between the supply potential VDD and the prescribed potential VEE) of the output potential VOUT or input signals CLK1 and CLK2 changing with voltage amplitudes larger than the amplitude of the output potential VOUT.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A level conversion circuit comprising:
   a first transistor connected between a first node receiving a first potential and an output node;
   a second transistor connected between a second node receiving a second potential different from said first potential and said output node; and
   a control part receiving a first input signal and bringing both of said first and second transistors into ON states while controlling the degrees of the ON states of said first and second transistors respectively in response to the level of said first input signal.

2. The level conversion circuit according to claim 1, wherein
   said first input signal changes with a voltage amplitude smaller than the difference between said first potential and said second potential.

3. The level conversion circuit according to claim 1, wherein
   said first input signal changes to a first level and a second level,
   said first transistor is a first conductive channel field-effect transistor and said second transistor is a second conductive channel field-effect transistor, and
   said control part sets the gate potential of said first conductive channel field-effect transistor and the gate potential of said second conductive channel field-effect transistor in response to said first and second levels of said first input signal so that the absolute value of the difference between said first potential and the gate potential of said first conductive channel field-effect transistor exceeds the absolute value of the threshold voltage of said first conductive channel field-effect transistor and the absolute value of the difference between said second potential and the gate potential of said second conductive channel field-effect transistor exceeds the absolute value of the threshold voltage of said second conductive channel field-effect transistor.

4. The level conversion circuit according to claim 1, wherein
   said first potential is a positive potential, and said second potential is a positive potential lower than said first potential, a ground potential or a negative potential.

5. The level conversion circuit according to claim 1, wherein
   said second potential is a second input signal changing to a first level and a second level complementarily with said first input signal.

6. The level conversion circuit according to claim 4, wherein
   said first conductive channel field-effect transistor is a first p-channel field-effect transistor having a first threshold voltage,
   said second conductive channel field-effect transistor is a first n-channel field-effect transistor having a second threshold voltage, and
   said control part sets the gate potential of said first p-channel field-effect transistor within a range lowering from said first potential by at least the absolute value of said first threshold voltage while setting the gate potential of said first n-channel field-effect transistor within a range rising from said second potential by at least the absolute value of said second threshold voltage.

7. The level conversion circuit according to claim 6, wherein
   said control part includes a second p-channel field-effect transistor, a second n-channel field-effect transistor and a control circuit,
   the source of said second p-channel field-effect transistor receives said first potential, and the gate and the drain of said second p-channel field-effect transistor are connected to the gate of said first p-channel field-effect transistor,
   the source of said second n-channel field-effect transistor receives said first input signal or said second potential, and the gate and the drain of said second n-channel field-effect transistor are connected to the gate of said first n-channel field-effect transistor, and
   said control circuit controls the potential of the drain of said second p-channel field-effect transistor and the potential of the drain of said second n-channel field-effect transistor in response to the level of said first input signal.

8. The level conversion circuit according to claim 7, wherein
   said control circuit includes first and second load elements,
   an end of said first load element receives said first input signal and the other end of said first load element is connected to the gate of said first p-channel field-effect transistor, and
   an end of said second load element receives said first potential and the other end of said second load element is connected to the gate of said first n-channel field-effect transistor.

9. The level conversion circuit according to claim 8, wherein
   each of said first and second load elements is a field-effect transistor or a resistive element.

10. The level conversion circuit according to claim 7, wherein
    said control part further includes a third p-channel field-effect transistor and a third n-channel field-effect transistor,
    the source, the gate and the drain of said third p-channel field-effect transistor are connected to the source of said second p-channel field-effect transistor, said output node and the drain of said second p-channel field-effect transistor respectively, and
    the source, the gate and the drain of said third n-channel field-effect transistor are connected to the source of said second n-channel field-effect transistor, said output node and the drain of said second n-channel field-effect transistor respectively.

11. The level conversion circuit according to claim 6, wherein
    said control part includes a second n-channel field-effect transistor and a control circuit,
    the source of said second n-channel field-effect transistor receives said first input signal or said second potential, and the gate and the drain of said second n-channel field-effect transistor are connected to the gate of said first n-channel field-effect transistor, and
    said control circuit controls the potential of the gate of said first n-channel field-effect transistor and the potential of the drain of said second n-channel field-effect transistor in response to the level of said first input signal.

12. The level conversion circuit according to claim 11, wherein
   said control circuit includes first, second and third load elements,
   an end of said first load element receives said first potential and the other end of said first load element is connected to the gate of said first p-channel field-effect transistor,
   an end of said second load element receives said first input signal or said second potential and the other end of said second load element is connected to the gate of said first p-channel field-effect transistor, and
   an end of said third load element receives said first potential and the other end of said third load element is connected to the gate of said first n-channel field-effect transistor.

13. The level conversion circuit according to claim 12, wherein
   each of said first, second and third load elements is a field-effect transistor or a resistive element.

14. The level conversion circuit according to claim 1, further comprising:
   cutoff circuit cutting off a current path reaching said second node from said first node through said first and second transistors in a transition period between a first level and a second level of said first input signal.

15. The level conversion circuit according to claim 1, wherein
   said first transistor, said second transistor and said control part are made of a single-crystalline, polycrystalline or amorphous semiconductor on an insulating substrate.

16. A semiconductor device comprising:
   a prescribed circuit; and
   a level conversion circuit connected to said prescribed circuit, wherein
      said level conversion circuit comprises:
         a first transistor connected between a first node receiving a first potential and an output node,
         a second transistor connected between a second node receiving a second potential different from said first potential and said output node, and
         a control part receiving a first input signal and bringing both of said first and second transistors into ON states while controlling the degrees of the ON states of said first and second transistors respectively in response to the level of said first input signal.

17. The semiconductor device according to claim 16, wherein
   said prescribed circuit includes a plurality of logic circuits operating with different supply voltages, and
   said level conversion circuit is connected between said plurality of logic circuits.

18. The semiconductor device according to claim 16, wherein
   said prescribed circuit includes:
      an internal circuit provided on a chip, and
      an external circuit provided outside said chip, and
      said level conversion circuit is connected between said internal circuit and said external circuit.

19. The semiconductor device according to claim 16, wherein
   said prescribed circuit includes:
      a semiconductor memory provided on a chip, and
      a logic circuit provided on said chip, and
      said level conversion circuit is connected between said semiconductor memory and said logic circuit on said chip.

20. The semiconductor device according to claim 16, wherein
   said prescribed circuit includes:
      a plurality of sensors,
      a plurality of selection transistors for selecting any of said plurality of sensors, and
      a peripheral circuit driving said plurality of sensors through said plurality of selection transistors, and
      said level conversion circuit level-converts a prescribed signal and supplies the level-converted prescribed signal to said peripheral circuit.

* * * * *